(12) United States Patent
Inoue

(10) Patent No.: US 7,865,087 B2
(45) Date of Patent: *Jan. 4, 2011

(54) BANDPASS FILTER CIRCUIT, BAND-ELIMINATION FILTER CIRCUIT, INFRARED SIGNAL PROCESSING CIRCUIT

(75) Inventor: Takahiro Inoue, Katsuragi (JP)

(73) Assignee: Sharp Kabushiki Kaisha, Osaka (JP)

( * ) Notice: Subject to any disclaimer, the term of this patent is extended or adjusted under 35 U.S.C. 154(b) by 614 days.

This patent is subject to a terminal disclaimer.

(21) Appl. No.: 11/929,805

(22) Filed: Oct. 30, 2007

(65) Prior Publication Data

US 2008/0112712 A1 May 15, 2008

(30) Foreign Application Priority Data

Nov. 15, 2006 (JP) .............................. 2006-309630

(51) Int. Cl.
*H04B 10/06* (2006.01)
*H03B 1/00* (2006.01)

(52) U.S. Cl. ..................... 398/208; 398/202; 398/209; 398/210; 398/212; 398/213; 398/214; 327/553; 327/557

(58) Field of Classification Search .......... 398/202–214
See application file for complete search history.

(56) References Cited

U.S. PATENT DOCUMENTS

| | | | |
|---|---|---|---|
| 5,155,447 A * | 10/1992 | Huijsing et al. ............. 330/107 |
| 5,247,211 A * | 9/1993 | Sakura ......................... 327/72 |
| 6,516,026 B1 | 2/2003 | Blatz |
| 6,704,560 B1 | 3/2004 | Balteanu et al. |
| 7,173,486 B1 * | 2/2007 | Sutardja et al. ............. 330/107 |
| 7,635,837 B2 * | 12/2009 | Uo et al. .................. 250/214 A |
| 7,719,349 B2 * | 5/2010 | Okada ......................... 327/553 |
| 2001/0020865 A1 | 9/2001 | Morie et al. |
| 2003/0006834 A1 | 1/2003 | Morie et al. |
| 2003/0171108 A1 | 9/2003 | Eichin et al. |
| 2008/0018806 A1 | 1/2008 | Inoue |
| 2008/0112711 A1 * | 5/2008 | Inoue ......................... 398/202 |
| 2008/0112712 A1 * | 5/2008 | Inoue ......................... 398/208 |

FOREIGN PATENT DOCUMENTS

| | | | |
|---|---|---|---|
| JP | 5-114836 A | 5/1993 |
| JP | 7-212187 A | 8/1995 |
| JP | 11-331076 A | 11/1999 |
| JP | 2001-502147 A | 2/2001 |
| JP | 2001-292051 A | 10/2001 |

(Continued)

*Primary Examiner*—Li Liu
(74) *Attorney, Agent, or Firm*—Birch, Stewart, Kolasch & Birch, LLP

(57) ABSTRACT

A bandpass filter circuit 10 of the present invention includes: transconductance amplifier circuits 1 to 3; a common-mode feedback circuit 4 which outputs a first control signal to the transconductance amplifier circuit 1 so that a D.C. voltage level of a differential output of the transconductance amplifier circuit 1 is at a predetermined level; a common-mode feedback circuit 5 which outputs a second control signal to the transconductance amplifier circuit 2 so that a D.C. voltage level of a differential output of the transconductance amplifier circuit 2 is at a predetermined level; and capacitors C1 to C3. Each of the members are connected as shown in FIG. 1. With the configuration, a bandpass filter circuit capable of adjusting constants such as a Q-value is realized.

22 Claims, 27 Drawing Sheets

FOREIGN PATENT DOCUMENTS

| | | |
|---|---|---|
| JP | 2002-305428 A | 10/2002 |
| JP | 2002-330058 A | 11/2002 |
| JP | 2003-523124 A | 7/2003 |
| JP | 2004-56541 A | 2/2004 |
| JP | 2004-506375 A | 2/2004 |
| JP | 2006-60410 A | 3/2006 |
| JP | 2008-28476 A | 2/2008 |
| WO | WO-01/59925 A1 | 8/2001 |

* cited by examiner

When CLK = H, Q data is switched

When CLK = L, Q data is latched, and D data is input

Iin (THRESHOLD LEVEL)

Dout

US 7,865,087 B2

BANDPASS FILTER CIRCUIT, BAND-ELIMINATION FILTER CIRCUIT, INFRARED SIGNAL PROCESSING CIRCUIT

This Nonprovisional application claims priority under 35 U.S.C. §119(a) on Patent Application No. 309630/2006 filed in Japan on Nov. 15, 2006, the entire contents of which are hereby incorporated by reference.

FIELD OF THE INVENTION

The present invention relates to a bandpass filter circuit and a band-elimination filter circuit with an improved power-source noise canceling characteristic, each of which circuit is capable of adjusting a constant such as a Q-value. Further, the present invention also relates to an infrared signal processing circuit, having the bandpass filter circuit, which is capable of reducing distortion in a waveform output from the bandpass filter circuit while reducing disturbance light noise.

BACKGROUND OF THE INVENTION

Typical examples of an infrared signal processing circuit are: remote controllers of home electric appliances and peripheral devices of personal computers, each of which performs data communication in compliance with IrDA (Infrared Data Association) standard or IrDA Control standard.

For example, a conventional infrared remote control receiver 110 includes a photodiode chip 101 and a reception chip 108 as shown in FIG. 23. The photodiode chip 101 converts a remote control transmission signal received from an infrared remote control transmitter (not shown) into a current signal Iin. The reception chip 108 includes: a current-to-voltage-conversion circuit 102 for converting the current signal Iin having been generated into a voltage signal; an amplifying circuit 103 for amplifying the voltage signal having been generated; a bandpass filter circuit (hereinafter, BPF) 104 for extracting a carrier frequency component from the voltage signal having been amplified; a carrier detection circuit 105 for detecting a carrier from the carrier frequency component having been extracted; an integrating circuit 106 for integrating carrier-existing periods; and a hysteresis comparator 107 which compares an output of the integrating circuit 106 with a threshold level, thereby (i) judging whether or not the carrier exits and (ii) outputting the result of the judgment in the form of digital output. The digital output Dout of the hysteresis comparator 107 is sent to a microcomputer or the like which controls an electronic device.

FIG. 24 shows an output of each circuit of the infrared remote control receiver 110. FIG. 24(a) shows an output of the current signal Iin. FIG. 24(b) shows an output of the BPF 104 (solid line) and that of the carrier detection circuit 105 (dotted line). FIG. 24(e) shows an output of the integrating circuit 106 (solid line). FIG. 24(d) shows a digital output Dout of the infrared remote control receiver 110.

Note that the dotted line in FIG. 24(c) is a threshold level.

The remote control transmission signal is an ASK (Amplitude Shift Keying) signals (remote controller transmission signals) modulated by a predetermined carrier of, for example, approximately 30 kHz to 60 kHz. This carrier component of 30 kHz to 60 kHz also exists in light from a home-use inverter fluorescent light. Accordingly, an infrared remote control receiver 110, when used around a fluorescent light, may malfunction by detecting noise stemming from the fluorescent light. In worst situation, the infrared remote control receiver 110 may not be able to accurately receive signals transmitted from the remote control.

To reducing the noise from an inverter fluorescent light, the Q-value of the BPF 104 is increased thereby increasing the carrier selectivity. However, raising the Q-value of the BPF 104 causes distortion in a waveform of the BPF 104 and an increase in the pulse width. This is described in detail hereinbelow.

As shown in FIG. 25, the BPF 104 includes: transconductance amplifiers (hereinafter, simply referred to as GMs) 111 and 112; an attenuator (ATT) 113 (damping ratio: $1/\alpha$); and capacitors C11 and C12. The transfer function H(s) of the BPF 104 is expressed by the following Formula (1).

According to Kirchhoff's law, $$gm\,111*(-vo)=s*C11*(v1-vin)$$

$$gm\,112*(v1-(R112/(R111+R112))*vo)=s*C12*vo.$$

By eliminating V1, $$H(s)=(H*\omega 0/Q*s)/(s^2+\omega 0/Q*s+\omega 0^2) \quad (1)$$

$$\omega 0=((gm\,111*gm\,112)/(C11*C12))^{1/2}$$

$$Q=\alpha*((C12*gm\,111)/(C11*gm\,112))^{1/2}$$

$$H=\alpha,$$

where:
vin is an input voltage of the BPF 104;
vo is an output voltage of the BPF 104;
i112 is an output current of the GM111;
i112 is an output current of the GM112;
v1 is an output voltage of the GM111;
gm 111 is a transconductance of the GM111;
gm 112 is a transconductance of the GM112;
C11 is a capacitance value of the capacitor C11;
C12 is a capacitance value of the capacitor C12;
R111 is an output impedance of the GM111;
R112 is an output impedance of the GM112;
$\omega 0$ is a natural angular frequency;
H is the gain; and
s is a complex number.

A sine wave response of the BPF 104 is obtained as follows. Namely, where Laplace transform of sine wave is as presented in Formula (2), the sine wave response of the BPF is obtained by performing reverse-Laplace transform of H(S) F(S) (Formula (3)).

$$F(s)=L(\sin(\omega 0 t))=\omega 0/(s^2+\omega 0^2)^2) \quad (2)$$

$$\begin{aligned}H(s)*F(s) &= (H*\omega 0/Q*s)/(s^2+\omega 0/Q*s+\omega 0^2)*\omega 0/(s^2+\omega 0^2)\\ &= (-H*\omega 0)/(s^2+\omega 0/Q*s+\omega 0^2)+\\ &\quad (H*\omega 0)/(s^2+\omega 0^2)\\ &= (-H*\omega 0)\Big/\left\{\begin{array}{l}(s+\omega 0/(2*Q))^2+\\ ((\omega 0((4*Q^2-1)/(4*Q^2))^{1/2}))^2\end{array}\right\}+\\ &\quad (H*\omega 0)/(s^2+\omega 0^2).\end{aligned}$$

When: $((4*Q^2-1)/(4*Q^2))^{1/2}\approx 1$, $$=(-H*\omega 0)/\{(s+\omega 0/(2*Q))^2+\omega 0^2\}+(H*\omega 0)/(s^2+\omega 0^2)$$

When the first term and the second term are subjected to a reverse-Laplace transform, $$L^{-1}(H(s)F(s))=H*\{(-\exp(-\omega 0 t/(2*Q))*\sin(\omega 0 t)+\sin(\omega 0 t))\}=H(1-\exp(-\omega 0 t/(2*Q)))*\sin(\omega 0 t) \quad (3)$$

The $(1-\exp(-\omega 0 t/(2*Q)))$ in the Formula (3) affects the waveform distortion.

FIG. 26 shows outputs of the BPF 104. FIG. 26(a) shows an output of the BPF 104 when the Q-value is low. FIG. 26(b) shows an output of the BPF 104 when the Q-value is high. FIG. 26(c) shows an output of the BPF 104 when the Q-value is high, and when close-distance communication is performed with an infrared remote control transmitter. Note that each figure also shows a digital output Dout of the infrared remote control receiver 110.

From the Formula (3) and FIG. 26, it is apparent that raising the Q-value of the BPF 104 causes larger distortion in the waveform of the output from the BPF 104 and an increase in the pulse width. These phenomena are particularly noticeable when the pulse width of the base frequency of the remote control transmission signal is small. As shown in the figure, the digital output Dout is not properly output due to the distortion in the waveform of the output from the BPF 104, and the reception sensitivity is deteriorated. In view of this, the Q-value of the BPF 104 in general is set within a range of approximately 10 to 15.

Recently, a data volume to be transmitted increased due to an increase in the number of functions of a remote controller, while an amount of light emission is reduced to lower the power consumption. Under such circumstances, the pulse width of remote control transmission signals transmitted is shortened. In an infrared remote control receiver supporting such remote control transmission signals with a short pulse width, the above mentioned problem of failing to receive the remote control transmission signals takes place, particularly when the pulse width of an output from the BPF is increased due to an increase in the Q-value of the BPF. For example, in a case of an RC-MM (Remote Control-Multi Media Protocol), when the pulse width of a remote control transmission signal is 166 μsec, the pulse width of the signal in an infrared remote control receiver needs to fall within a range from 80 μsec to 275 μsec. The above mentioned problem is particularly considerable in short-distance communication in which signal amplitude is large as shown in FIG. 26(c).

To solve the problem, the inventors of the present invention has suggested the following infrared remote control receiver. In the infrared remote control receiver, an output of its BPF is detected and is compared with a several threshold levels. If the output surpasses the threshold levels, it is judged that noise of inverter fluorescent light has entered, and the pulse width of the BPF is increased. In such a case, the infrared remote control receiver performs control to decrease the gain and Q-value of the BPF, so as to reduce the noise of inverter fluorescent light and distortion in the waveform of the BPF output. In this case, a BPF capable of adjusting constants such as the Q-value or the gain is needed.

Further, the BPF has a single-ended input as shown in FIG. 25. Therefore, when power source noise or the like is overlapped at the input, the noise is amplified, because the gain is increased nearby the center frequency due to a BPF characteristic. Thus, a characteristic of removing power-source noise is deteriorated.

Further, to cancel inverter fluorescent light noise, the infrared remote control receiver may have a band-elimination filter circuit (hereinafter, BEF). As shown in FIG. 27, the BEF 130 includes: transconductance amplifiers (hereinafter, simply referred to as GMs) 121; an attenuator (ATT) 123 (damping ratio 1/α); and capacitors C21 and C22. The transfer function H(s) of the BEF 130 is expressed by the following Formula (4).

$$H(s)=H^*(s^2+\omega n^2)/(s^2+\omega 0/Q^*s+\omega 0^2) \quad (4)$$

$$\omega 0=\omega n=((gm\ 121^*gm\ 122)/(C21^*C22))^{1/2}$$

$$Q=\alpha^*((C22^*gm\ 121)/(C21^*gm\ 122))^{1/2}$$

$$H=1$$

Where:
ω0 is a natural angular frequency;
ωn is a noise natural angular frequency;
H is the gain;
s is a complex number;
gm 121 is a transconductance of the GM121;
gm 122 is a transconductance of the GM122;
C21 is a capacitance value of the capacitor C21; and
C22 is a capacitance value of the capacitor C22.

SUMMARY OF THE INVENTION

It is an object of the present invention to realize a bandpass filter circuit and a band-elimination filter circuit each capable of adjusting a constant such as a Q-value. It is also an object of the present invention to realize an infrared signal processing circuit which includes the band pass filter circuit, and which is capable of reducing disturbance light noise and reducing distortion in the waveform of an output from the bandpass filter circuit.

Further, the present invention is made to solve the foregoing problems, and yet another object of the present invention is to realize a bandpass filter circuit, a band-elimination filter circuit, and an infrared signal processing circuit each having improved power-source noise canceling characteristic.

In order to achieve the foregoing objects, a band pass filter circuit of the present invention includes: a first transconductance amplifier circuit for converting a differential input voltage into a differential output current; a second transconductance amplifier circuit for converting a differential input voltage into a differential output current; a third transconductance amplifier circuit for converting a differential input voltage into a differential output current; a first common-mode feedback circuit for outputting a first control signal to the first transconductance amplifier circuit so that a D.C. voltage level of a differential output from the first transconductance amplifier circuit is at a predetermined level; a second common-mode feedback circuit for outputting a second control signal to the second transconductance amplifier circuit so that a D.C. voltage level of a differential output from the second transconductance amplifier circuit is at a predetermined level; a first capacitor; a second capacitor; and a third capacitor, wherein: a noninverting input terminal is connected, via the first capacitor, to (i) a noninverting output section of the first transconductance amplifier circuit and (ii) a noninverting input section of the second transconductance amplifier circuit; an inverting input terminal is connected, via the second capacitor, to (i) an inverting output section of the first transconductance amplifier circuit and (ii) an inverting input section of the second transconductance amplifier circuit; a noninverting output section of the second transconductance amplifier circuit is connected to (i) an inverting input section of the first transconductance amplifier circuit, (ii) a noninverting input section and an inverting output section of the third transconductance amplifier circuit, and (iii) one end of the third capacitor; an inverting output section of the second transconductance amplifier circuit is connected to (i) a noninverting input section of the first transconductance amplifier circuit, (ii) an inverting input section and a noninverting output section of the third transconductance amplifier circuit, and (iii) another end of the third capacitor; the noninverting output section of the third transconductance amplifier circuit serves as an inverting output terminal, the inverting output section of the third transconductance amplifier circuit serves as a noninverting output terminal; the noninverting output section and the inverting output section of the first transconductance amplifier circuit serve as input terminals of the first common-mode feedback circuit; and the noninverting output section and the inverting output section of the second transconductance amplifier circuit serve as input terminals of the second common-mode feedback circuit.

The transfer function H(s) of the bandpass filter circuit of the present invention having the above configuration is expressed by the following Formula (5). Further, the constants (natural angular frequency $\omega 0$), the Q-value, and the gain H) of the bandpass filter circuit are expressed by the following Formulas (6) to (8), respectively.

According to Kirchhoff's law:

an output of the noninverting output section of the first transconductance amplifier circuit is $$gm\,1*(-vo-vo)=s*C1*(v1-vin), \text{ and}$$

an output of the inverting output section of the first transconductance amplifier circuit is $$-gm\,1*(-vo-vo)=s*C1*(-v1-(-vin)).$$

Thus, the output of the noninverting output section and that of the inverting output section are equal to each other.

Further, an output of the noninverting output section of the second transconductance amplifier circuit is $$gm\,2*(v1-(-v1))-gm\,3*(vo-(-vo))=s*C3*(vo-(-vo)),$$

and an output of the inverting output section of the second transconductance amplifier circuit is $$-gm\,2*(v1-(-v1))+gm\,3*(vo-(-vo))= s*C3*(-vo-(vo))$$

Thus, the output of the noninverting output section and that of the inverting output section are equal to each other.

v1 is eliminated from the above Formulas, and since H(s)=vo/vin, $$H(s)=\{(gm\,2/C3)*s\}/\{s^2+(gm\,3/C3)*s+ ((gm\,1*gm\,2)/((C1/2)*C3))\} \quad (5)$$

$$\omega 0=((gm\,1*gm\,2)/((C1/2)*C3))^{1/2}=gm/C \quad (6)$$

$$Q=((C3/(C1/2))*(gm\,1*gm\,2)/(gm\,3^2))^{1/2}=gm/gm\,3 \quad (7)$$

$$H=gm\,2/gm\,3=gm/gm\,3 \quad (8),$$

where:

s is a complex number;

vin is an input voltage of the bandpass filter circuit, and is vin=(vin$^+$)=-(vin);

vin$^+$ is a voltage input to the noninverting input terminal of the bandpass filter circuit;

vin$^-$ is a voltage input to the inverting input terminal of the bandpass filter circuit;

vo is an output voltage of the bandpass filter circuit, and is vo=(vo$^+$)=-(vo$^-$);

vo$^+$ is a voltage output from the noninverting output terminal of the bandpass filter circuit;

vo$^-$ is a voltage output from the inverting output terminal of the bandpass filter circuit;

v1 is an output voltage of the first transconductance amplifier, and is v1=(v1$^+$)=-(v1$^-$);

v1$^+$ is a voltage output from the noninverting output section of the first transconductance amplifier circuit;

v1$^-$ is a voltage output from the inverting output section of the first transconductance amplifier circuit gm 1 is a transconductance of the first transconductance amplifier circuit;

gm 2 is a transconductance of the second transconductance amplifier circuit;

gm 3 is a transconductance of the third transconductance amplifier circuit;

C1 is a capacitance value of each of the first and second capacitors; and

C3 is a capacitance value of the third capacitor;

Further, gm=gm 1=gm 2, and

C=C1/2=C3.

From the above Formulas (6) to (8), it is understood that the constants of the bandpass filter circuit are adjusted by adjusting the gm 1, gm 2, and gm 3. Particularly, by controlling only the gm 3, it is possible to adjust the Q-value and the gain H while keeping the natural angular frequency $\omega 0$ constant. Thus, a bandpass filter circuit capable of adjusting constants such as the Q-value is realized.

Further, since bandpass filter circuit adopts a full-differential configuration, in-phase inputs are cancelled. Therefore, in-phase power source noise can be canceled, even if the noise affects the bandpass filter circuit. Thus, a bandpass filter circuit having an improved power-source noise canceling characteristic is realized.

In order to achieve the foregoing objects, a band pass filter circuit of the present invention includes: a first transconductance amplifier circuit for converting a differential input voltage into a differential output current; a second transconductance amplifier circuit for converting a differential input voltage into a differential output current; a first common-mode feedback circuit for outputting a first control signal to the first transconductance amplifier circuit so that a D.C. voltage level of a differential output from the first transconductance amplifier circuit is at a predetermined level; a second common-mode feedback circuit for outputting a second control signal to the second transconductance amplifier circuit so that a D.C. voltage level of a differential output from the second transconductance amplifier circuit is at a predetermined level; a first capacitor; a second capacitor; and a third capacitor, wherein: the first transconductance amplifier circuit includes a first output section and a second output section; a noninverting input terminal is connected, via the first capacitor, to (i) a noninverting output section in the first output section of the first transconductance amplifier circuit and (ii) a noninverting input section of the second transconductance amplifier circuit; an inverting input terminal is connected, via the second capacitor, to (i) an inverting output section in the first output section of the first transconductance amplifier circuit and (ii) an inverting input section of the second transconductance amplifier circuit; a noninverting output section of the second transconductance amplifier circuit is connected to (i) an inverting input section of the first transconductance amplifier circuit, (ii) an inverting output section in the second output section of the first transconductance amplifier circuit, and (iii) one end of the third capacitor; an inverting output section of the second transconductance amplifier circuit is connected to (i) a noninverting input section of the first transconductance amplifier circuit, (ii) a noninverting output section in the second output section of the first transconductance amplifier circuit, and (iii) another end of the third capacitor; the noninverting output section of the second transconductance amplifier circuit serves as a noninverting output terminal, and the inverting output section of the second transconductance amplifier circuit serves as an inverting output terminal; the noninverting output section and the inverting output section in the first output section of the first transconductance amplifier circuit serve as input terminals of the first common-mode feedback circuit; and the noninverting output section and the inverting output section of the second transconductance amplifier circuit serve as input terminals of the second common-mode feedback circuit.

This bandpass filter circuit (hereinafter, second bandpass filter circuit) of the present invention is different from the foregoing bandpass filter circuit (hereinafter, first bandpass filter circuit) having the first to third transconductance amplifier circuits in that the first transconductance amplifier circuit and the third transconductance amplifier circuit are replaced with a single transconductance amplifier circuit. With the second bandpass filter circuit, a transfer function similar to that of the first bandpass filter circuit is obtained. Further, since a full-differential configuration is adopted. Thus, a bandpass filter circuit which is capable of adjusting constants such as a Q-value or the like, and which circuit has an improved characteristic of removing power-source noise is realized. Further, the second bandpass filter circuit has a simple circuit configuration. Therefore, cutting down of the costs is possible.

In order to achieve the foregoing objects, a band-elimination filter circuit of the present invention includes: a first transconductance amplifier circuit for converting a differential input voltage into a differential output current; a second transconductance amplifier circuit for converting a differential input voltage into a differential output current; a third transconductance amplifier circuit for converting a differential input voltage into a differential output current; a fourth transconductance amplifier circuit for converting a differential input voltage into a differential output current; a first common-mode feedback circuit for outputting a first control signal to the first transconductance amplifier circuit so that a D.C. voltage level of a differential output from the first transconductance amplifier circuit is at a predetermined level; a second common-mode feedback circuit for outputting a second control signal to the second transconductance amplifier circuit so that a D.C. voltage level of a differential output from the second transconductance amplifier circuit is at a predetermined level; a first capacitor; a second capacitor; and a third capacitor, wherein: a noninverting input terminal is connected to (i) a noninverting input section of the first transconductance amplifier circuit and (ii) one end of the second capacitor; an inverting input terminal is connected to (i) an inverting input section of the first transconductance amplifier circuit and (ii) one end of the third capacitor; a noninverting output section of the first transconductance amplifier circuit is connected to (i) a noninverting input section of the second transconductance amplifier circuit, (ii) an inverting output section of the fourth transconductance amplifier circuit, and (iii) one end of the first capacitor; an inverting output section of the first transconductance amplifier circuit is connected to (i) an inverting input section of the second transconductance amplifier circuit, (ii) a noninverting output section of the fourth transconductance amplifier circuit, and (iii) another end of the first capacitor; a noninverting output section of the second transconductance amplifier circuit is connected to (i) a noninverting input section and an inverting output section of the third transconductance amplifier circuit, (ii) an inverting input section of the fourth transconductance amplifier circuit, and (iii) another end of the second capacitor; an inverting output section of the second transconductance amplifier circuit is connected to (i) an inverting input section and a noninverting output section of the third transconductance amplifier circuit, (ii) a noninverting input section of the fourth transconductance amplifier circuit, and (iii) another end of the third capacitor; the noninverting output section of the third transconductance amplifier circuit serves as an inverting output terminal, and the inverting output section of the third transconductance amplifier circuit serves as a noninverting output terminal; the noninverting output section and the inverting output section of the first transconductance amplifier circuit serve as input terminals of the first common-mode feedback circuit; and the noninverting output section and the inverting output section of the second transconductance amplifier circuit serve as input terminals of the second common-mode feedback circuit.

A transfer function H(s) of the band-elimination filter circuit of the present invention having the above configuration is expressed by the following Formula (9). Further, the constants (natural angular frequency $\omega 0$, noise natural angular frequency $\omega n$, and Q-value) of the band-elimination filter circuit are expressed by the following Formulas (10) to (12).

According to Kirchhoff's law,

An output of the noninverting output section of the first transconductance amplifier circuit is $$gm1*(vin-(-vin))-gm4*(vo-(-vo))= s*C1*(v1-(-v1)), \text{ and}$$

an output of the inverting output section of the first transconductance amplifier circuit is $$-gm1*(vin-(-vin))+gm4*(vo-(-vo))= s*C1*(-v1-(v1))$$

Thus, the output of the noninverting output section and that of the inverting output section are equal to each other.

Further, an output of the noninverting output section of the second transconductance amplifier circuit is $$gm2*(v1-(-v1))-gm3*(vo-(-vo))= s*C2*(vo-(vin)), \text{ and}$$

an output of the inverting output section of the second transconductance amplifier circuit is $$-gm2*(v1-(-v1))+gm3*(vo-(-vo))= s*C2*(-vo-(-vin))$$

Thus, the output of the noninverting output section and that of the inverting output section are equal to each other.

v1 is eliminated from the above formulas, and since H(s)=vo/vin, $$H(s)=\{s^2+((gm11*gm12)/(C11*(C12/2)))\}/\{s^2+ (gm13/(C12/2))*s+((gm12*gm14)/ (C11*(C12/2)))\} \quad (9)$$

$$\omega 0=((gm12*gm14)/(C11*(C12/2)))^{1/2}=gm/C \quad (10)$$

$$\omega n=((gm11*gm12)/(C11*(C12/2)))^{1/2}=gm/C \quad (11)$$

$$Q(((C12/2)/C11)*(gm12*gm14)/(gm13^2))^{1/2}= gm/gm13 \quad (12),$$

where:

s is a complex number;

vin is an input voltage of the band-elimination filter circuit, and is vin=(vin$^+$)=−(vin$^−$);

vin$^+$ is a voltage input to the noninverting input terminal of the band-elimination filter circuit;

vin$^−$ is a voltage input to the inverting input terminal of the band-elimination filter circuit;

vo is an output voltage of the band-elimination filter circuit, and is vo=−(vo$^+$)=−(vo$^−$);

vo$^+$ is an output voltage from the noninverting output terminal of the band-elimination filter circuit;

vo$^−$ is an output voltage from the inverting output terminal of the band-elimination filter circuit;

v1 is an output voltage of the first transconductance amplifier circuit, and is v1=(v1$^+$)=−(v1$^−$);

v1$^+$ is an output voltage from the noninverting output section of the first transconductance amplifier circuit;

v1⁻ is an output voltage from the inverting output section of the first transconductance amplifier circuit;

gm 11 is a transconductance of the first transconductance amplifier circuit;

gm 12 is a transconductance of the second transconductance amplifier circuit;

gm 13 is a transconductance of the third transconductance amplifier circuit;

gm 14 is a transconductance of the fourth transconductance amplifier circuit;

C11 is a capacitance value of the first capacitor; and

C12 is a capacitance value of each of the second and third capacitors.

Further, gm=gm 11=gm 12=gm 14, and

C=C12/2=C11.

From the above Formulas (10) to (12), it is understood that the constants of the band-elimination filter circuit are adjusted by adjusting the gm 11, gm 12, gm 13, and gm 14. Particularly, by controlling only the gm 13, it is possible to adjust the Q-value while keeping natural angular frequency ω0 and the noise natural angular frequency ωn constant. Thus, a band-elimination filter circuit capable of adjusting constants such as the Q-value is realized.

Further, since the band-elimination filter circuit adopts a full-differential configuration, in-phase inputs are cancelled. Therefore, in-phase power source noise can be canceled, even if the noise affects the band-elimination filter circuit. Thus, a band-elimination filter circuit having an improved power-source noise canceling characteristic is realized.

In order to achieve the foregoing objects, a band-elimination filter circuit of the present invention includes: a first transconductance amplifier circuit for converting a differential input voltage into a differential output current; a second transconductance amplifier circuit for converting a differential input voltage into a differential output current; a third transconductance amplifier circuit for converting a differential input voltage into a differential output current; a first common-mode feedback circuit for outputting a first control signal to the first transconductance amplifier circuit so that a D.C. voltage level of a differential output from the first transconductance amplifier circuit is at a predetermined level; a second common-mode feedback circuit for outputting a second control signal to the second transconductance amplifier circuit so that a D.C. voltage level of a differential output from the second transconductance amplifier circuit is at a predetermined level; a first capacitor; a second capacitor; and a third capacitor, wherein: the third transconductance amplifier circuit includes a first output section and a second output section; a noninverting input terminal is connected to (i) a noninverting input section of the first transconductance amplifier circuit and (ii) one end of the second capacitor; an inverting input terminal is connected to (i) an inverting input section of the first transconductance amplifier circuit and (ii) one end of the third capacitor; a noninverting output section of the first transconductance amplifier circuit is connected to (i) a noninverting input section of the second transconductance amplifier circuit, (ii) an inverting output section in the second output section of the third transconductance amplifier circuit, and (iii) one end of the first capacitor; an inverting output section of the first transconductance amplifier circuit is connected to (i) an inverting input section of the second transconductance amplifier circuit, (ii) a noninverting output section in the second output section of the third transconductance amplifier circuit, and (iii) another end of the first capacitor; a noninverting output section of the second transconductance amplifier circuit is connected to (i) a noninverting input section of the third transconductance amplifier circuit, (ii) an inverting output section in the first output section of the third transconductance amplifier circuit and (iii) another end of the second capacitor; an inverting output section of the second transconductance amplifier circuit is connected to (i) an inverting input section of the third transconductance amplifier circuit, (iii) a noninverting output section in the first output section of the third transconductance amplifier circuit, and (iii) another end of the third capacitor; the noninverting output section in the first output section of the third transconductance amplifier circuit serves as a noninverting output terminal, and the inverting output section in the first output section of the third transconductance amplifier circuit serves as an inverting output terminal; the noninverting output section and the inverting output section of the first transconductance amplifier circuit serve as input terminals of the first common-mode feedback circuit; and the noninverting output section and the inverting output section of the second transconductance amplifier circuit serve as input terminals of the second common-mode feedback circuit.

This band-elimination filter circuit (hereinafter, second band-elimination filter circuit) of the present invention is different from the foregoing band-elimination filter circuit (hereinafter, first band-elimination filter circuit) having the first to fourth transconductance amplifier circuits in that the third transconductance amplifier circuit and the fourth transconductance amplifier circuit are replaced with a single transconductance amplifier circuit. With the second band-elimination filter circuit, a transfer function similar to that of the first band-elimination filter circuit is obtained. Further, since a full-differential configuration is adopted. Thus, a band-elimination filter circuit which is capable of adjusting constants such as a Q-value or the like, and which circuit has an improved characteristic of removing power-source noise is realized. Further, the second band-elimination filter circuit has a simple circuit configuration. Therefore, cutting down of the costs is possible.

In order to achieve the foregoing objects, a band-elimination filter circuit of the present invention includes: a photo-acceptance element for converting an infrared signal received into an electric signal; an amplifying circuit for amplifying the electric signal; the bandpass filter for extracting a carrier frequency component from the electric signal amplified; and a carrier detection circuit including (I) a first comparing circuit which compares an output signal of the bandpass filter with a first threshold voltage whose level is a noise detection level, (II) a second comparing circuit which compares the output signal of the bandpass filter with a second threshold voltage whose level is higher than the first threshold voltage and is a first carrier detection level, (III) a third comparing circuit which compares the output signal of the bandpass filter with a third threshold voltage whose level is higher than the second threshold voltage and is a peak detection level for judging the output signal of the band pass filter and a level of the output signal, (IV) a logic circuit which (i) controls a gain of the amplifying circuit based on an output signal of the first comparing circuit so that the output signal of the first comparing circuit is not output, and (ii) controls the gain and Q-value of the bandpass filter circuit based on an output signal of the third comparing circuit so that the output signal of the third comparing circuit is not output, the carrier detection circuit outputting as a carrier an output signal of the second comparing circuit.

According to the configuration, the infrared signal processing circuit of the present invention includes the first comparing circuit. When an output signal is output from the first comparing circuit, it is judged that disturbance light noise has entered. Then, the gain of the amplifying circuit is controlled so that the level of the disturbance light noise is reduced to a level not more than the noise detection level which is smaller than the signal detection level: i.e., the level of the disturbance light noise is reduced to such a level that the disturbance light noise causes no malfunction. Accordingly, the disturbance light noise having entered is reduced without fail, and malfunction attributed to the disturbance light noise is restrained.

Further, the infrared signal processing circuit includes the third comparing circuit. When an output signal is output from the third comparing circuit, it is judged that the gain and Q-value of the bandpass filter circuit are too large. Then, the gain and Q-value of the bandpass filter circuit are controlled so that the level of the output signal from the bandpass filter is not more than the peak detection level. Thus, it is possible to reduce distortion in the waveform of an output from the bandpass filter circuit. Thus, it is possible to realize an infrared signal processing circuit capable of reducing disturbance light noise and reducing distortion in the waveform of an output from the bandpass filter circuit.

Further, with the provision of the bandpass filter circuit in the infrared signal processing circuit, it is possible to realize an infrared signal processing circuit having an improved power-source noise canceling characteristic.

In order to achieve the foregoing objects, a band-elimination filter circuit of the present invention includes: a photo-acceptance element for converting an infrared signal received into an electric signal; an amplifying circuit for amplifying the electric signal; a bandpass filter circuit for extracting a carrier frequency component from the electric signal having been amplified; a band-elimination filter circuit for removing disturbance light noise from the carrier frequency component extracted; and a carrier detection circuit including (I) a first comparing circuit which compares an output signal of the band-elimination filter circuit with a first threshold voltage whose level is a noise detection level, (II) a second comparing circuit which compares the output signal of the band-elimination filter circuit with a second threshold voltage whose level is higher than that the first threshold voltage and is a first carrier detection level, (III) a third comparing circuit which compares the output signal of the band-elimination filter circuit with a third threshold voltage whose level is higher than the second threshold voltage and is a peak detection level for judging the output signal of the band pass filter and a level of the output signal, and (IV) a logic circuit which (i) controls a gain of the amplifying circuit and a Q-value of the band-elimination filter circuit based on an output signal of the first comparing circuit so that the output signal of the first comparing circuit is not output, and (ii) controls a gain and a Q-value of the bandpass filter circuit based on an output signal of the third comparing circuit so that the output signal of the third comparing circuit is not output, the carrier detection circuit outputting as a carrier an output signal of the second comparing circuit, wherein: (A) the bandpass filter circuit includes: a first transconductance amplifier circuit for converting a differential input voltage into a differential output current; a second transconductance amplifier circuit for converting a differential input voltage into a differential output current; a third transconductance amplifier circuit for converting a differential input voltage into a differential output current; a first common-mode feedback circuit for outputting a first control signal to the first transconductance amplifier circuit so that a D.C. voltage level of a differential output from the first transconductance amplifier circuit is at a predetermined level; a second common-mode feedback circuit for outputting a second control signal to the second transconductance amplifier circuit so that a D.C. voltage level of a differential output from the second transconductance amplifier circuit is at a predetermined level; a first capacitor; a second capacitor; a third capacitor; and an adjustment section for adjusting a transconductance of at least one of the transconductance amplifier circuits, a noninverting input terminal being connected, via the first capacitor, to (i) a noninverting output section of the first transconductance amplifier circuit and (ii) a noninverting input section of the second transconductance amplifier circuit, an inverting input terminal being connected, via the second capacitor, to (i) an inverting output section of the first transconductance amplifier circuit and (ii) an inverting input section of the second transconductance amplifier circuit, a noninverting output section of the second transconductance amplifier circuit being connected to (i) an inverting input section of the first transconductance amplifier circuit, (ii) a noninverting input section and an inverting output section of the third transconductance amplifier circuit, and (iii) one end of the third capacitor, an inverting output section of the second transconductance amplifier circuit being connected to (i) a noninverting input section of the first transconductance amplifier circuit, (ii) an inverting input section and a noninverting output section of the third transconductance amplifier circuit, and (iii) another end of the third capacitor, the noninverting output section of the third transconductance amplifier circuit serving as an inverting output terminal, the inverting output section of the third transconductance amplifier circuit serves as a noninverting output terminal, the noninverting output section and the inverting output section of the first transconductance amplifier circuit serving as input terminals of the first common-mode feedback circuit, and the noninverting output section and the inverting output section of the second transconductance amplifier circuit serving as input terminals of the second common-mode feedback circuit; and (B) the band-elimination filter circuit includes: a first transconductance amplifier circuit for converting a differential input voltage into a differential output current; a second transconductance amplifier circuit for converting a differential input voltage into a differential output current; a third transconductance amplifier circuit for converting a differential input voltage into a differential output current; a fourth transconductance amplifier circuit for converting a differential input voltage into a differential output current; a first common-mode feedback circuit for outputting a first control signal to the first transconductance amplifier circuit so that a D.C. voltage level of a differential output from the first transconductance amplifier circuit is at a predetermined level; a second common-mode feedback circuit for outputting a second control signal to the second transconductance amplifier circuit so that a D.C. voltage level of a differential output from the second transconductance amplifier circuit is at a predetermined level; a first capacitor; a second capacitor; a third capacitor; and an adjustment section for adjusting a transconductance of at least one of the transconductance amplifier circuits, a noninverting input terminal being connected to (i) a noninverting input section of the first transconductance amplifier circuit and (ii) one end of the second capacitor, an inverting input terminal being connected to (i) an inverting input section of the first transconductance amplifier circuit and (ii) one end of the third capacitor, a noninverting output section of the first transconductance amplifier circuit being connected to (i) a noninverting input section of the second transconductance amplifier circuit, (ii) an inverting output section of the fourth transconductance amplifier circuit, and (iii) one end of the first capacitor, an inverting output section of the first transconductance amplifier circuit being connected to (i) an inverting input section of the second transconductance amplifier circuit, (ii) a noninverting output section of the fourth transconductance amplifier circuit, and (iii) another end of the first capacitor, a noninverting output section of the second transconductance amplifier circuit being connected to (i) a noninverting input section and an inverting output section of the third transconductance amplifier circuit, (ii) an inverting input section of the fourth transconductance amplifier circuit, and (iii) another end of the second capacitor, an inverting output section of the second transconductance amplifier circuit being connected to (i) an inverting input section and a noninverting output section of the third transconductance amplifier circuit, (ii) a noninverting input section of the fourth transconductance amplifier circuit, and (iii) another end of the third capacitor, the noninverting output section of the third transconductance amplifier circuit serving as an inverting output terminal, and the inverting output section of the third transconductance amplifier circuit serves as a noninverting output terminal, the noninverting output section and the inverting output section of the first transconductance amplifier circuit serving as input terminals of the first common-mode feedback circuit, and the noninverting output section and the inverting output section of the second transconductance amplifier circuit serving as input terminals of the second common-mode feedback circuit.

According to the configuration, the infrared signal processing circuit of the present invention includes the first comparing circuit. When an output signal is output from the first comparing circuit, it is judged that disturbance light noise has entered. Then, the gain of the amplifying circuit is controlled so that the level of the disturbance light noise is reduced to a level not more than the noise detection level which is smaller than the signal detection level: i.e., the level of the disturbance light noise is reduced to such a level that the disturbance light noise causes no malfunction. Accordingly, the disturbance light noise having entered is reduced without fail, and malfunction attributed to the disturbance light noise is restrained.

Further, the infrared signal processing circuit includes the third comparing circuit. When an output signal is output from the third comparing circuit, it is judged that the gain and Q-value of the bandpass filter circuit are too large. Then, the gain and Q-value of the bandpass filter circuit are controlled so that the level of the output signal from the bandpass filter is not more than the peak detection level. Thus, it is possible to reduce distortion in the waveform of an output from the bandpass filter circuit. Thus, it is possible to realize an infrared signal processing circuit capable of reducing disturbance light noise and reducing distortion in the waveform of an output from the bandpass filter circuit.

Further, with the provision of the bandpass filter circuit and the band-elimination filter circuit in the infrared signal processing circuit, it is possible to realize an infrared signal processing circuit having an improved power-source noise canceling characteristic.

Further, since the infrared signal processing circuit includes the band-elimination filter circuit, it is further possible to reduce disturbance light noise.

Additional objects, features, and strengths of the present invention will be made clear by the description below. Further, the advantages of the present invention will be evident from the following explanation in reference to the drawings.

DESCRIPTION OF THE EMBODIMENTS

Embodiment 1

An embodiment of the present invention is described below with reference to FIG. 1 to FIG. 5.

Figure 1:
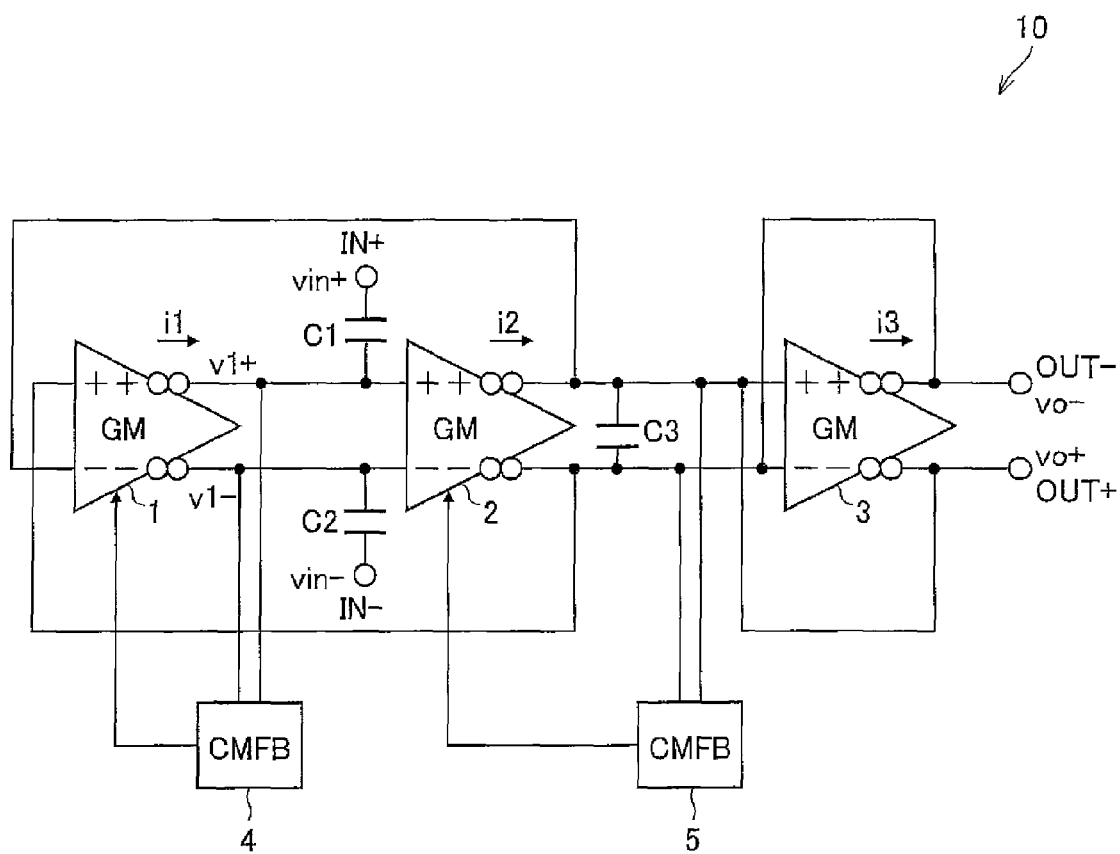
FIG. 1 is a diagram showing a configuration of a bandpass filter circuit according to an embodiment.

FIG. 1 shows a configuration of a bandpass filter circuit (BPF) 10 (hereinafter, first bandpass filter circuit).

The BPF 10 is a full-differential bandpass filter circuit including: transconductance amplifier circuits (hereinafter, simply referred to as GMs) 1 to 3 (first transconductance amplifier to third transconductance amplifier) for converting a differential input voltage into a differential output current; common-mode feedback circuits (hereinafter, simply referred to as CMFBs) 4 and 5 (first and second common-mode feedback circuits); and capacitors C1 to C3 (first capacitor to third capacitor). Hereafter, the GM1 to GM3 are sometimes referred to as GM, collectively.

A noninverting output section of the GM1 is connected to a noninverting input section of the GM2, and an inverting output section of the GM1 is connected to an inverting input section of the GM2. A noninverting output section of the GM2 is connected to a noninverting input section of the GM3, and an inverting output section of the GM2 is connected to an inverting input section of the GM3.

Further, the noninverting output section of the GM2 is connected to an inverting input section of the GM1, and the inverting output section of the GM2 is connected to a noninverting input section of the GM1. Further, the noninverting and the inverting output sections of the GM2 are connected to the capacitor C3. Further, the noninverting output section of the GM2 is connected to an inverting output section of the GM3, and the inverting output section of the GM2 is connected to a noninverting output section of the GM3.

A noninverting input terminal IN⁺ of the BPF 10 is connected to a connection point between the noninverting output section of the GM1 and the noninverting input section of the GM2, via the capacitor C1. An inverting input terminal IN⁻ of the BPF 10 is connected to a connection point between the inverting output section of the GM1 and the inverting input section of the GM2, via the capacitor C2. A noninverting output terminal OUT⁺ of the BPF 10 serves as the inverting output section of the GM3, and the inverting output terminal OUT⁻ of the BPF 10 serves as the noninverting output section of the GM3.

The noninverting output section and the inverting output section of the GM1 serve as input terminals of the CMFB 4. The CMFB 4 outputs a first control signal to the GM1 so that a D.C. voltage level of the differential output of the GM1 is at a predetermined level. The noninverting output section and the inverting output section of the GM2 serve as input terminals of the CMFB 5. The CMFB 5 outputs a second control signal to the GM2 so that a D.C. voltage level of the differential output of the GM2 is at a predetermined level.

The transfer function H(s) of the BPF 10 having a configuration as described above is expressed by the following Formula (13) (which is the same as Formula (5)). Further, the constants (i.e., natural angular frequency ω0, Q-value, and gain H) of the BPF 10 are respectively expressed by the Formulas (14) to (16) (which are respectively the same as the Formulas (6) to (8)).

According to Kirchhoff's law, an output of the noninverting output section of the GM1 is $$gm1*(-vo-vo)=s*C1*(v1-vin), \text{ and}$$

an output of the inverting output section of the GM1

$$-gm1*(-vo-vo)=s*C1*(-v1-(-vin)).$$

Thus, the output of the noninverting output section and that of the inverting output section are equal to each other.

Further, an output of the noninverting output section of the GM2 is $$gm2*(v1-(-v1))-gm3*(vo-(-vo))=s*C3*(vo-(-vo)),$$
and an output of the inverting output section of the GM2 is $$-gm2*(v1-(-v1))+gm3*(vo-(-vo))= s*C3*(-vo-(vo))$$

Thus, the output of the noninverting output section and that of the inverting output section are equal to each other.

v1 is eliminated from the above formulas, and since H(s) =vo/vin, $$H(s)=\{(gm2/C3)*s\}/\{s^2+(gm3/C3)*s+ ((gm1*gm2)/((C1/2)*C3))\} \quad (13)$$

$$\omega0=((gm1*gm2)/((C1/2)*C3))^{1/2}=gm/C \quad (14)$$

$$Q=((C3/(C1/2))*(gm1*gm2)/(gm3^2))^{1/2}=gm/gm3 \quad (15)$$

$$H=gm2/gm3=gm/gm3 \quad (16)$$

where:
s is a complex number
vin is an input voltage of the BPF 10, and is vin=(vin⁺)=−(vin⁻);
vin⁺ is a voltage input to the noninverting input terminal IN⁺ of the BPF 10;
vin⁻ is a voltage input to the inverting input terminal IN⁻ of the BPF 10;
vo is an output voltage of the BPF 10, and is vo=(vo⁺)=−(vo⁻);
vo⁺ is a voltage output from the noninverting output terminal OUT⁺ of the BPF 10;
vo⁻ is a voltage output from the inverting output terminal OUT⁻ of the BPF 10;
v1 is an output voltage of the GM1, and is v1=(v1⁺)=−(v1⁻);
v1⁺ is a voltage output from the noninverting output section of the GM 1;

v1⁻ is a voltage output from the inverting output section of the GM 1;

gm 1 is a transconductance of the GM1;
gm 2 is a transconductance of the GM2;
gm 3 is a transconductance of the GM3;
i1 is an output current of the GM1;
i2 is an output current of the GM2;
i3 is an output current of the GM3;
C1 is a capacitance value of each of the capacitors C1 and C2;
C3 is a capacitance value of the capacitor C3;
Further,
gm=gm 1=gm 2, and
C=C1/2=C3.

From the above Formulas (14) to (16), it is understood that the constants of the BPF 10 are adjusted by adjusting the gm 1, gm 2, and gm 3. Particularly, by controlling only the gm 3, it is possible to adjust the Q-value and the gain H while keeping the natural angular frequency ω0 constant. Further, for example, when gm 3=β*gm(0<β<1), Q=1/β and H=1/β. Thus, the Q-value and the gain H are adjusted simply by adjusting the β.

Figure 2:
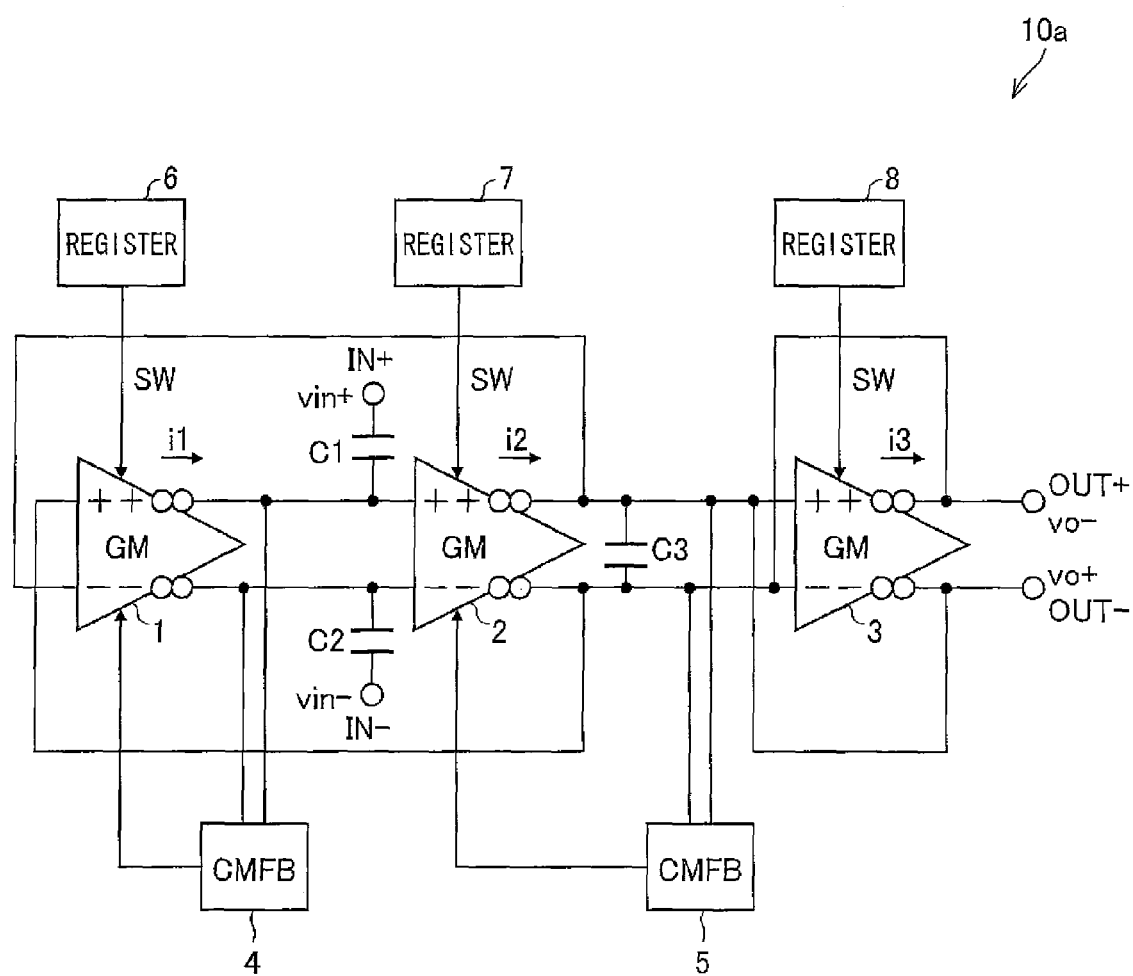
FIG. 2 is a diagram showing a configuration for adjusting a transconductance of a transconductance amplifier circuit in a the bandpass filter circuit.

FIG. 2 shows a BPF 10a having a configuration for adjusting the gm of the GM in the BPF 10.

As shown in the figure, the BPF 10a has registers 6 to 8 (adjusting sections) in addition to the configuration shown in FIG. 1. Each of the registers outputs to the associated GM an adjustment signal SW for adjusting the gm in response to an external signal, thereby adjusting gm. That way, the constants of the BPF 10 are adjusted.

The adjustment signal SW from the register 6 adjusts gm 1 of the GM1, thereby adjusting the natural angular frequency ω0 and the Q-value of GM1. Similarly, the adjustment signal SW from the register 7 adjusts gm 2 of the GM2, thereby adjusting the natural angular frequency ω0, the Q-value, and the gain H of the GM2. The adjustment signal SW from the register 8 adjusts gm 3 of the GM3, thereby adjusting the Q-value and the gain H. (See Formulas (14) to (16))

Figure 3:
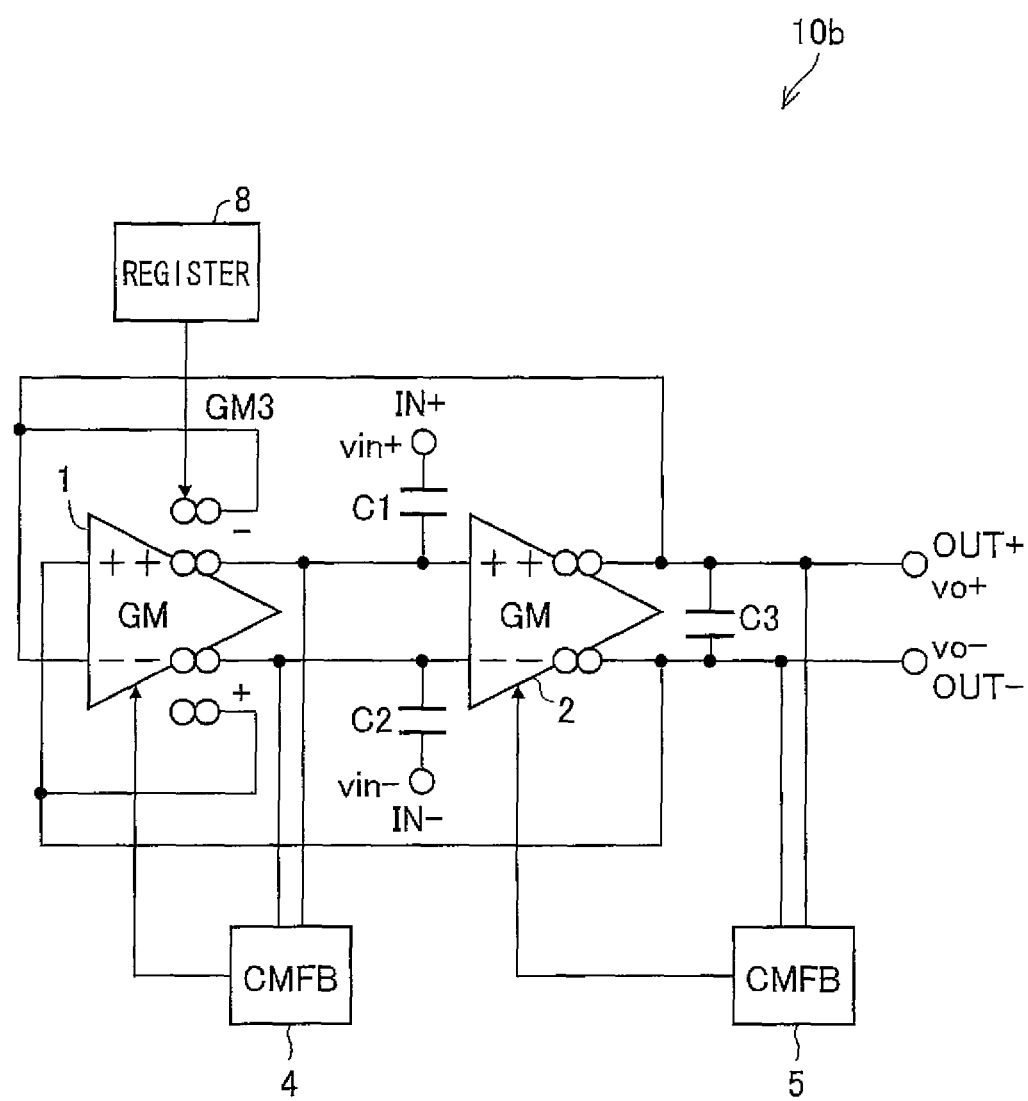
FIG. 3 is a diagram showing another exemplary configuration of the bandpass filter circuit.

FIG. 3 shows a BPF 10b (second bandpass filter circuit) which is an alternative form of the BPF 10. In the BPF 10b, the GM1 and GM3 are realized with a single transconductance amplifier circuit, and the GM1 has first and second output sections.

A noninverting output section in the first output section of the GM1 is connected to a noninverting input section of the GM2, and an inverting output section in the first output section of the GM1 is connected to an inverting input section of the GM2. A noninverting output section of the GM2 is connected to an inverting input section of the GM1, and an inverting output section of the GM2 is connected to a noninverting input section of the GM1. Further, the noninverting output section and the inverting output section of the GM2 are connected to a capacitor C3. Further, the noninverting output section of the GM2 is connected to an inverting output section in the second output section of the GM1, and the inverting output section of the GM2 is connected to a noninverting output section in the second output section of the GM1.

A noninverting input terminal IN⁺ of the BPF 10b is connected to a connection point between the noninverting output section in the first output section of the GM1 and the noninverting input section of the GM2, via a capacitor C1. An inverting input terminal IN⁻ of the BPF 10b is connected to a connection point between the inverting output section in the first output section of the GM1 and the inverting input section of the GM2, via the capacitor C2. A noninverting output terminal OUT⁺ of the BPF 10b serves as the noninverting output section of the GM2, and an inverting output terminal OUT⁻ of the BPF 10b serves as the inverting output section of the GM2.

The noninverting output section and the inverting output section of the GM1 serve as input terminals of the CMFB 4. The CMFB 4 outputs a first control signal to the GM1 so that a D.C. voltage level of the differential output of the GM1 is at a predetermined level. The noninverting output section and the inverting output section of the GM2 serve as input terminals of the CMFB 5. The CMFB 5 outputs a second control signal to the GM2 so that a D.C. voltage level of the differential output of the GM2 is at a predetermined level.

With the above-described configuration, the BPF 10b is able to obtain a transfer function similar to that of the BPF 10. Further, since a full-differential configuration is adopted, constants such as the Q-value can be adjusted. This allows improvement in the characteristic of removing power-source noise. Further, in the BPF 10b, the GM1 and the GM3 are realized with a single transconductance amplifier circuit. This simplifies the circuit configuration, and therefore cutting back of the cost is possible. Further, in a case of providing only the register 8 (for controlling the second output section of the GM1) as shown in the figure, the circuit configuration is further simplified, and further cutting back of the cost is possible. However, it is needless to mention that the configurations shown in FIG. 2 and FIG. 3 are mere examples.

Figure 4:
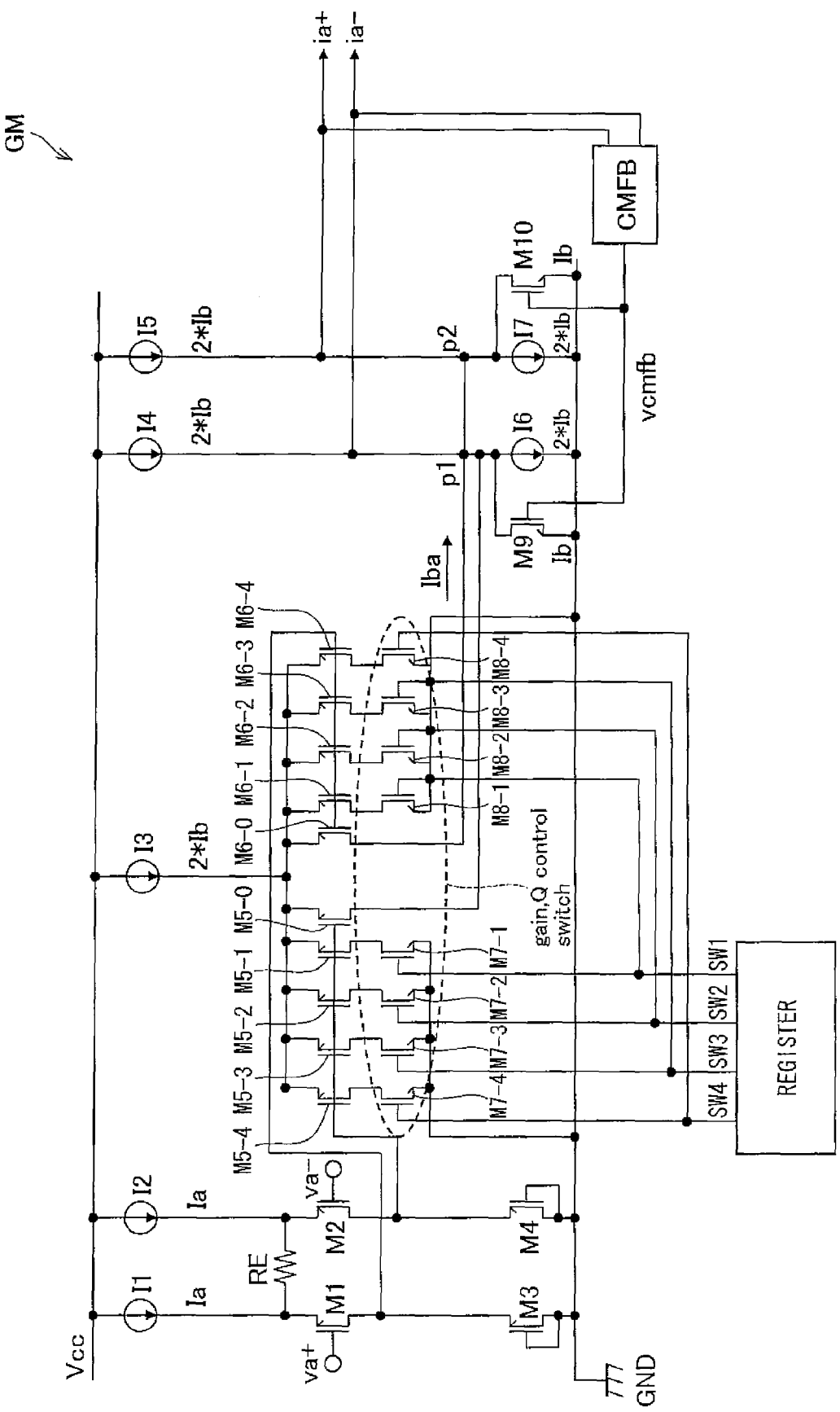
FIG. 4 is a diagram showing a specific configuration of the transconductance amplifier circuit.

FIG. 4 shows a specific configuration of the GM.

The GM includes: P-channel MOS transistors M1 to M6, N-channel MOS transistors M7 to M10, current sources I1 to I7, and a resistor RE. Adjustment of gm is performed with a use of the transistors M7 and M8 to which an adjustment signal SW is input from a register.

The source of the transistor M1 is connected to a power source terminal via the current source I1. The source of the transistor M2 is connected to the power source terminal via the current source I2. The resistor RE is connected to: a connection point between the source of the transistor M1 and the current source I1; and a connection point between the source of the transistor M2 and the current source I2. The drain of the transistor M1 is connected to the source of the transistor M3, and the drain of the transistor M2 is connected to the source of the transistor M4. The gate and the drain of the transistor M3 are connected to each other, and are connected to a GND terminal. The gate and the drain of the transistor M4 are connected to each other and are connected to the GND terminal. The gate of the transistor M1 serves as a noninverting input section, and the gate of the transistor M2 serves as an inverting input section.

The transistor M5 is a group of transistors including transistors M5-0 to M5-4 whose gates are connected to one another and whose sources are connected to one another. The transistor M6 is a group of transistors including transistors M6-0 to M6-4 whose gates are connected to one another and whose sources are connected to one another. The transistor M7 is a group of transistors including transistors M7-1 to M7-4 whose sources are connected to one another. The transistor M8 is a group of transistors including transistors M8-1 to M8-4 whose sources are connected to one another.

The gates of the transistor M5 (i.e., the respective gates, of the transistors M5-0 to M5-4, which are connected to one another) are connected to the drain of the transistor M2. The gates of the transistor M6 (i.e., the respective gates, of the transistors M6-0 to M6-4, which are connected to one another) are connected to the drain of the transistor M1.

The sources of the transistor M5 (i.e., the respective sources, of the transistors M5-0 to M5-4, which are connected to one another) are connected to the power source terminal via a current source I3. Similarly, the sources of the transistor M6 (i.e., the respective sources, of the transistors M6-0 to M6-4, which are connected to one another) are connected to the power source terminal via the current source I3.

The drain of the transistor M5-1 is connected to the drain of the transistor M7-1. The drain of the transistor M5-2 is connected to the drain of the transistor M7-2. The drain of the transistor M5-3 is connected to the drain of the transistor M7-3. The drain of the transistor M5-4 is connected to the drain of the transistor M7-4. The respective sources of the transistors M7-1 to M7-4 are connected to the GND terminal.

The drain of the transistor M6-1 is connected to the drain of the transistor M8-1. The drain of the transistor M6-2 is connected to the drain of the transistor M8-2. The drain of the transistor M6-3 is connected to the drain of the transistor M8-3. The drain of the transistor M6-4 is connected to the drain of the transistor M8-4. The respective sources of the transistors M8-1 to M8-4 are connected to the GND terminal.

An adjustment signal SW1 from the register is input to the respective gates of the transistors M7-1 and M8-1. An adjustment signal SW2 from the register is input to the respective gates of the transistors M7-2 and M8-2. An adjustment signal SW3 from the register is input to the respective gates of the transistors M7-3 and M8-3. An adjustment signal SW4 from the register is input to the respective gates of the transistors M7-4 and M8-4.

One end of a current source I4 is connected to the power source terminal. Another end of the current source I4 is connected to one end of a current source I6. Another end of the current source I6 is connected to the GND terminal. The transistor M9 is parallel-connected to the current source I6. One end of a current source I5 is connected to the power source terminal. Another end of the current source I5 is connected to one end of a current source I7. Another end of the current source I7 is connected to the GND terminal. The transistor M10 is parallel-connected to the current source I7.

The drain of the transistor M9 is connected to the drain of the transistor M5-0. The drain of the transistor M10 is connected to the drain of the transistor M6-0. Here, it is supposed that p1 is a connection point between the drain of the transistor M9 and the drain of the transistor M5-0, and that P2 is a connection point between the drain of the transistor M10 and the drain of the transistor M6-0. The connection point p1 serves as an inverting output section. The connection point p2 serves as a noninverting output section. The connection points p1 and p2 also serve as input terminals of the CMFB, and a control voltages vcmfb (first and second control signals) are input from the CMFB to the gates of the transistors M9 and M10. Here, FIG. 4 shows a configuration of the GMs 1 and 2. The GM3 has a configuration which is basically the same as those of the GMs 1 and 2. However, the GM3 does not include transistors M9 and M10, and is not connected to the CMFB.

Figure 5:
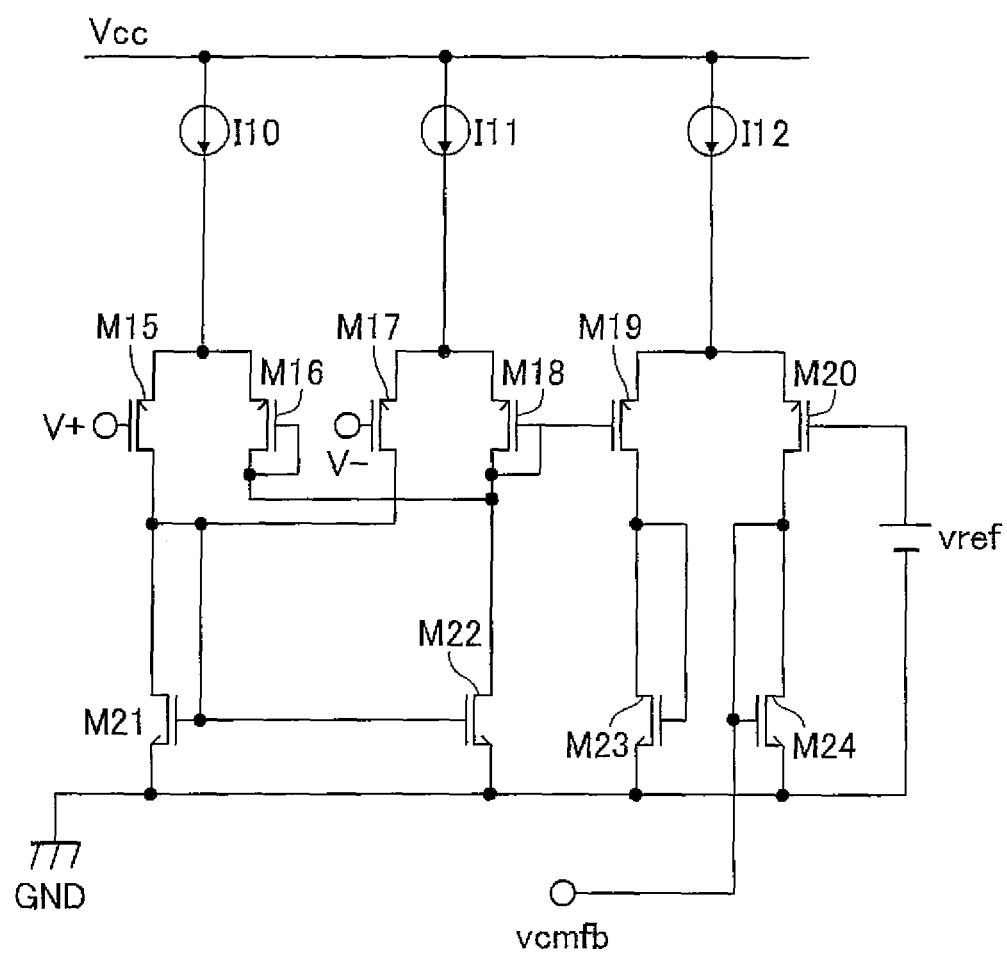
FIG. 5 is a diagram showing a specific configuration of a common-mode feedback circuit in the bandpass filter circuit.

FIG. 5 shows a specific configuration of the CMFB.

The CMFB includes: P-channel MOS transistors M15 to M20, N-channel MOS transistors M21 to M24, and current sources I10 to I12.

The respective sources of the transistors M15 and M16 are connected to each other, and are connected to the power source terminal via a current source I10. The respective sources of the transistors M17 and M18 are connected to each other, and are connected to the power source terminal via a current source I11. The respective sources of the transistors M19 and M20 are connected to each other, and are connected to the power source terminal via a current source I20.

The drain of the transistor M15 is connected to the drain of the transistor M21. The drain of the transistor M16 is connected to its gate, and is connected to the drain of the transistor M18. The drain of the transistor M17 is connected to the drain of the transistor M15, and is connected to the gate of the transistor M21. The drain of the transistor M18 is connected to its gate, and is connected to the drain of the transistor M22. The respective gates of the transistors M21 and M22 are connected to each other, and the respective sources of the transistors M21 and M22 are connected to the GND terminal.

The gate of the transistor M19 is connected to the gate of the transistor M18. The drain of the transistor M19 is connected to the drain and gate of the transistor M23. The gate of the transistor M20 is connected to the GND terminal via a reference voltage source Vref. the drain of the transistor M20 is connected to the drain and gate of the transistor M24. The respective sources of the transistors M23 and M24 are connected to the GND terminal.

The gate of the transistor M15 is connected to the connection point p2 of the GM. The gate of the transistor M17 is connected to the connection point p1 of the GM. The drain of the transistor M24 serve as an output terminal of the CMFB, and outputs the control voltages Vcmfb to the respective gates of the transistors M9 and M10 of the GM. Thus, a D.C. voltage level of a differential output of the GM equals the reference voltage Vref (equals the predetermined level).

In the GM having the above-described configuration, the transistors M1 to M6 operate in their weakly inversion regions. A current in each weakly inversion region is expressed by the following Formula (17).

$$Id=(W/L)*Ido*\exp(Vgs/(n*Vt)) \qquad (17)$$

According to the Formula (17), $$gm=Id/(n*Vt),$$

$$re=(n*Vt)/Ia, \text{ and}$$

$$\Delta I=2*va/(RE+2re),$$

where:
Id is a drain current;
W is a channel width;
L is a channel length;
Ido is a parameter of a current in a weak inversion region; and
Vgs is a gate-source voltage.
Further, $$n=1+Cd/Cox$$

Cd is capacity of depletion layer;
Cox is the capacitance of a gate oxidized film;

$$Vt=k*T/q;$$

k is Boltzmann constant;
T is an absolute temperature;
q is an elementary charge of an electron;
re is a reciprocal of each transconductance of each of the transistors.
Ia is an output current of each of the current sources I1 and I2;
RE is a resistor value of the resistor RE;
ΔI is a current flowing in the resistor RE; and
va is an input voltage of the GM, and is va=(va$^+$)=−(va$^-$).

According to the translinear loop of the transistors M3 to M6, $$Vgs3+Vgs5=Vgs4+Vgs6$$

$$ia=(Iba/Ia)*\Delta I$$

$$gm=ia/va=2*(Iba/Ia)/(RE+2*((n*Vt)/Ia)) \qquad (18)$$

where:

Iba is a value of a current flowing in each of the transistors M5_0 and M6_0; and ia is an output current of the GM, and is ia=(ia$^+$)=−(ia$^-$);

gm is adjusted by controlling the current value Iba in the Formula (18). Specifically, the current value Iba is controlled with a register and MOS switches (i.e., transistors M7-1 to M7-4, and transistors M8-1 to M8-4).

For example, the respective W/L ratios of the transistors M5-0 to M5-4, and the transistors M6-0 to M6-4 are set as follows.

Transistors M5-0 and M6-0: (W0/L0)

Transistors M5-1 and M6-1: (W0/L0)

Transistors M5-2 and M6-2: (W0/L0)*2$^1$

Transistors M5-3 and M6-3: (W0/L0)*2$^2$

Transistors M5-4 and M6-4: (W0/L0)*2$^3$

Then, the transistors M7-1 to M7-4 and the transistors M8-1 to M8-4 are switched between on and off, by control signals SW from the register (in this case, SW1 to SW4, supposing that the register is 4 bit register). That way, the current value Iba in each of the transistors M5-0 and M6-0 can be controlled.

Table 1 shows specifically how gm is adjusted. Here, in the case of Table 1, the gm is adjusted by the BPF 10b shown in FIG. 3. As shown in the table, the current value Iba in each of the transistors M5-0 and M6-0 vary according to the control signals SW from the register. With the variation in the current value Iba, the gm is varied. As mentioned above, since a 4-bit register is adopted in this case, gm can be adjusted in 16 different ways. The current value Iba is expressed the following Formula (19).

$$Iba = Ib * (1/2^m) \quad (m=0 \text{ to } 4) \quad (19)$$

TABLE 1

| SW4, SW3, SW2, SW1 | Iba | gm | Q |
|---|---|---|---|
| 1111 | Ib * (1/16) | gm (Small) | 16 |
| 1110 | Ib * (1/15) | ↓ | 15 |
| 1101 | Ib * (1/14) | ↓ | 14 |
| 1100 | Ib * (1/13) | ↓ | 13 |
| 1011 | Ib * (1/12) | ↓ | 12 |
| 1010 | Ib * (1/11) | ↓ | 11 |
| 1001 | Ib * (1/10) | ↓ | 10 |
| 1000 | Ib * (1/9) | ↓ | 9 |
| 0111 | Ib * (1/8) | ↓ | 8 |
| 0110 | Ib * (1/7) | ↓ | 7 |
| 0101 | Ib * (1/6) | ↓ | 6 |
| 0100 | Ib * (1/5) | ↓ | 5 |
| 0011 | Ib * (1/4) | ↓ | 4 |
| 0010 | Ib * (1/3) | ↓ | 3 |
| 0001 | Ib * (1/2) | ↓ | 2 |
| 0000 | Ib | gm (Large) | 1 |

$$Q = gm/gm\,3$$
$$= \left\{ \frac{2*(Ib/Ia)}{(Re + 2*((n*Vt)/Ia))} \right\} / \left\{ \frac{2*(Iba/Ia)}{(Re + 2*((n*Vt)/Ia))} \right\}$$
$$= 2^m \quad (20)$$

Through this adjustment of the gm, the Q-value can be adjusted so as to fall within a range from 16 to 1.

Further, $$H = gm/gm\,3$$
$$= \left\{ \frac{2*(Ib/Ia)}{(Re + 2*((n*Vt)/Ia))} \right\} / \left\{ \frac{2*(Iba/Ia)}{(Re + 2*((n*Vt)/Ia))} \right\}$$
$$= 2^m \quad (21)$$

Thus, through this adjustment of the gm, the gain H can be also adjusted so as to fall within a range from 16 to 1.

By adopting the above-described full-differential bandpass filter circuit as the BPF, it is possible to improve the power-source noise canceling characteristic.

With the full-differential configuration, both ± outputs of the GM1 have an identical output impedance Ro. Therefore, where vx is a signal input to the GM2, the signal input to both of the ± inputs are $$vx = Ro/(1/(s*C1) + Ro)*vin \quad (22), \text{ and are in-phase.}$$

Thus, $$I2 = gm\,2*(vx^+ - vx^-) = 0 \quad (23), \text{ and}$$

the in-phase inputs are canceled. As a result, even if power source noise affects the BPF, the noise can be canceled. This allows improvement in the power-source noise canceling characteristic.

As mentioned above, the BPF of the present invention allows adjustment of its constant such as the Q-value or the like by means of controlling the gm. Further, with the BPF, the power-source noise canceling characteristic is improved.

Embodiment 2

Figure 6:
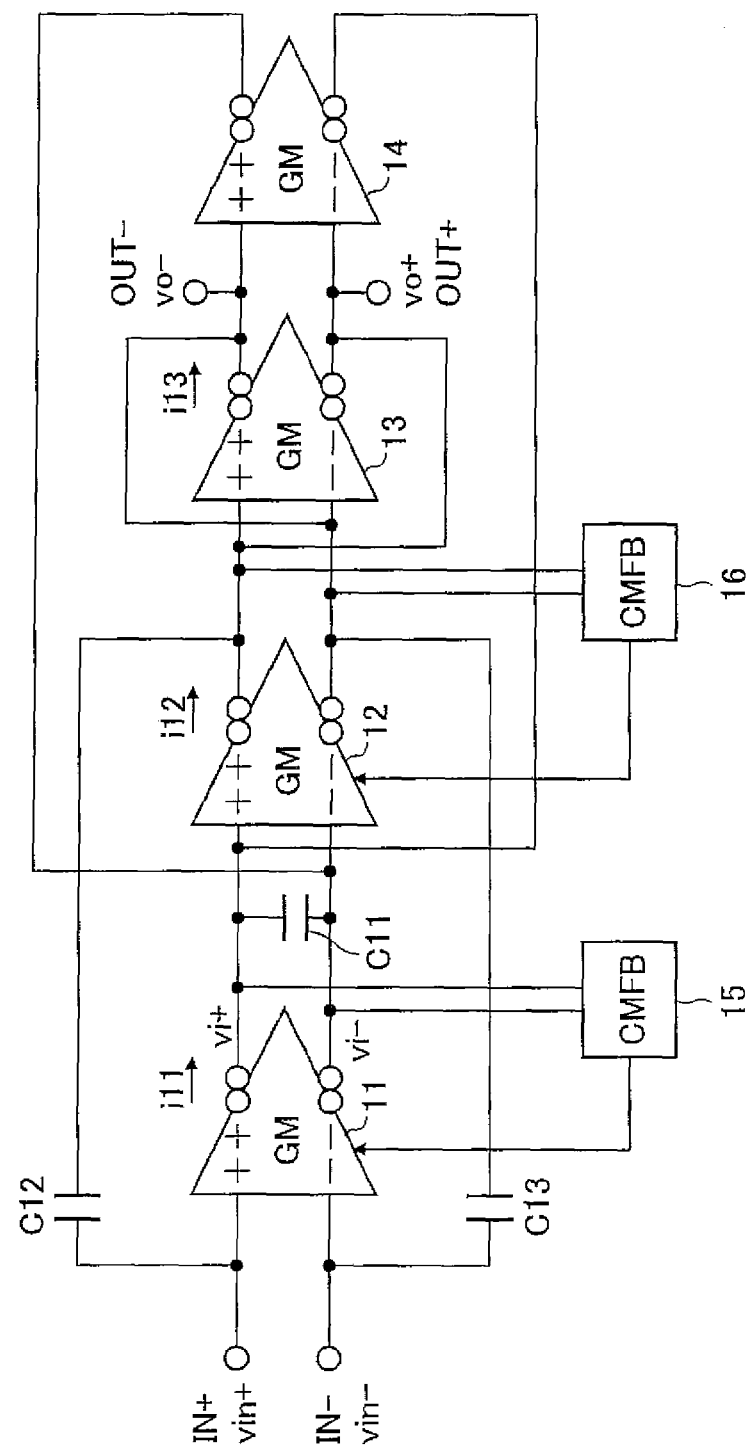
FIG. 6 is a diagram showing a configuration of a band-elimination filter circuit according to another embodiment.
Figure 7:
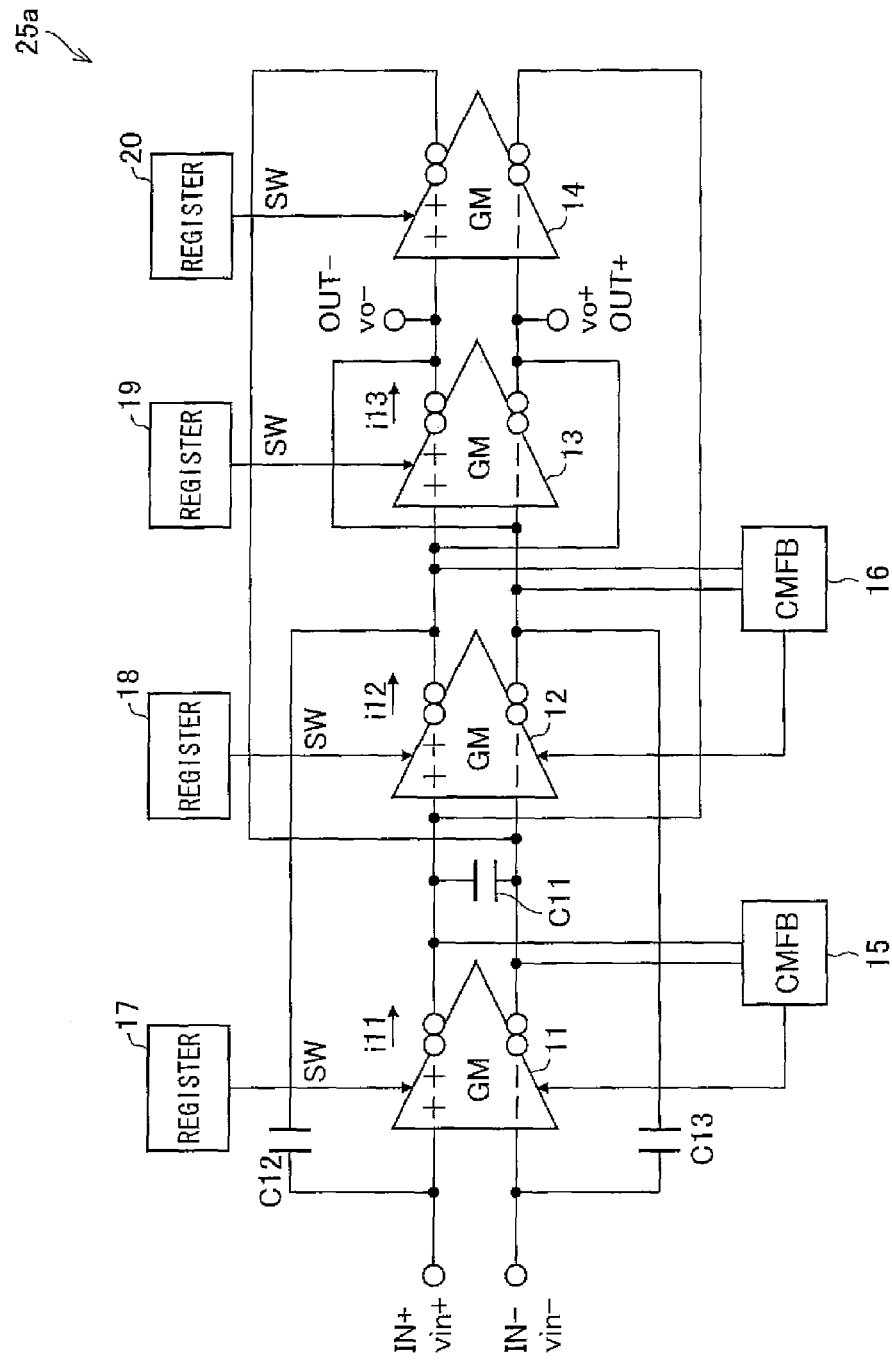
FIG. 7 is a diagram showing a configuration for adjusting a transconductance of a transconductance amplifier circuit in the band-elimination filter circuit.
Figure 8:
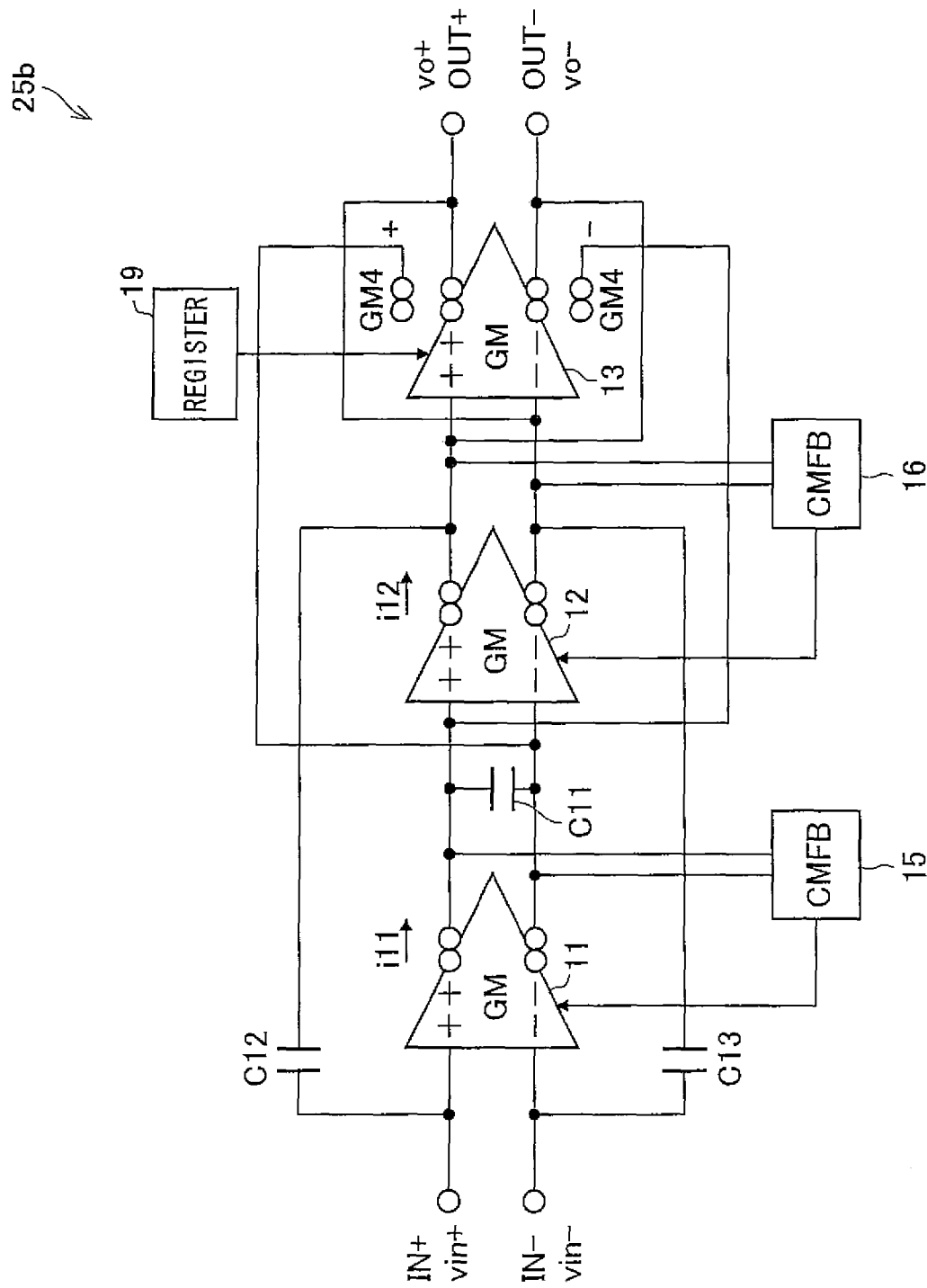
FIG. 8 is a diagram showing another configuration of the band-elimination filter circuit.

The following describes another embodiment of the present invention with reference to FIG. 6 to FIG. 8.

FIG. 6 shows a configuration of a band-elimination filter circuit (band-elimination circuit; hereinafter, BEF) 25 (first band-elimination filter circuit).

The BEF 25 is a full-differential band-elimination filter circuit including: transconductance amplifier circuits (hereinafter simply referred to as GMs) 11 to 14 (first transconductance amplifier to fourth transconductance amplifier) each for converting a differential input voltage into a differential output current; first and second common-mode feedback circuits (hereinafter, simply referred to as CMFB) 15 and 16 (first and second common-mode feedback circuits); and capacitors C11 to C13 (first to third capacitors). Hereafter, the GM11 to GM14 are sometimes referred to as GM, collectively.

A noninverting input terminal IN$^+$ of the BEF 25 is connected to a noninverting input section of the GM11. An inverting input terminal IN$^-$ of the BEF 25 is connected to an inverting input section of the GM11. A noninverting output section of the GM11 is connected to a noninverting input section of the GM12 and an inverting output section of the GM14. An inverting output section of the GM11 is connected to an inverting input section of the GM12 and a noninverting output section of the GM14. The noninverting output section and the inverting output section of the GM11 are connected to the capacitor C11.

A noninverting output section of the GM12 is connected to a noninverting input section of the GM13 and is connected to a point between an inverting output section of the GM13 and an inverting input section of the GM14. The inverting output section of the GM12 is connected to an inverting input section of the GM13, and is connected to a point between a noninverting output section of the GM13 and a noninverting input section of the GM14. The noninverting input section of the GM11 and the noninverting output section of the GM12 are connected to the capacitor C12. The inverting input section of the GM11 and the inverting output section of the GM12 are connected to the capacitor C13.

A noninverting output terminal OUT⁺ of the BEF 25 serves as the inverting output section of the GM13, and an inverting output terminal OUT⁻ of the BEF 25 serves as the noninverting output section of the GM13.

The noninverting output section and the inverting output section of the GM1 serve as input terminals of the CMFB 15. The CMFB 15 outputs a first control signal to the GM1 so that a D.C. voltage level of the differential output of the GM1 is at a predetermined level. The noninverting output section and the inverting output section of the GM2 serve as input terminals of the CMFB 16. The CMFB 16 outputs a second control signal to the GM2 so that a D.C. voltage level of the differential output of the GM2 is at a predetermined level.

The transfer function H(s) of the BEF 25 having the above-described configuration is expressed by the following Formula (24).

Further, the constants of the BEF 25 (natural angular frequency ω0, noise angular frequency con, Q-value) are expressed by the following Formulas (25) to (27).

$$H(s)=\{s2+((gm\ 11*gm\ 12)/(C11*(C12/2)))\}/\{s2+(gm\ 13/(C12/2))*s+((gm\ 12*gm\ 14)/(C11*(C12/2)))\} \quad (24)$$

$$ω0=((gm\ 12*gm\ 14)/(C11*(C12/2)))^{1/2}=gm/C \quad (25)$$

$$ωn=((gm\ 11*gm\ 12)/(C11*(C12/2)))^{1/2}=gm/C \quad (26)$$

$$Q=(((C12/2)/C11)*(gm\ 12*gm\ 14)/(gm\ 132))^{1/2}=gm/gm\ 13 \quad (27)$$

Where:
s is a complex number;
vin is an input voltage of the BEF 25, and is vin=(vin⁺)=−(vin⁻);
vin⁺ is a voltage input to the noninverting input terminal IN⁺ of the BEF 25;
vin⁻ is a voltage input to the inverting input terminal IN⁻ of the BEF 25;
vo is an output voltage of the BEF 25, and is vo=(vo⁺)=−(vo⁻);
vo⁺ is a voltage output from the noninverting output terminal OUT⁺ of the BEF 25;
vo⁻ is a voltage output from the inverting output terminal OUT⁻ of the BEF 25;
v1 is an output voltage of the GM11, and is v1=(v1⁺)=−(v1⁻);
v1⁺ is a voltage output from the noninverting output section of the v1⁺;
v1⁻ is a voltage output from the inverting output section of the v1⁻;
gm 11 is a transconductance of the GM11;
gm 11 is a transconductance of the GM11;
gm 12 is a transconductance of the GM12;
gm 13 is a transconductance of the GM13;
gm 14 is a transconductance of the GM14;
i1 is an output current of the GM11;
i2 is an output current of the GM12;
i3 is an output current of the GM13;
C11 is a capacitance value of the capacitor C11;
C12 is a capacitance value of each of the capacitors C12 and C13;
gm=gm 11=gm 12=gm 14
C=C11=C12/2

From the above Formulas (24) to (27), it is understood that the constants of the BEF 25 are adjusted by adjusting the gm 11, gm 12, gm 13, and gm 14. Particularly, by controlling only the gm 13, it is possible to adjust the Q-value while keeping the natural angular frequency ω0 and the noise angular frequency ωn constant. Further, for example, when gm 13=β*gm(0<β<1), Q=1/β. Thus, the Q-value is adjusted simply by adjusting the β.

FIG. 7 shows a BEF 25a which is provided with a configuration for adjusting the gm of the GM in the BEF 25.

As shown in the figure, the BEF 25a has registers 17 to 20 (adjusting sections) in addition to the configuration shown in FIG. 6. Each of the registers outputs to the GM an adjustment signal SW for adjusting the gm in response to an external signal thus adjusting gm. That way, the constants of the BEF 25a are adjusted.

The adjustment signal SW from the register 17 adjusts gm 11 of the GM11, thereby adjusting the noise natural angular frequency ω0. The adjustment signal SW from the register 18 adjusts gm 12 of the GM12, thereby adjusting the natural angular frequency ω0, noise natural angular frequency ωn, and Q-value. The adjustment signal SW from the register 19 adjusts gm 13 of the GM13, thereby adjusting the Q-value. The adjustment signal SW from the register 20 adjusts gm 14 of the GM14, thereby adjusting the natural angular frequency ω0 and Q-value. (See Formulas (25) to (27))

FIG. 8 shows a BEF 25b (second bandpass filter circuit) which is an alternative form of the BEF 25. In the BEF 25b, the GM13 and GM14 are realized with a single transconductance amplifier circuit, and the GM13 has first and second output sections.

A noninverting input terminal IN⁺ of the BEF 25b is connected to a noninverting input section of the GM11. An inverting input terminal IN⁻ of the BEF 25b is connected to the inverting input section of the GM11. A noninverting output section of the GM11 is connected to a noninverting input section of the GM12 and an inverting output section in a second output section of the GM13. An inverting output section of the GM11 is connected to an inverting input section of the GM12 and a noninverting output section in the second output section of the GM13. The noninverting output section and the inverting output section of the GM11 are connected to the capacitor C11.

A noninverting output section of the GM12 is connected to the noninverting input section of the GM13, and an inverting output section in the first output section of the GM13. The inverting output section of the GM12 is connected to the inverting input section of the GM13, and the noninverting output section in the first output section of the GM13. The noninverting input section of the GM11 and the noninverting output section of the GM12 are connected to the capacitor C12, and the inverting input section of the GM11 and the inverting output section of the GM12 are connected to the capacitor C13. The noninverting output terminal OUT⁺ of the BEF 25b serves as the noninverting output section of the GM13, and the inverting output terminal OUT⁻ of the BEF 25b serves as the inverting output section of the GM13.

The noninverting output section and the inverting output section of the GM11 serve as input terminals of the CMFB 15. The CMFB 15 outputs a first control signal to the GM11 so that a D.C. voltage level of the differential output of the GM11 is at a predetermined level. The noninverting output section and the inverting output section of the GM12 serve as input terminals of the CMFB 16. The CMFB 16 outputs a second control signal to the GM12 so that a D.C. voltage level of the differential output of the GM12 is at a predetermined level.

With the above-described configuration, the BEF 25*b* is able to obtain a transfer function similar to that of the BEF 25. Further, since a full-differential configuration is adopted, constants such as the Q-value can be adjusted. This allows improvement in the characteristic of removing power-source noise. Further, in the BEF 25*b*, the GM13 and the GM 14 are realized with a single transconductance amplifier circuit. This simplifies the circuit configuration, and therefore cutting back of the cost is possible. Further, in a case of providing only the register 19 (for controlling the second output section of the GM13) as shown in the figure, the circuit configuration is further simplified, and further cutting back of the cost is possible. However, it is needless to mention that the configurations shown in FIG. 7 and FIG. 8 are mere examples.

The specific configurations of the BEF, GM and CMFB, and the method of adjusting the gm or the like are the same as those described in the foregoing embodiment 1. Therefore, no explanation is provided here.

Here, when the gm of the BEF 25*b* is adjusted through the gm adjusting method of embodiment 1, $$Q = gm/gm \ 3$$

$$= \left\{ \frac{2*(Ib/Ia)}{(Re + 2*((n*Vt)/Ia))} \right\} / \left\{ \frac{2*(Iba/Ia)}{(Re + 2*((n*Vt)/Ia))} \right\}$$

$$= 2^m (28).$$

Through this adjustment of the gm, the Q-value can be adjusted so as to fall within a range from 16 to 1.

By adopting the above-described full-differential band-elimination filter circuit as the BEF, it is possible to improve the power-source noise canceling characteristic.

With the full-differential configuration, both ± outputs of each of the GM12 and GM14 have an identical output impedance Ro. Therefore, the differential outputs vo of the BEF at the both ± outputs are:

$$vo = Ro/(1/(s*C12) + Ro)*vin \ (29),\text{ and are in-phase.}$$

Further, the output current i11 of the GM11 is $$i11 = gm \ 11*(vin^+ - vin^-) = 0 \tag{30}.$$

Therefore, it is possible to cancel inphase components. As a result, even if such a power source noise affects the BPF, the noise can be canceled. This allows improvement in the power-source noise canceling characteristic.

As mentioned above, the BEF of the present invention allows adjustment of its constant such as the Q-value or the like by means of controlling the gm. Further, with the BEF, the power-source noise canceling characteristic is improved.

Embodiment 3

Another embodiment of the present invention is described below with reference to FIG. 9 to FIG. 16.

As mentioned above, a BPF of the present invention allows adjustment of its constant such as the Q-value and the gain H by means of adjusting the gm. In the present embodiment, such a BPF of the present invention is adopted to an infrared remote control receiver (infrared signal processing circuit) (transmission rate 1 kbps or less, spatial transmission distance 10 m or longer) which is capable of (i) reducing noise stemming from an inverter fluorescent light and (ii) reducing distortion in the waveform of an output from the BPF.

Figure 9:
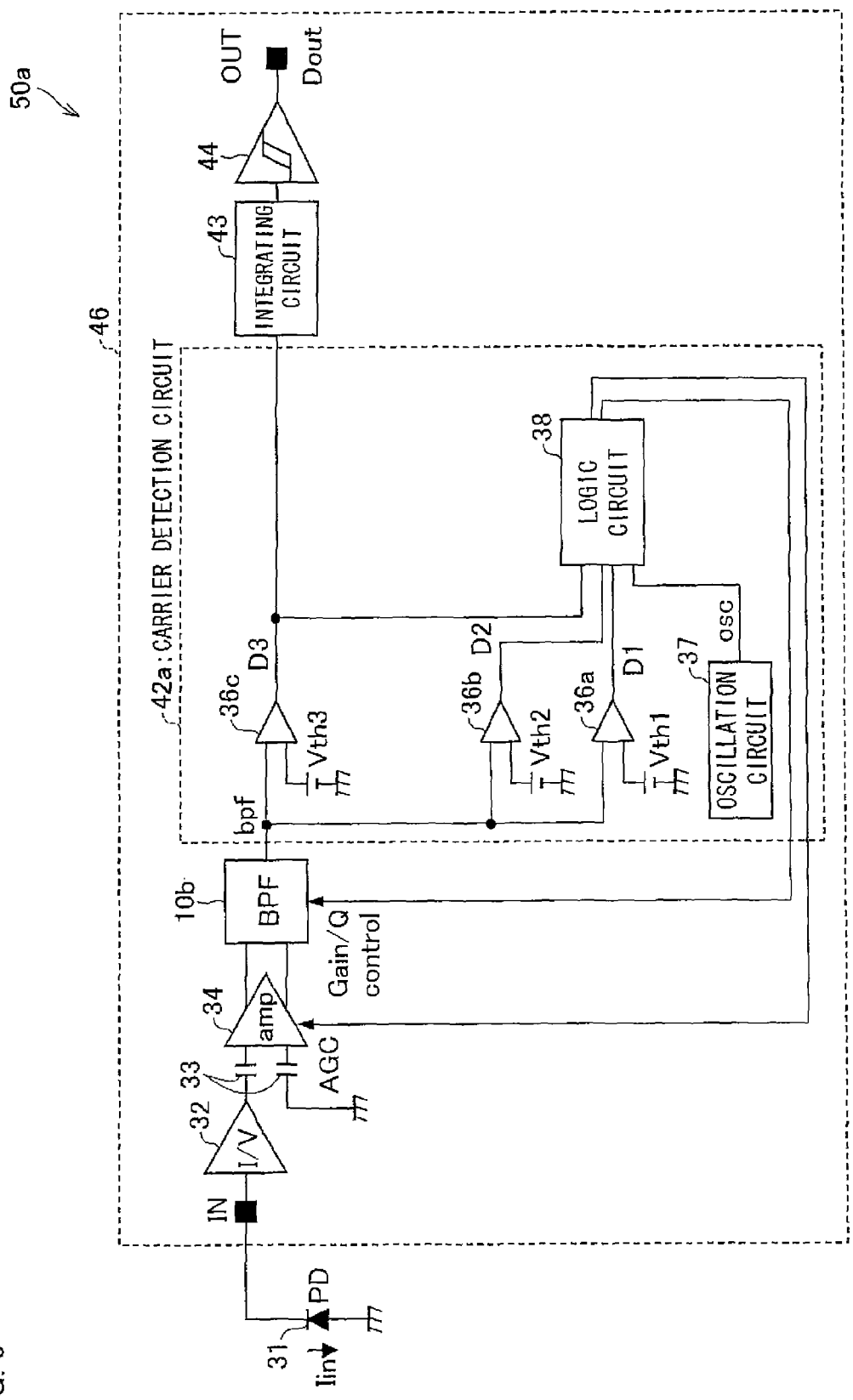
FIG. 9 is a diagram showing a configuration of an infrared remote control receiver according to the other embodiment.

As an example of such an infrared remote control receiver, FIG. 9 shows a configuration of an infrared remote control receiver 50*a*.

An infrared remote control receiver 50*a* includes a photodiode chip 31 (photo-acceptance element) and a reception chip 46. The reception chip 46 includes: a current-to-voltage-conversion circuit 32; a capacitor 33; an amplifier (amplifying circuit) 34; the BPF 10*b* (as an example); a carrier detection circuit 42*a*; an integrating circuit 43; and a hysteresis comparator 44. In the figure, an input terminal IN serves as an input terminal of the reception chip 46, and an output terminal OUT serves as an output terminal of the reception chip 46.

In the infrared remote control receiver 50*a*, the photodiode chip 31 converts a remote control transmission signal (infrared signal) received from an infrared remote control transmitter (not shown) into a current signal Iin. This current signal Iin is then converted into a voltage signal by the current-to-voltage-conversion circuit 32, and the voltage signal is amplified by the amplifier 34. Then, from the voltage signal amplified, the BPF 10*b* extracts a carrier frequency component, and the carrier detection circuit 42*a* detects a carrier in the carrier frequency component extracted. A period during which the carrier exists is integrated by the integrating circuit 43, and whether or not the carrier exits is judged in the hysteresis comparator 44. The result of the judgment is then output in the form of digital output Dout. This digital output Dout is sent to a microcomputer or the like which controls an electronic device.

The carrier detection circuit 42*a* includes: comparators 36*a* (first comparing circuit), 36*b* (third comparing circuit), and 36*c* (second comparing circuit); an oscillation circuit 37; and a logic circuit 38 which performs a logical operation on the basis of respective outputs of the comparators 36*a* to 36*c*. In addition to detecting of a carrier, the carrier detection circuit 42*a* controls the gain of the amplifier 34 and the gain and Q-value of the BPF 10*b*.

An output signal bpf from the BPF 10*b* is input to one of input terminals of each of the comparators 36*a* to 36*c*. To another input terminal of the comparator 36*a*, a threshold voltage Vth1 (first threshold voltage) is input. To another input terminal of the comparator 36*b*, a threshold voltage Vth2 (third threshold voltage) is input. To another input terminal of the comparator 36*c*, a threshold voltage Vth3 (second threshold voltage) is input. The threshold voltage Vth1 is a noise detection level. The threshold voltage Vth2 is a peak detection level for judging the level of the output signal bpf from the BPF 10*b*. The threshold voltage Vth3 is a first signal detection level (a first carrier detection level). These threshold voltages Vth1 to Vth3 are such that: Vth1<Vth3<Vth2.

The comparator 36*a* compares the output signal bpf of the BPF 10*b* with the threshold voltage Vth1, and outputs an output signal D1 if the level of the output signal bpf of the BPF 10*b* surpasses the level of the threshold voltage Vth1. Similarly, the comparator 36*b* compares the output signal bpf of the BPF 10*b* with the threshold voltage Vth2, and outputs an output signal D2 if the level of the output signal bpf of the BPF lob surpasses the level of the threshold voltage Vth2. The comparator 36*c* compares the output signal bpf of the BPF 10*b* with the threshold voltage Vth3, and outputs an output signal D3 if the level of the output signal bpf of the BPF 10*b* surpasses the level of the threshold voltage Vth3.

The oscillation circuit 37 oscillates at the same frequency as the center frequency of the BPF 10*b*, for example.

Figure 10:
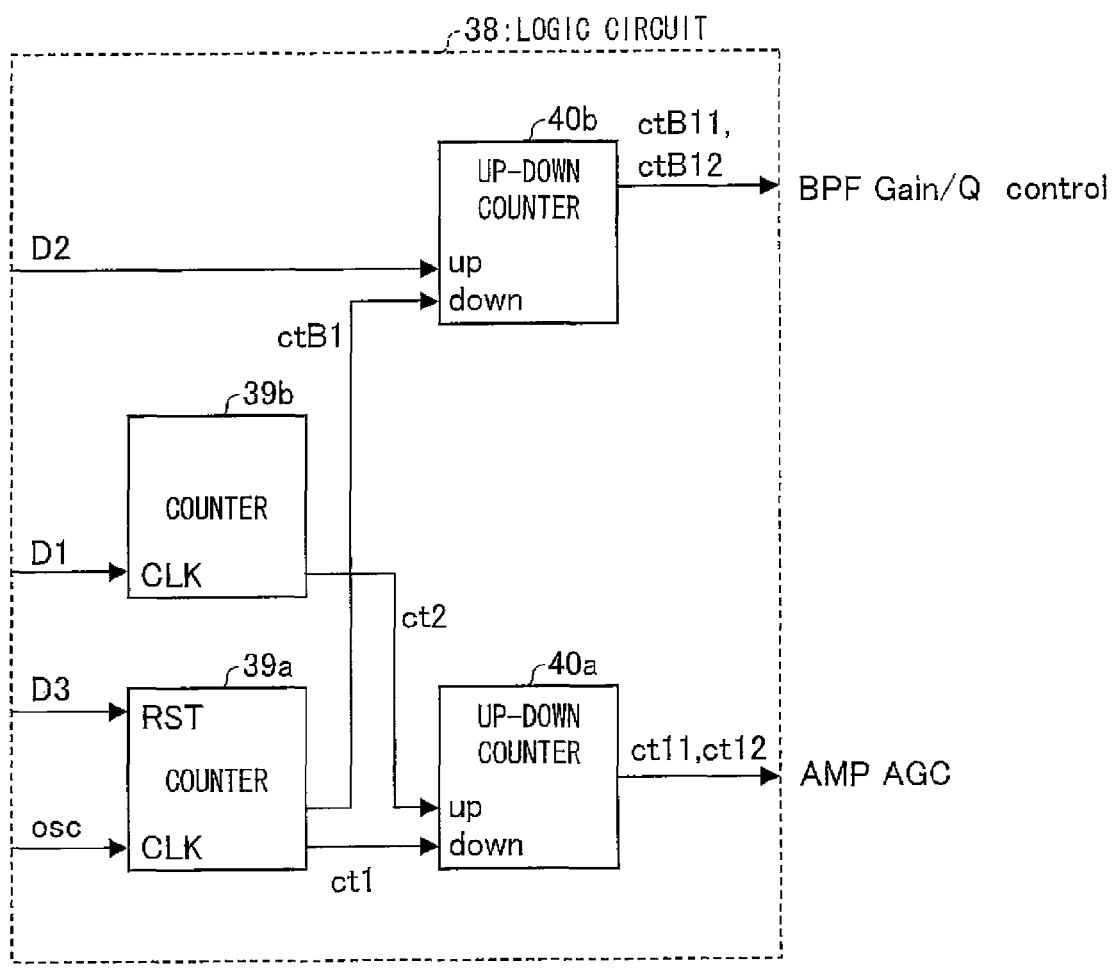
FIG. 10 is a block diagram showing a logic circuit in the infrared remote control receiver.

FIG. 10 shows an exemplary configuration of the logic circuit 38.

The logic circuit 38 includes: counters 39a (first counter) and 9b (second counter); and up-down counters 40 (first up-down counter) and 40b (second up-down counter).

The counter 39a performs counting operation in response to an output signal (clock signal) osc from the oscillation circuit 37. When a predetermined number of pulses (e.g. 15 bits, $2^{15}$=32768 pulses) are counted, the counter 39a outputs an amplifier control signal ct1 (first amplifying circuit control signal) for increasing the gain to the up-down counter 40a. The counter 39a also outputs, when a predetermined number of pulses (e.g. 10 bits, $2^{10}$=1024 pulses) are counted, a BPF control signal ctB1 for increasing the gain and Q-value to the up-down counter 40b. Furthermore, to a reset terminal RST of the counter 39a, the output D3 from the comparator 36c is input.

The time constant of the amplifier control signal ct1, for setting the time constant for controlling the amplifier, is 300 msec or more. Further, the time constant of the BPF control signal ctB1, for setting the time constant for controlling the BPF, is 300 msec or less.

The counter 39b performs counting operation in response to the output signal D1 from the comparator 36a. When a predetermined number of pulses (e.g. 14 bits, $2^{14}$=16384 pulses) are counted, the counter 39b outputs to the up-down counter 40a an amplifier control signal ct2 (second amplifying circuit control signal) for reducing the gain. The time constant of the amplifier control signal ct2, for setting the time constant for controlling the amplifier, is 300 msec or more. Here, the respective numbers of outputs of the amplifier control signals ct1 and ct2 have the following relation: the number of outputs of the amplifier control signal ct2> the number of outputs of the amplifier control signal ct1.

The up-down counter 40a performs counting operation in response to an amplifier control signal ct1 output from the counter 39a, and outputs an amplifier control signal ct11 (first control signal) to the amplifier 34 to increase the gain of the amplifier 34. Further, the up-down counter 40a performs counting operation in response to the amplifier control signal ct2 output from counter 39b, and outputs an amplifier control signal ct12 (second control signal) to the amplifier 34 to reduce the gain of the amplifier 34.

The up-down counter 40b performs counting operation in response to the BPF control signal ctB1 output from the counter 39a, and outputs a BPF control signal ctB11 (third control signal) to the BPF 10b to increase the gain and Q-value of the BPF 10b. Further, the up-down counter 40b receives an output signal D2 from the comparator 36b, and performs counting operation in response to the output signal D2. Then, the up-down counter 40b outputs a BPF control signal ctB12 (fourth control signal) to the BPF 10b to reduce the gain and Q-value of the BPF 10b.

The BPF control signals ctB11 and ctB12 output from the up-down counter 40b are input to a register 8 of the BPF 10b. Then, an adjustment signal SW as shown in Table 1 is output from the register 8, and thus, the gain and the Q-value of the BPF 10b are controlled.

As described, the carrier detection circuit 42a can be realized in a form of digital circuit. This allows downsizing of the chip size, consequently allowing reduction of the cost.

Figure 11:
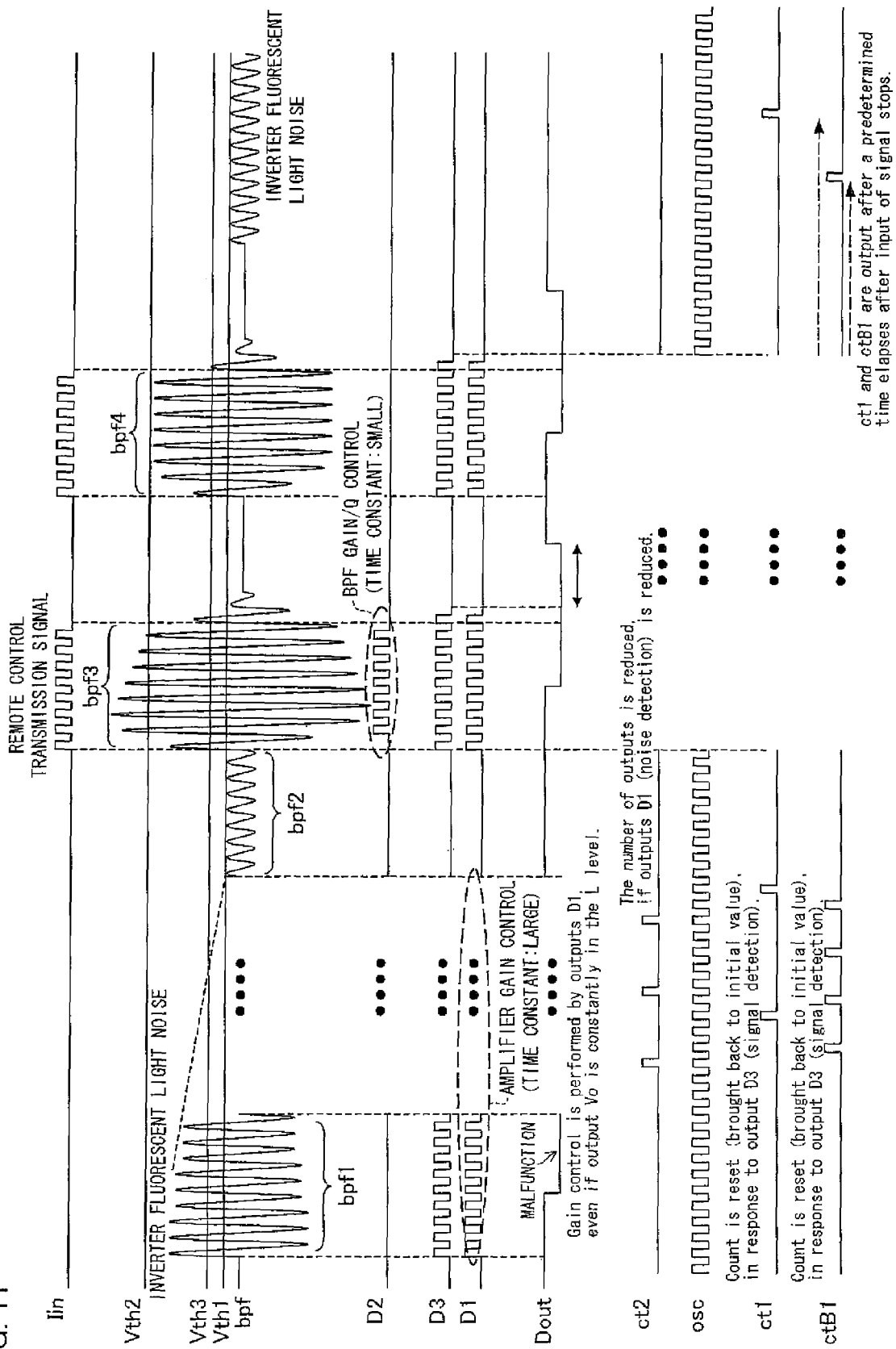
FIG. 11 is a diagram showing an operation of each circuit in the infrared remote control receiver.
Figure 12:
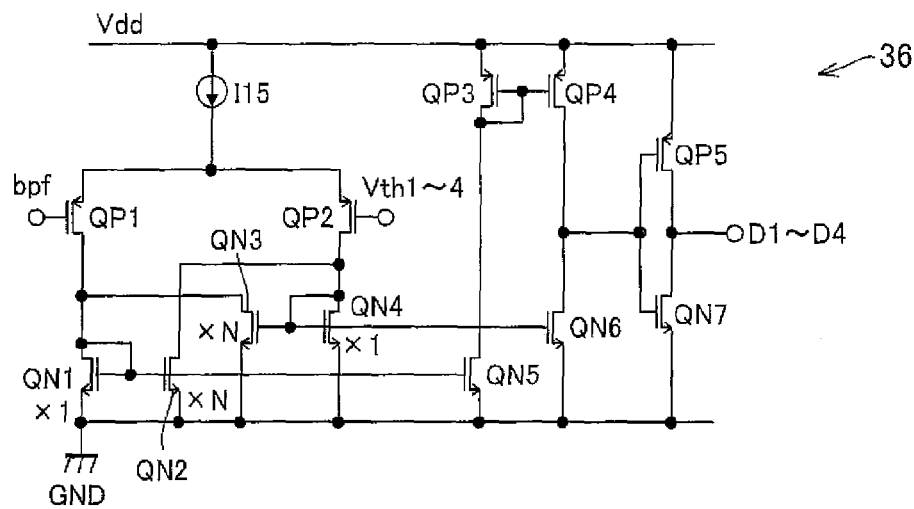
FIG. 12(a) is a circuit diagram showing a specific configuration of a comparator in the infrared remote control receiver.
FIG. 12(b) is a diagram showing an operation of the comparator.
FIG. 12(c) is a diagram showing an operation of the comparator.
Figure 12:
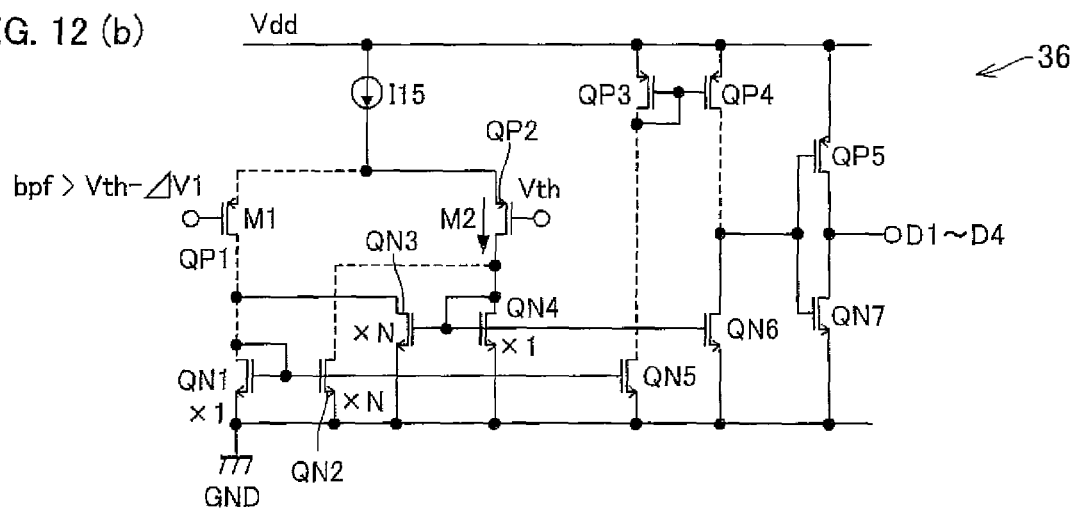
Figure 12:
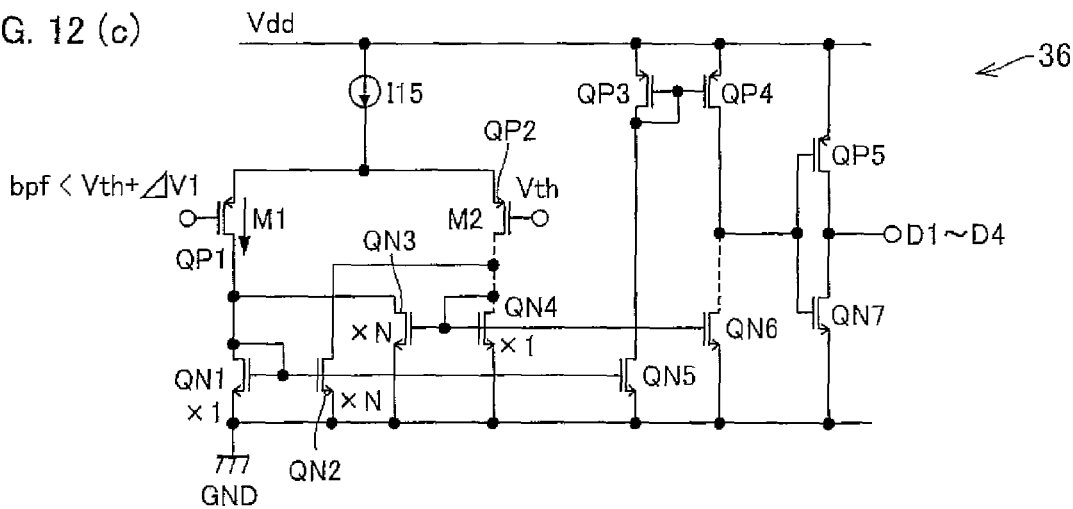
Figure 13:
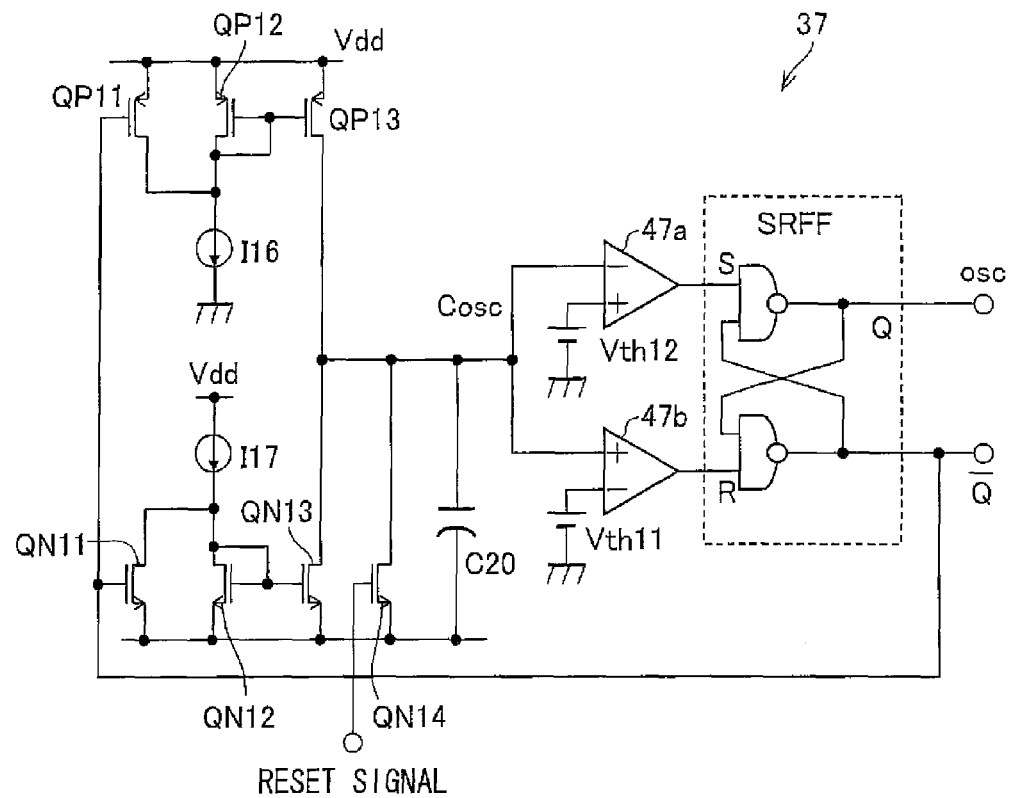
FIG. 13(a) is a circuit diagram showing a specific configuration of an oscillation circuit in the infrared remote control receiver.
FIG. 13(b) is a diagram showing an operation of the oscillation circuit.
Figure 13:
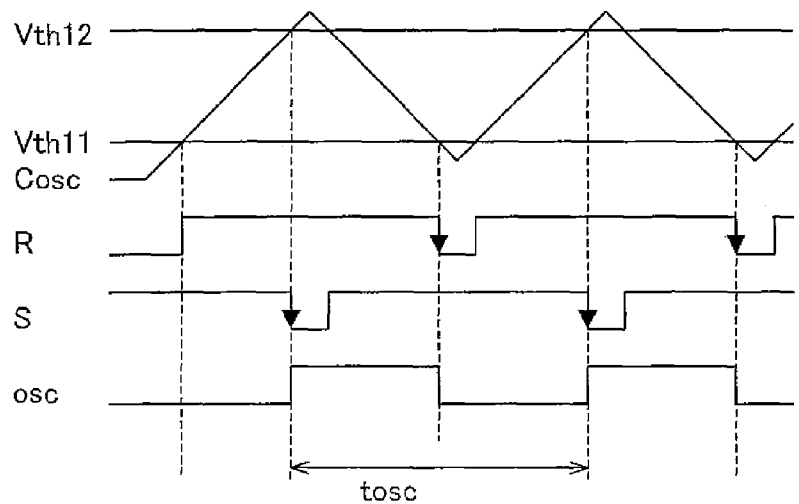

Next described with reference to FIG. 11 is the operation of the infrared remote control receiver 50a. FIG. 11 shows an operation waveform of each circuit in the infrared remote control receiver 50a. In FIG. 11, noise from a fluorescent light enters before a remote control transmission signal enters.

First, when the fluorescent light noise enters the infrared remote control receiver 50a, the current-to-voltage-conversion circuit 32, amplifier 34, and BPF 10b respectively perform processes supposed to be performed, and an output signal bpf (bpf1 in the figure) from the BPF 10b is input to each of the comparators 36a to 36c in the carrier detection circuit 42a. Thus, output signals D1 and D3 are respectively output from the comparators 36a and 36c, as shown in the figure.

Since the output signal D3 from the comparator 36c resets the counter 39a, the counting operation of the counter 39a is stopped. Meanwhile, the output signal D1 from the comparator 36a is input to the counter 39b, and the counter 39b outputs the amplifier control signal ct2 in response to the input. The amplifier control signal ct2 is then input to the up-down counter 40a. In response to this, the up-down counter 40a outputs the amplifier control signal ct12 to the amplifier 34, so as to cause the amplifier to reduce its gain.

Through this gain control of the amplifier 34, the fluorescent light noise is attenuated. When the comparator 36c stops outputting the output signal D3, the counter 39a starts its counting operation, and the BPF control signal ctB1 is output to the up-down counter 40b. In response to this, the up-down counter 40b outputs the BPF control signal ctB11 to the BPF 10b, so as to causes the BPF 10b to raise its gain and Q-value.

Subsequently, the amplifier control signal ct1 is output to the up-down counter 40a. In response to this, the up-down counter 40a outputs the amplifier control signal ct1 to the amplifier 34, so as to cause the amplifier 34 to raise its gain. Through the above-mentioned controls of the amplifier 34 and BPF 10b, the fluorescent light noise is attenuated to a level not more than the threshold voltage Vth1 of the comparator 36a (See Signal bpf2 in the figure). In other words, the noise is attenuated to the level which causes no malfunction. Thus, it is possible to restrain malfunctions attributed to the fluorescent light noise.

Next, when a remote control transmission signal is input to the infrared remote control receiver 50a, the current-to-voltage-conversion circuit 32, amplifier 34, and the BPF 10b perform processes supposed to be performed, and an output signal bpf (Signal bpf3 in the figure) from the BPF 10b is input to each of the comparators 36a to 6c of in the carrier detection circuit 42a. Thus, output signals D1 to D3 are respectively output from the comparators 36a to 36c, as shown in the figure. Then, the output signal D1 and the output signal osc of the oscillation circuit c37 causes the above mentioned control of the amplifier 34.

Here, in the control caused by the output signal D1 from the comparator 36a and the output signal osc from the oscillation circuit 37, a sufficient time constants of 300 msec or more is ensured for both of the amplifier control signals ct1 and ct2. Therefore, rapid variation of the gain is avoided, and a stable reception sensitivity is achieved at a time of inputting a remote control transmission signal.

Further, since the counter 39a is reset while the output signal D3 of the comparator 36c is output, it is only the control for reducing the gain of the amplifier 34 which is performed, and not the control for increasing the gain of the amplifier 34 or the control for increasing the gain and the Q-value of BPF 10b which are caused by the output signal osc of the oscillation circuit 37. Thus, the amount of variation of the gain is made small, and a stable reception sensitivity is achieved at a time of inputting a remote control transmission signal. Furthermore, since it is only the control for reducing the gain of the amplifier 34 which is performed, malfunctions attributed to fluorescent light noise can be further restrained.

While the above-mentioned control is performed, the BPF 10b is controlled by the output signal D2 of the comparator 36b. When the output signal D2 of the comparator 36b is output, the gain and Q-value of the BPF 10b are controlled, judging that (i) close-distance communication such as the one described in "BACKGROUND ART" is performed, and (ii) distortion in the waveform of the output signal D3 of the comparator 36c will occur.

Specifically, when the output signal D2 of the comparator 36b is input to the up-down counter 40b, the up-down counter 40b outputs the BPF control signal ctB12 to the BPF 10b to cause the BPF 10b to reduce the gain and Q-value thereof. Through this, the output signal bpf of the BPF 10b is attenuated to a level not higher than the threshold voltage Vth2 of the comparator 36b (See bpf4 in the figure), and the level of the output signal bpf is optimized. Thus, the problem of not being able to receive signals will not occur. Further, when the output signal D2 of the comparator 36b is not output, the control of the BPF 10b is not performed. Therefore, a high Q-value and a high gain is maintained. This control is done quickly, since the time constant set in the up-down counter 40b is small.

Here, since the Q-value of the BPF 10b is increased through the control caused by the output signal D1 of the comparator 36a and the output signal osc of the oscillation circuit 37, problems such as the following may occur: deterioration in the stability of the BPF 10b; and/or deterioration of the reception sensitivity due to increase in waveform distortion of the output signal bpf of the BPF lob. However, since the Q-value of the BPF 10b is reduced through the above-described control of the BPF 10b, such problems will not occur.

Next, when the input of the remote control transmission signal stops, only the counter 39a operates and outputs the gain control signal ctB1 to the up-down counter 40b. Then, the BPF control signal ctB 11 causes the BPF 10b to raise its gain and Q-value. After that, the gain control signal ct1 is output to the up-down counter 40a, and the gain control signal ct 11 causes the amplifier 34 to raise its gain.

Here, the above description deals with the case where the remote control transmission signal enters after fluorescent light noise is attenuated. However, it is possible that the remote control transmission signal enters before fluorescent light noise is attenuated. This however is not a particular concern, as rapid control of the gain and the Q-value of the BPF 10b are caused by the output signal D2 of the comparator 36b.

FIG. 12(a) shows a specific example of configuration of the comparator 36, and FIG. 12(b) and FIG. 12(c) show an operation of the comparator 36. In the following, a MOS transistor QP refers to a P-channel MOS transistor, and a MOS transistor QN refers to an N-channel MOS transistor. The same goes for a comparator 36d described hereinbelow in Embodiment 4.

The comparator 36 is a hysteresis comparator as shown in FIG. 12(a). First described is how each element is connected to the others. The respective sources of the MOS transistors QP1 and QP2 are connected to each other, and are connected to a power source Vdd via a current source I15. The gate of a MOS transistor QP1 serves as one of the input terminals of the comparator 36, and the output signal bpf of the BPF 10b is input to the gate of the MOS transistor QP1. The gate of a MOS transistor QP2 serves as another one of the input terminals of the comparator 36, and a threshold voltage Vth (collective name for threshold voltages Vth1 to Vth4) is input to the gate of the MOS transistor QP2.

The drain of the MOS transistor QP1 is connected to the drain of a MOS transistor QN1. The MOS transistor QN1 and a MOS transistor QN2 form a current mirror circuit. The drain of the MOS transistor QP2 is connected to the drain of a MOS transistor QN4. The MOS transistor QN4 and a MOS transistor QN3 form a current mirror circuit. Furthermore, the drain of the MOS transistor QP1 is connected to the drain of the MOS transistor QN3, and the drain of the MOS transistor QP2 is connected to the drain of the MOS transistor QN2.

The gate of the MOS transistor QN1 is connected to the gate of a MOS transistor QN5, and the gate of the MOS transistor QN3 is connected to the gate of a MOS transistor QN6. The drain of the MOS transistor QN5 is connected to the drain of a MOS transistor QP3. The MOS transistors QP3 and a MOS transistor QP4 form a current mirror circuit. The drain of the MOS transistor QN6 is connected to the drain of the MOS transistor QP4.

Further, the drain of the MOS transistor QN6 is connected to an input terminal of a CMOS inverter formed by a MOS transistor QP5 and a MOS transistor QN7. An output terminal of this CMOS inverter serves as an output terminal of the comparator 36. The respective sources of the MOS transistors QP3 and QP4 are connected to the power source Vdd, and the respective sources of the MOS transistors QN1 to QN7 are connected to a GND terminal.

Next described with reference to FIG. 12(b) and FIG. 12(c) is an operation of the comparator 36. FIG. 12(b) shows an operation through which an output signal bpf of the BPF 10b transits from a large value to a small value. FIG. 12(c) shows an operation through which an output signal bpf of the BPF 10b transits from a small value to a large value. Note that the broken lines in FIG. 12(b) and FIG. 12(c) indicates that no current is flowing.

First, the operation of FIG. 12(b) is explained. In FIG. 12(b), the value of the output signal bpf of BPF 10b is large, and therefore the output signal from the comparator 36 is at the H level (the output signal D1 and D4 is output).

When the output signal bpf>Vth−ΔV1, no current flows in the MOS transistor QP1, and therefore the MOS transistor QP2 enters the overdrive state. Since, no drain current flows in the MOS transistor QN1, no drain current flows in the MOS transistor QN2 either. Accordingly, the MOS transistor QN4 turns on, and so does the MOS transistor QN3. However, since no drain current flows in the MOS transistor QN3, the drain-source voltage Vds of the MOS transistor QN3 is 0V. Therefore, the respective gate potentials of the MOS transistors QN1 and QN2 is GND. Thus, the MOS transistors QN1 and QN2 turn off. At this point, the MOS transistor QN6 turns on, and so does the MOS transistor QP5. Accordingly, the output signal of the comparator 36 is at the H level.

The level of the output signal bpf of the BPF 10b is reduced so that: the output signal bpf=Vth−ΔV1. At this point, the MOS transistor QP2 exits the overdrive state, and the drain current of the MOS transistor QP2 can be reduced. When a drain current starts to flow in each of the MOS transistor QP1 and the MOS transistor QP2, the drain current flowing in the MOS transistor QP1 flows into the MOS transistor QN3. Thus, the drain current flowing in the MOS transistor QP1 is N times as much as that flows in the MOS transistor QP2. Thus, the drain current M1 of the MOS transistor QP1={N/(N+1)}×I15, and the drain current M2 of the MOS transistor QP2={1/(N+1)}×I15, and the differential pair is balanced.

Further, at this point, a difference in the gate-source voltage Vgs of the MOS transistor QP1 and the MOS transistor QP2 is ΔV. Here, it is supposed that: respective W/L ratios (where W is the gate width, and L is the gate length) of the drain currents M1 and M2 are equal to each other; Vgs1 is the gate-source voltage of the MOS transistor QP1; and Vgs2 is the gate-source voltage of the MOS transistor QP2. Since respective source potentials of the MOS transistor QP1 and the MOS transistor QP2 are equal to each other, $$Vth+Vgs2=Vth-\Delta V1+Vgs1.$$

Thus:

$$\Delta V1=Vgs1-Vgs2=2^{1/2} \times Vov \times \{(N/(N+1))^{1/2}-(1/(N+1))^{1/2}\} \quad (31).$$

However, $Vov=(I15/(\mu 0 \times Cox \times W/L))^{1/2}$.

where: $\mu 0$ is the mobility of a carrier; Cox is the capacity of the gate insulative film; and Vov is an overdrive voltage of the MOS transistors QP1 and QP2 for causing flows of the drain currents M1 and M2, in a case of not having the hysteresis (N=1).

Next, when the level of the output signal bpf of the BPF 10b is further reduced so that: the output signal bpf<Vth−ΔV1, the drain current of the MOS transistor QP1 increases, and therefore the current of the MOS transistor QN3 increases as well. However, when the drain current of the MOS transistor QP1 increases, the drain current of the MOS transistor QP2 is decreased. As such, the current of the MOS transistor QN3 is not able to increase. Accordingly, the drain current of the MOS transistor QP1 rapidly charges the gate of the MOS transistor QN1, thereby turning on the MOS transistor QN1. Thus, the drain-source voltage Vds of the MOS transistor QN3 is increased. Further, the MOS transistor QN2 is also turned on.

However, since the MOS transistor QN2 is designed so as to achieve a flow of current which is N times as much as the current flowing in the MOS transistor QN1, the current of the MOS transistor QP2, which is supposed to be increased, is reduced. For this reason, the MOS transistor QN2 acquires current from the gates of the MOS transistor QN4, thereby causing the gate potentials of the MOS transistors QN3 and QN4 to fall. Thus, the MOS transistors QN3 and QN4 are turned off. However, since there is a limit to the amount of the current the MOS transistor QN2 is able to acquire, the drain current stops flowing in the MOS transistor QN2 when the amount reaches the limit, and the drain-source voltage Vds of the MOS transistor QN2 changes to 0V. As a result, the respective gate potentials of the MOS transistors QN3 and QN4 are GND, and no drain current flows in the MOS transistor QP2.

As described, the balance is instable while: the output signal bpf=Vth−ΔV1. When: the output signal bpf<Vth−ΔV1, the distribution of current in the circuit is reversed, and the output signal of the comparator 36 switches to an L level.

FIG. 12(c) shows a case where the level of the output signal bpf of the BPF 10b rises, while the output signal level of the comparator 36 is in L level as in FIG. 12(b). In the figure, the output signal level of the comparator 36 is in L level.

In FIG. 12(b), the source potentials of the MOS transistors QP1 and QP2 are higher after the state of output signal bpf of the BPF 10b has transited from output signal bpf=Vth−ΔV1 to output signal bpf<Vth−ΔV1, as compared with the source potentials at the moment of transition. This is because the state transition is caused by a positive feedback, and the MOS transistor QP1 enters the overdrive state if the output signal bpf of the BPF 10b is less than Vth−ΔV even by a slightest amount. Accordingly, when the level of the output signal bpf from the BPF 10b rises while the output signal from the comparator 36 is at the L level as in FIG. 12(c), the drain current of the MOS transistor QP1 does not decrease unless the output signal bpf rises up to Vth+DV2 which is larger than Vth−ΔV1. As a result, the drain current does not flow in the MOS transistor QP2. Thus, while: the output signal bpf<Vth+ ΔV2, the drain current flows in the MOS transistor QP1 but not in the MOS transistor QP2. Therefore, the current distribution is the same as: the output signal bpf<Vth−ΔV1. Accordingly, the output signal of the comparator 36 is at the L level.

When the level of the output signal bpf rises to Vth+ΔV2, the drain current flows in both of the MOS transistors QP1 and QP2.

At this point, the drain current M1 of the MOS transistor QP1={1/(N+1)}×I15, and the drain current M2 of the MOS transistor QP2={N/(N+1)}×I15. Thus, the differential pair is balanced.

At this point, Vth+Vgs2=Vth+ΔV2+Vgs1.
Thus, $$\Delta V2=Vgs2-Vgs1=2^{1/2} \times Vov \times \{(N/(N+1))^{1/2}-(1/(N+1))^{1/2}\} \quad (32)$$

Accordingly, based on the Formulas (31) and (32), $$\Delta V1=\Delta V2=\Delta V,$$

and Vth−ΔV1 and Vth+ΔV2 are symmetrical to each other in relation to Vth.

Next, when the level of the output signal bpf of the BPF 10b rises so that output signal bpf>Vth+ΔV2, the current distribution is the same as that in a case of the output signal bpf>Vth−ΔV1. Therefore, the level of the output signal from the comparator 36 is at the H level. At this point, due to an effect from the positive feedbacking, the drain current stops flowing in the MOS transistor QP1, and the MOS transistor QP2 enters the overdrive state. If the level of the output signal bpf of the BPF 10b is reduced during this state, the change explained with reference to FIG. 12(b) occurs.

By configuring the comparator 36 as the above-described hysteresis comparator, the respective pulse widths of the outputs D1 to D3 increase, and the respective counting operations of the counters 39a and 39b are triggered without fail, even if the level of the output signal bpf of the BPF 10b is nearby the threshold voltage Vth.

FIG. 13(a) shows an exemplary configuration of the oscillation circuit 37, and FIG. 13(b) shows its operation waveform. Note that a cycle tosc in the figure is the cycle of the output signal osc from the oscillation circuit. First, connections of elements in the oscillation circuit 37 are described.

The respective sources of a MOS transistor QP11, a MOS transistor QP12, and a MOS transistor QP13 are connected to the power source Vdd. The drain of the MOS transistor QP11 is connected to the drain of a MOS transistor QP12. The MOS transistor QP12 and the MOS transistor QP13 form a current mirror circuit. The drains of the MOS transistors QP11 and QP12 are connected to a GND terminal via a current source I16. The respective sources of a MOS transistor QN11, a MOS transistor QN12, and a MOS transistor QN13 are connected to a GND terminal. The drain of the MOS transistor QN11 is connected to the drain of the MOS transistor QN12. The MOS transistor QN12 and the MOS transistor QN13 form a current mirror circuit. The drains of the MOS transistors QN11 and QN12 are connected to the power source Vdd via a current source I17.

The drain of the MOS transistor QP13 and the drain of the MOS transistor QN13 are connected to each other. Between (i) a connection point via which the drains are connected and (ii) the GND terminal, a MOS transistor QN14 and a capacitor C20 are connected in parallel. Further, to this connection point, an inverting input terminal of the comparator 47a and an noninverting input terminal of the comparator 47b are connected. A threshold voltage Vth12 is input to the noninverting input terminal of the comparator 47a, and a threshold voltage Vth11 is input to the inverting input terminal of the comparator 47b. The threshold voltage Vth11 and the threshold voltage Vth12 have the following relation: the threshold voltage Vth11<the threshold voltage Vth12.

An output terminal of the comparator 47a is connected to a set terminal S of a set/reset flip-flop (Hereinafter, simply referred to as SRFF). An output terminal of the comparator 47b is connected to a reset terminal R of the SRFF. An output terminal Q bar of the SRFF is connected to the respective gates of the MOS transistors QP1 and the MOS transistor QN11. To the gate of the MOS transistor QN14, a reset signal for resetting the oscillation circuit 37 is input from the outside. An output terminal of the oscillation circuit 37 is an output terminal Q of the SRFF.

Next, an operation of the oscillation circuit 37 is described, with reference to FIG. 13(b).

First, it is supposed that a signal at the L level is output from the output terminal Q of the SRFF. This causes an output current from the current source I16 to flow into the capacitor C20 via the current mirror circuit including the MOS transistors QP12 and QP13, thereby charging the capacitor C20. Here, at this point, an output current from the current source I17 flows into the GND via the MOS transistor QN11 which is in the ON state. Therefore, the current from the current source I17 does not contribute to the charging of the capacitor C20.

Through the charging, a potential Cosc of the capacitor C20 rises gradually. When the potential Cosc surpasses the threshold voltage Vth12 of the comparator 47a, the level of the output signal from the comparator 47a switches to the L level. Needless to say that the potential Cosc at this point has surpassed the threshold voltage Vth11. As such, the level of the output signal from the comparator 47b is at the H level. Therefore, a signal at the H level is output from the output terminal of the SRFF.

Next, in response to the output of an H level signal from the output terminal Q of the SRFF, the MOS transistor QN11 turns off, and the MOS transistors QN 12 and QN13 are turned on by the output current from the current source I17. Hence, the potential Cosc of the capacitor C20 is discharged. As a result, the potential Cosc is gradually decreased. When it falls below the threshold voltage Vth11 at the comparator 47b, the level of the output signal from the comparator 47b switches to the L level. Needless to say that the potential Cosc at this point is less than the threshold voltage Vth12. As such, the level of the output signal from the comparator 47a is at the H level. Therefore, a signal at the L level is output from the output terminal Q of the SRFF. By repeating the operation thus described, the output signal osc shown in FIG. 1 is output.

The oscillation frequency fosc of the oscillation circuit 37 can be derived from the following Formula (33). In the Formula (33), it is supposed that respective output current values of the current sources I16 and I17 are equal to each other. As is apparent from the Formula (33), controlling of the output current value of the current source I16 and/or that of the current source I16 allow(s) controlling of the oscillation frequency fosc.

$$fosc = I/(2 \times C20 \times (Vth12 - Vth11)) \quad (33)$$

where:

I is output current values of the current source I16 and the current source I17.

Here, it is preferable that the oscillation frequency fosc be the same as the center frequency of the BPF 10b for the following reason. Namely, the comparator 36 performs comparison using the output signal from the BPF 10b. As such, the frequency of the output signal from the comparator 36 is the center frequency of the BPF 10b. By setting the oscillation frequency fosc of the oscillation circuit 7 to the same frequency as the center frequency of the BPF 10b, the differential of timing between the respective output signals of the comparator 36 and the oscillation circuit 37 is reduced. Thus, malfunctions of the logic circuit 38 is restrained. It is also preferable that the oscillation frequency fosc be smaller than the center frequency of the BPF 10b. This is because, setting of the oscillation frequency fosc to a smaller frequency than the center frequency of the BPF 10b allows an increase in the time constant of the counter 39a, which time constant performs a counting operation in response to the output signal osc from the oscillation circuit 37, without a need of increasing the number of bits of the counter 39a.

Figure 14:
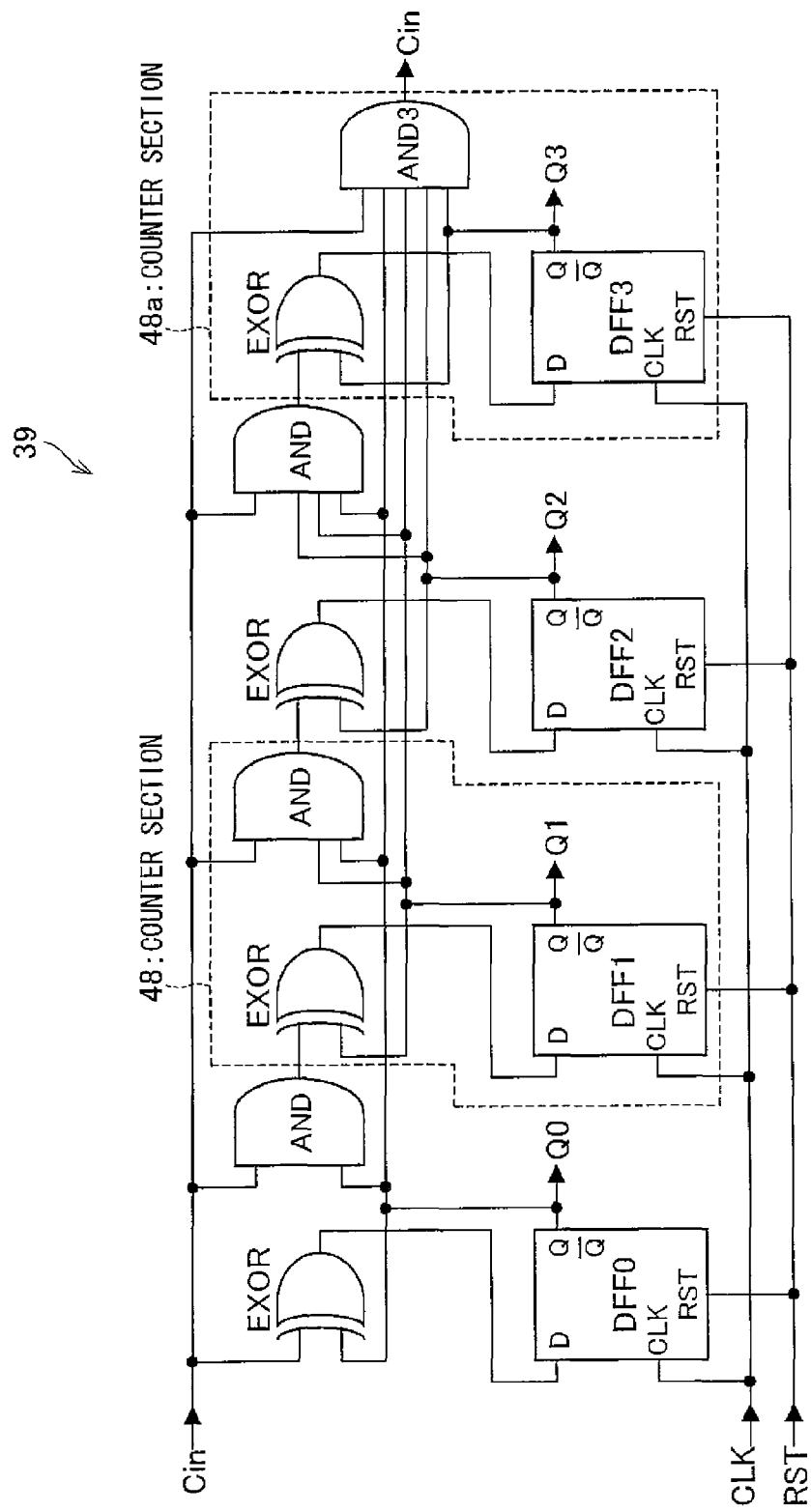
FIG. 14 is a diagram showing a specific configuration of a counter in the logic circuit.

FIG. 14 shows a specific configuration of the counter 39.

The counter includes plural 4-bit synchronous binary counters. Each of the 4-bit synchronous binary counters includes 4 stages of counter sections 48, each stage including: an exclusive circuit (Hereinafter simply referred to as EXOR); an AND circuit (Hereinafter simply referred to as AND); and a D flip-flop (D flip-flop 40) (Hereinafter simply referred to as DFF). Note that a single 4-bit synchronous binary counter is hereinafter referred to as a set. Further, an output Q0 is an output from a DFF0, and an output Q1 is an output from a DFF1. The same goes for the other DFFs as well.

In the counter section 48 of an n th stage (where n is an integer of 1 to 4) in a set, one of input terminals of the EXOR is connected to an output terminal of the AND in the counter section 48 of the n−1 th stage. Another one of the input terminals is connected to an output terminal Q of the DFF in the n th stage. The output terminal of the EXOR is connected to an input terminal D of the DFF in the counter section 48 of the n th stage. To one of the input terminals of the EXOR in the counter section 48 of the first stage in the set, a carry signal cin from a lower order (from the preceding set) is input.

To the AND in the counter section 48 of the n th stage in the set, the carry signal cin from the lower order (preceding set), an output from the DFF of the counter section 48 of the n th stage, and the respective outputs from the DFFs of all the preceding stages (i.e. n−1 th, n−2 th . . . first stage) are input. For example, it is supposed that the counter section 48a in the figure is the counter section 48 of the n th stage. The carry signal cin from the lower order (preceding set), an output Q3 from the DFF3 in the counter section 48a, and outputs of all the DFFs in the preceding stages are input to the AND3 in the counter section 48a. The respective outputs from the DFFs of all the preceding stages in this case are: an output Q0 from a DFF0 in the first stage; an output Q1 from a DEF1 in the n−2 th stage; and an output Q2 from a DFF2 in the n−1 th stage.

Each set having the configuration as described above counts pulses from 0000 to 1111, in response to input of clock CLK. Note that the AND in the counting section 35 of the final stage (i.e., AND3) outputs a carry signal cin to a counter of an upper order (subsequent set), when the DFF output of the set is "1111". Thus, it is possible to configure a multiple-bit counter. In a case of the infrared remote control receiver 20a, the center frequency of the BPF 10b is 40 kHz and the pulse cycle is 25 sec, in general. Thus, according to 25 μsec× $2^{14}$=0.4096 sec, a time constant of 300 msec or more is obtained with a counter of 14 bits or more.

Figure 15:
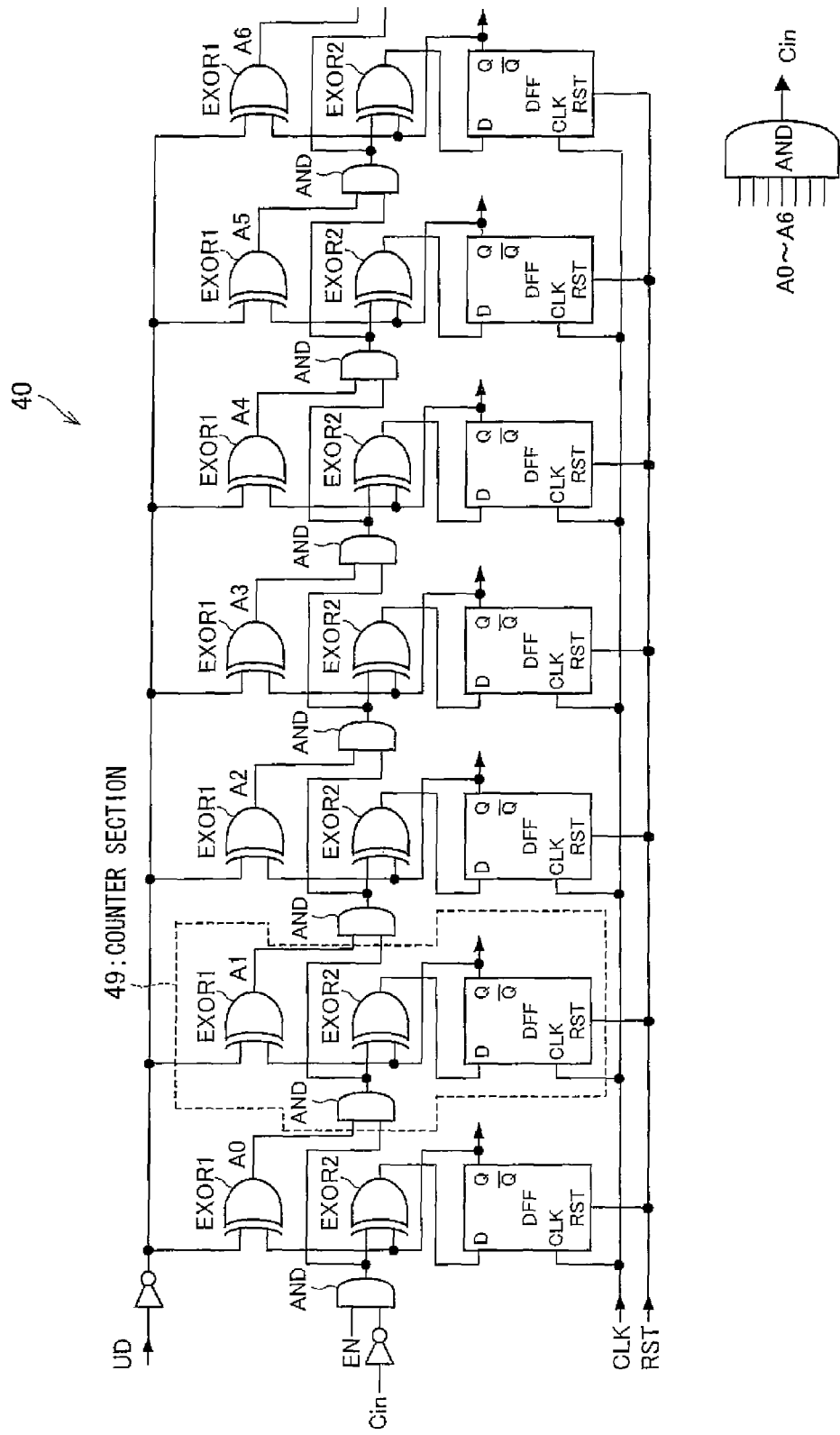
FIG. 15 is a diagram showing a specific configuration of an up-down counter in the logic circuit.

FIG. 15 shows a specific configuration of the up-down counter 40.

The up-down counter 40 includes plural 7-bit synchronous binary counters. Each of the 7-bit synchronous binary counters includes 7 stages of counter sections 49, and an AND 5. Each counter section 49 includes: 2 EXORs, an AND, and a DFF. To the AND 5, outputs A0 to A6 respectively from EXORs 1 of all the counting sections 49 are input. Note that a single 7-bit synchronous binary counter is hereinafter referred to as a set. The AND 5 in a set outputs a carry signal Cina to a counter of an upper order (subsequent set), when outputs of the EXORs 1 of all the counter sections 49 are "1".

In a counter section 49 of the n th stage (where n is an integer of 1 to 7) in the set, a count control signal UD is input to one of input terminals of the EXOR 1, and the another one of the input terminals is connected to one of input terminals of an EXOR 2 and an output terminal Q of a DFF of the same stage. An AND in the n th stage is connected to an output terminal of an AND and an output terminal of the EXOR 1 in the n−1 th stage. The output terminal of the AND in the n th stage is connected to an input terminal of an EXOR 2 of the counter section 49 in the nth stage. The output terminal of the AND is also connected, along with an output terminal of the EXOR 1 of the counter section 49 in the n th stage, to an AND of a counter section 49 in the n+1 th stage. The output terminal of the EXOR 2 of the counter section 49 in the n th stage is connected to an input terminal D of the DDF of the counter section 49 in the n th stage. To the AND of the counter section 49 of the first stage in the set, an enable signal EN and a carry signal Cina from a lower order (preceding set) are input.

The up-down counter 40 having the configuration as described above counts pulses from 0000000 to 1111111, in response to input of clock CLK. Note that up-counting is performed when an H-level signal is input to the count control signal UD, and down-counting is performed when an L-level signal is input.

Here, each of the counter 39 and the up-down counter 40 has a scan path, and is able to perform a shift-register operation. In wafer test performed at a predetermined occasion, the counter 39 and the up-down counter 40 are operated by using the same clock CLK (whereas, in a normal operation other than the wafer test, the clocks are operated by using different clocks respectively). This allows easier designing of the test, and improves a failure detection rate.

Figure 16:
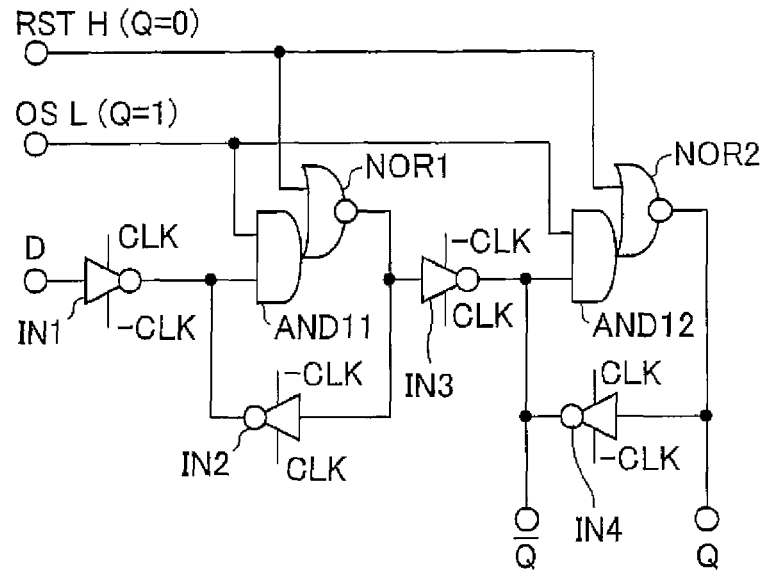
FIG. 16(a) is a diagram showing a specific configuration of a D flip-flop in each of the counter and the up-down counter
FIG. 16(b) is a diagram showing an operation of the D flip-flop.
FIG. 16(c) is a diagram showing an operation of the D flip-flop
Figure 16:
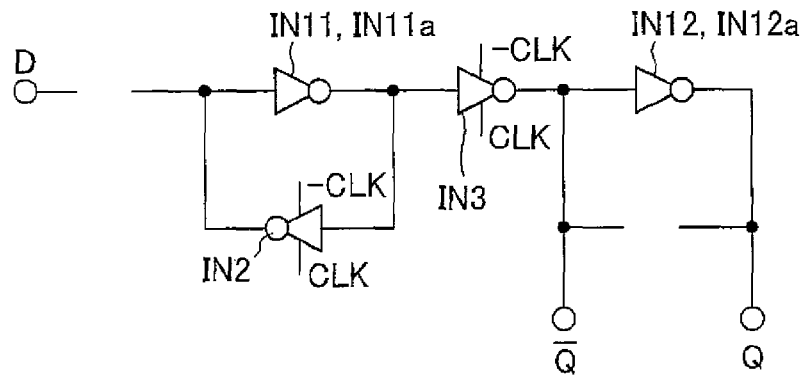
Figure 16:
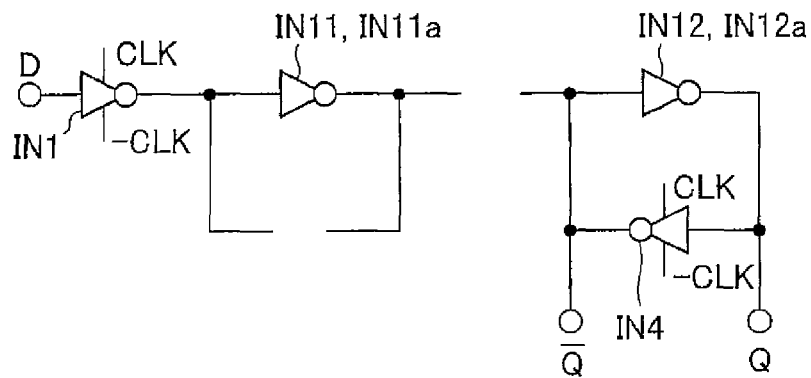

FIG. 16(*a*) shows a specific example of configuration of the DFF used in the counter 39 and the up-down counter 40. FIG. 16(*b*) and FIG. 16(*c*) show an operation of the DFF. The DFF includes: a clocked inverter (Hereinafter simply referred to as inverter IN); an AND; and a NOR circuit (Hereinafter referred to as NOR). First, connections of elements are described.

An input terminal D of the DFF is connected to an inverter IN 1, and an output terminal of the inverter IN 1 is connected to an input terminal (second input terminal) of an AND 11. To another input terminal (first input terminal) of the AND 11, an H output setting terminal OS (initial value setting section) for setting an output of the DFF is connected. An output terminal of the AND 11 is connected to an input terminal (second input terminal) of a NOR 1, and another input terminal (first input terminal) of the NOR 1 is connected to a reset terminal RST (initial value setting section) serving as an L output setting terminal for resetting the DFF. An output terminal of the NOR 1 is connected to an inverter IN 2, and an output terminal of the inverter IN 2 is connected to the second input terminal of the AND 11.

Further, the output terminal of the NOR 1 is connected to an inverter IN 3, and an output terminal of the inverter IN 3 is connected to an input terminal (second input terminal) of an AND 12. Another input terminal (first input terminal) of the AND 12 is connected to the H output setting terminal OS. An output terminal of the AND 12 is connected to an input terminal (second input terminal) of a NOR 2, and another input terminal of the NOR 2 is connected to the reset terminal RST. An output terminal of the NOR 2 is connected to an inverter IN 4, and an output terminal of the inverter IN 4 is connected to the output terminal of the inverter IN 3. The output terminal of the NOR 2 serves as an output terminal Q of the DFF, and the output terminal of the inverter IN 4 serves as an output terminal Q bar of the DFF.

Next, an operation of the DFF is described with reference to FIG. 16(*b*) and FIG. 16(*c*). FIG. 16(*b*) shows a case where an H-level signal is input as the clock CLK, whereas FIG. 16(*c*) shows a case where an L-level signal is input as the clock CLK. As mentioned, the DFF is provided with the H output setting terminal OS and the reset terminal RST, so that it is possible to set an output of the DFF. Specifically, an output of the DFF (output terminal Q) can be set to H level, by inputting a signal at the L level to the H output setting terminal OS. On the other hand, an output of the DFF (output terminal Q) can be reset by inputting an H-level signal to the reset terminal RST: i.e., the output of DFF is set to L level. Each of the cases are described below.

First described is a case of FIG. 16(*b*) where an H-level signal is input as a clock CLK, and an H-level signal is input to the reset terminal RST, so as to acquire an L-level output from the DFF.

See FIG. 16(*b*) for the following description. When an H-level signal is input as a clock CLK, the inverter IN 1 and the inverter IN 4 enter a high-impedance state. Then, by inputting an H-level signal to the reset terminal RST, the signal is input to the first input terminal of NOR 1. Hence, no matter what level the output from the AND 11 is, the output from the NOR 1 is at the L level. Therefore, the AND 11 and NOR 1 can be regarded as an inverter whose output is at the L level (IN 11 in the figure). Similarly, the AND 12 and the NOR 2 can be regarded as an inverter whose output is at the L level (IN 12 in the figure). Thus, an L-level output is acquired from the DFF.

Next described is a case of FIG. 16(*c*) where an L-level signal is input as a clock CLK, and an H-level signal is input to the reset terminal RST, so as to acquire an L-level output from the DFF.

In this case, the inverter IN 2 and the inverter IN 3 enter the high-impedance state. The AND 11 and NOR 1 can be regarded as IN 11 whose output is at the L level, and the AND 12 and the NOR 2 can be regarded as the inverter TN 12 whose output is at the L level. Thus, an L-level output is acquired from the DFF.

Next described is a case of FIG. 16(*b*) where an H-level signal is input as a clock CLK, and an L-level signal is input to H output setting terminal OS, so that an H-level output is acquired from the DFF.

As shown in FIG. 16(*b*), the inverters IN 1 and IN 4 enter the high-impedance state, when an H-level signal is input as a clock CLK. Then, by inputting an L-level signal to the H output setting terminal OS, an L-level signal is input to the first input terminal of the AND 11. As a result, the output from the AND 11 is at the L level without fail. Since an L-level signal is input from the reset terminal RST to the first input terminal NOR 1, the output of the NOR 1 is at the H level without fail. As a result, the AND 11 and NOR 1 can be regarded as a single inverter (IN 11*a* in the figure) whose output is at the H level. Similarly, the AND 12 and NOR 2 can be regarded as a single inverter (IN 12*a* in the figure) whose output is at the H level. Thus, an H-level output is acquired from the DFF.

Next described is a case of FIG. 16(*c*) where an L-level signal is input as a clock CLK, and an L-level signal is input to the H-output setting terminal OS, so as to acquire an H-level output from the DFF.

In this case, the inverters IN 2 and IN 3 enter the high-impedance state. Thus, the AND 11 and NOR 1 can be regarded as IN 11*a* whose output is at the H level. Further, the AND 12 and NOR2 can be regarded as an inverter IN 12*a* whose output is in the H-level. Thus, an H-level output is acquired from the DFF.

As described, the output of the DFF can be set by inputting an L-level signal to the H output setting terminal OS or inputting an H-level signal to the reset terminal RST. Through this, it is possible to set the gain of the amplifier 34, and set the gain and Q-value of the BPF 10*b* at the time of turning-on the power. This allows the gain of the amplifier 34 and the gain and Q-value of the BPF 10*b* to be respectively set to values which are suitable for the use environment. Hence, an infrared remote control receiver 50*a* which is adaptable for various use environments is realized.

Embodiment 4

Figure 17:
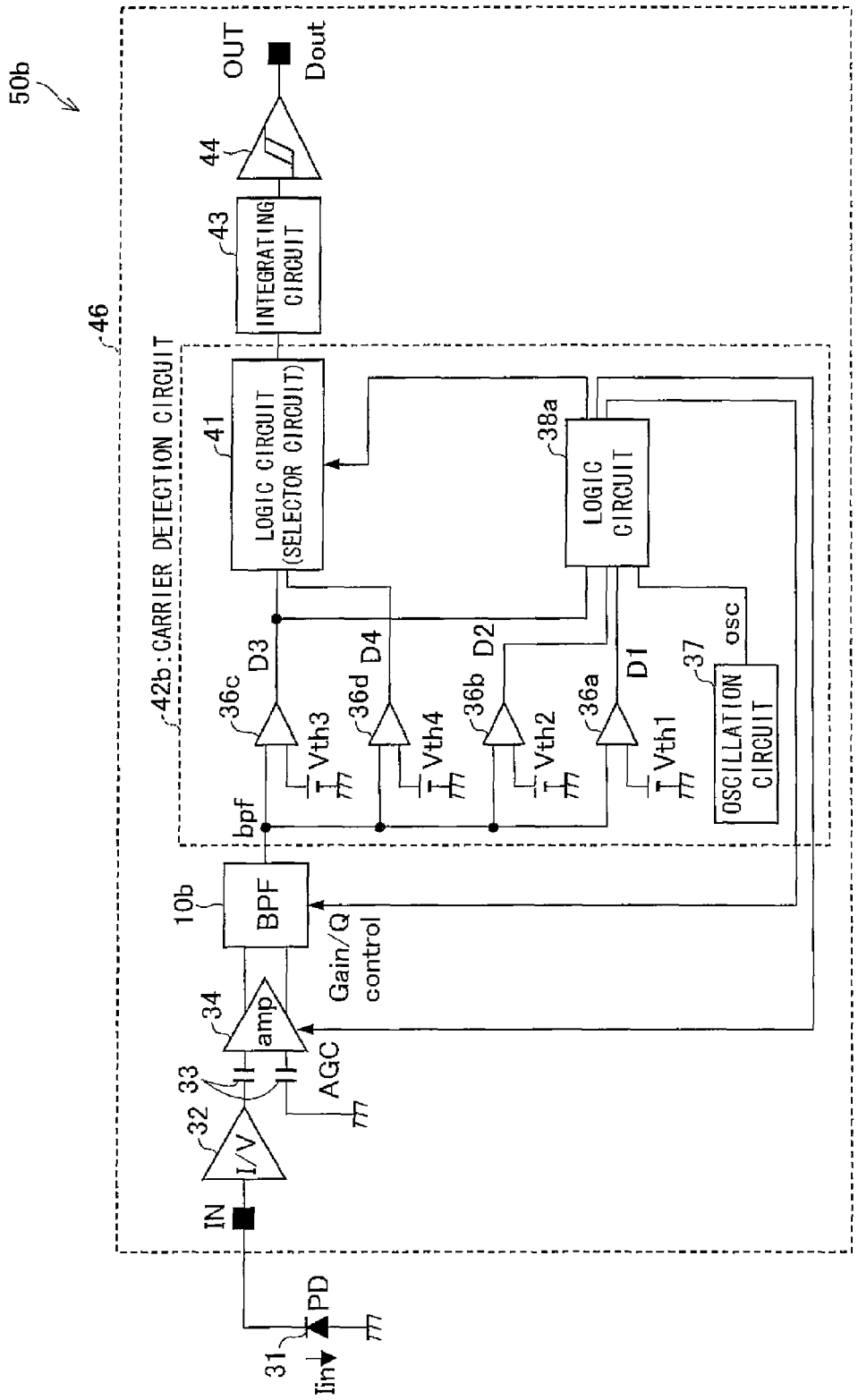
FIG. 17 is a diagram showing a configuration of an infrared remote control receiver according to another embodiment.
Figure 18:
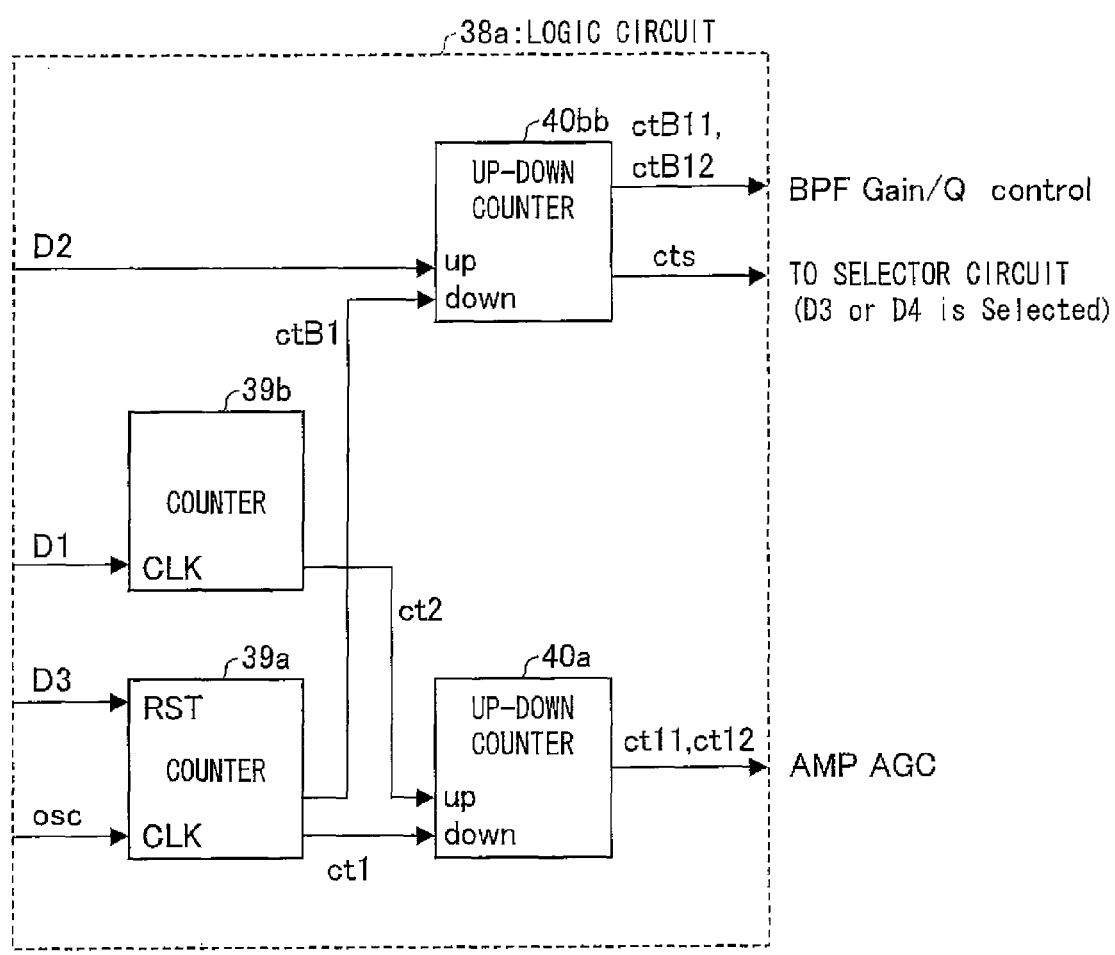
FIG. 18 is a block diagram showing a configuration of a logic circuit in the infrared remote control receiver show in FIG. 17.
Figure 19:
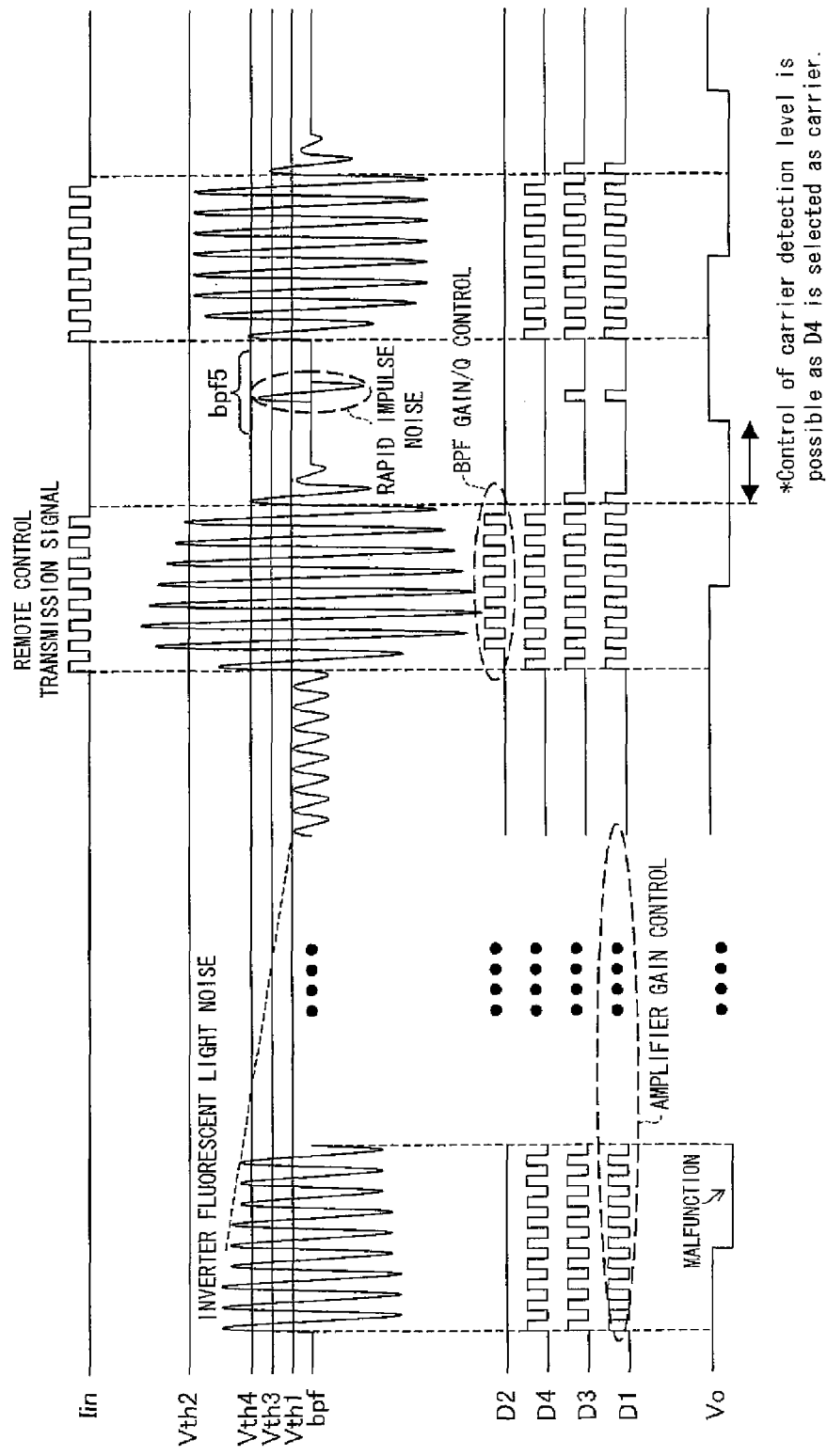
FIG. 19 is a diagram showing an operation of each circuit in the infrared remote control receiver shown in FIG. 17.

The following describes another embodiment of the present invention, with reference to FIG. 17 to FIG. 19.

FIG. 17 shows a configuration of an infrared remote control receiver 50*b*. Note that members with the same reference numerals as those of the foregoing infrared remote control receiver 50*a* shown in FIG. 1 have the same functions, and explanations for these members are therefore omitted here.

The configuration of the infrared remote control receiver 50*b* is different from that of the infrared remote control receiver 50*a* in that the infrared remote control receiver 50*b* is provided with a carrier detection circuit 42*b* serving as the carrier detection circuit 42*a*.

The carrier detection circuit 42*b* is different from the carrier detection circuit 42*a* in that the carrier detection circuit 42*b* includes a comparator 36*d* (fourth comparing circuit), a logic circuit 38*a* serving as the logic circuit 38, and a selector circuit 41. To one of input terminals of the comparator 36*d*, an output signal bpf from the BPF 10*b* is input. To another one of the input terminals, a threshold voltage Vth4 (fourth threshold voltage) whose level is a second signal detection level (a second carrier detection level) is input. The threshold voltages Vth1 to Vth4 have the following relation: Vth1<Vth3<Vth4<Vth2.

FIG. 18 shows an exemplary configuration of the logic circuit 38*a*.

The configuration of the logic circuit 38*a* is substantially the same as the logic circuit 38; however, the logic circuit 38*a* includes an up-down counter 40*bb* serving as the up-down counter 40*b*. The up-down counter 40*bb* controls the BPF 10*b*, and also controls the selector circuit 41. More specifically, when an output signal D2 from the comparator 36*b* is input, the up-down counter 40*bb* outputs a selector control signal cts to the selector circuit 41.

The selector circuit 11 receives the output signal D3 from the comparator 36*c* and an output signal D4 from the comparator 36*d*, and selects therefrom a carrier. The carrier is selected based on the selector control signal output from the up-down counter 40*bb* in the logic circuit 38*a*. The output signal D4 of the comparator 36*d* is selected as the carrier when the selector control signal cts is input.

When the output signal D2 of the comparator 36*b* is output: i.e., when it is judged that a problem such as an increase in the pulse width of the output signal D3 of the comparator 36*c* may occur, the output signal D4 of the comparator 6*d* is output as the carrier to the subsequent stage. Thus, outputting of suitable carrier for the remote control transmission signal is possible. Thus, a problem of not being able to receive signals will not occur. Further, since the output carrier is the output signal D4 of the comparator 6*d* which signal has been acquired as a result of the comparison with the threshold voltage Vth4 higher than the threshold voltage Vth2, it is possible to further restrain the malfunctions attributed to the fluorescent light noise.

Further, the configuration of the Embodiment 3 is capable of handling a case where fluorescent light noise is suddenly generated while remote control transmission signals are input; e.g. where a fluorescent light is suddenly turned on. See FIG. 19 for the explanation below. FIG. 19 shows respective operational waveforms of the circuits in the infrared remote control receiver 50*b*, in a case where the fluorescent light noise occurs.

As shown in the figure, even if the fluorescent light noise suddenly occurs (signal bpf 5 in the figure), the output signal D2 from the comparator 36*b* is output before the occurrence of the noise. Therefore, the selector circuit 41 outputs as the carrier the output signal D4 of the comparator 36*d*. Thus, it is possible to restrain malfunctions attributed to the sudden occurrence of the fluorescent light noise.

Embodiment 5

Another embodiment of the present invention is described below with reference to FIG. 20.

Figure 20:
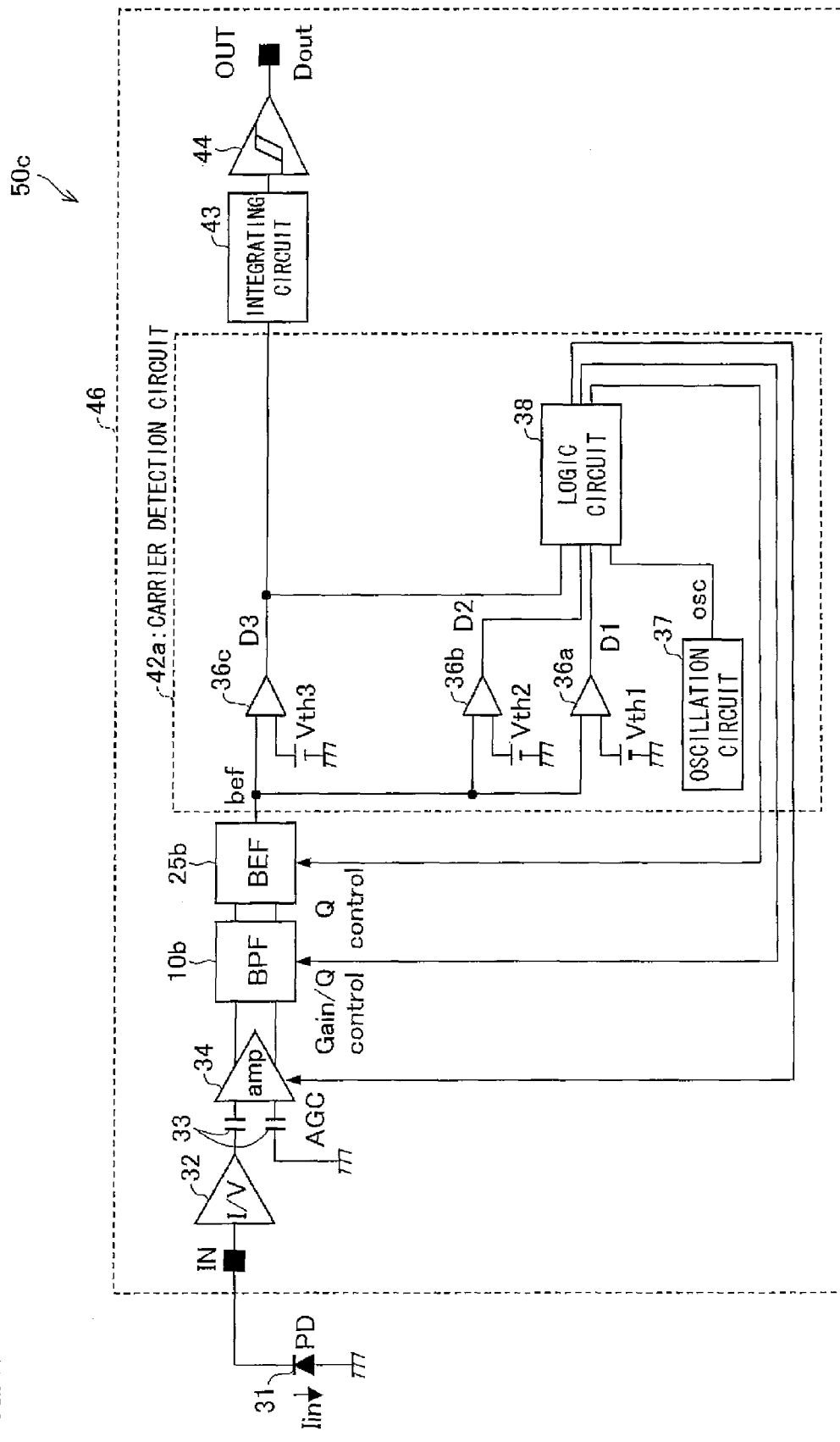
FIG. 20 is a diagram showing a configuration of an infrared remote control receiver of another embodiment.

FIG. 20 shows a configuration of an infrared remote control receiver 50*c*. Note that members with the same reference numerals as those of the foregoing infrared remote control receiver 50*a* shown in FIG. 1 have the same functions, and explanations for these members are therefore omitted here.

The infrared remote control receiver 50*c* includes a BEF 25*b* in addition to the configuration of the infrared remote control receiver 50*a*. The BEF 25*b* is provided between a BPF 10*b* and a carrier detection circuit 42*a*. To one input terminal of each of comparators 36*a* to 36*c* in the carrier detection circuit 42*a*, an output signal bef of the BEF 25*b* is input, instead of an output signal bpf of the BPF 10*b*.

As in the BPF 10*b*, the BEF 25*b* is capable of adjusting its constant such as the Q-value, according to a signal sent from the logic circuit 38. More specifically, when (i) an output signal D1 is output from the comparator 36*a* and (ii) an output signal D3 is no longer output from the comparator 36*c*, BEF control signals ctE1 and ctE2 (not shown) are output from the counters 39*a* and 39*b*, along with an amplifier control signal ct, respectively. Then, from the up-down counter 40*a* having received these signals, BEF control signals etE11 and ctE12 for adjusting constants of the BEF 25*b* are output along with the amplifier control signal ct. The BEF control signals ctE11 and ctE12 are input to a register 19 of the BEF 25*b*, and thus, the constants such as the Q-value is adjusted.

As mentioned above, the infrared remote control receiver 50*c* includes the BEF in addition to the configuration of the infrared remote control receiver 50*a*. This configuration yields the effect of reducing inverter fluorescent light noise, in addition to the effect of the infrared remote control receiver 50*a*. The present embodiment deals with a case of a configuration in which a BEF is added to the configuration of the infrared remote control receiver 50*a*. However, it is needless to mention that the same can be done to the configuration of the infrared remote control receiver 50*b*.

Embodiment 6

Another embodiment of the present invention is described below with reference to FIG. 21.

Each of the embodiments 3 to 5 deals with a case where a BPF and/or BEF of the present invention are adopted to an infrared remote control receiver. However, it is not only an infrared remote control receiver that can adopt the BPF and/or BEF of the present invention. For example, the BEF and BPF of the present invention can be also adopted to: (i) an optical space transmission/reception device (infrared signal processing circuit) whose transmission rate is 2.4 kbps to 115.2 kbps, 1.152 Mbps, or 4 Mbps, and whose spatial transmission distance is approximately 1 m; or (ii) a device (infrared signal processing circuit) in compliance with an IrDA Control standard, whose transmission rate is 75 kbps, sub carrier wave is 1.5 MHz, and spatial transmission distance is 1 m or longer. As an example, the present embodiment deals with a case where the BPF (BPF 10b) of the present invention is applied to a device in compliance with the IrDA Control standard (hereinafter simply referred to as IrDA Control device).

Figure 21:
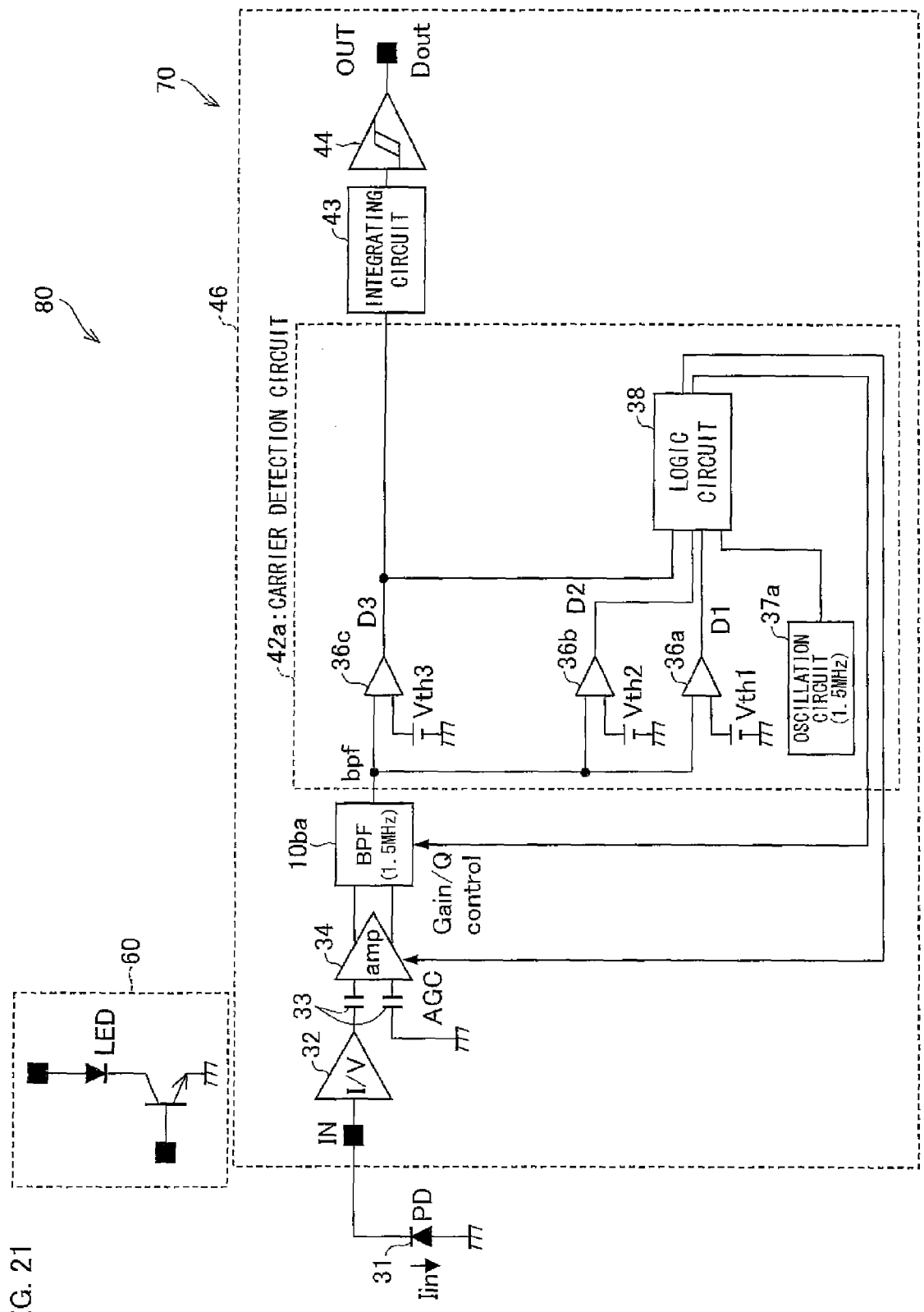
FIG. 21 is a diagram showing a configuration of an IrDA Control of the other embodiment.

FIG. 21 shows an exemplary configuration of an IrDA control device 80. Note that members with the same symbols as those of the infrared remote control receiver 50a shown in FIG. 1 have the same functions, and therefore no particular explanations regarding operations or the like of those members are provided here.

To perform two-way communication, the IrDA Control device 80 includes a transmission section 60 and a reception section 70. The transmission section 60 includes an LED and a drive circuit therefor. The reception section 70 has the similar configuration as that of the infrared remote control receiver 50a. However, since the subcarrier of the IrDA control is 1.5 MHz, the reception section 70 includes: a BPF 10ba (serving as the BPF 10b) whose center frequency is 1.5 MHz; and an oscillation circuit 37a (serving as the oscillation circuit 37) whose oscillation frequency fosc is 1.5 MHz.

IrDA Control device 80 having the above configuration is capable of, for example, (i) reducing inverter fluorescent light noise and (ii) reducing distortion in the waveform of an output from the BPF. It is needless to say that the configuration of the IrDA Control device 80 is not limited to the above, and configurations of the foregoing embodiments can be suitably adopted to the configuration of the IrDA Control device 80.

With an infrared signal processing circuit of the present invention which is described in the above embodiments, problems in a conventional configuration do not take place. This point is described hereinbelow.

First, the data transferring system disclosed in Published document 1 (published Japanese translations of PCT international publication for patent applications 502147/2001 (Tokuhyou 2001-502147; Published on Feb. 13, 2001)) is provided with a certain period range T check. The system judges whether received signal is an infrared signal or noise, according to whether or not a halt period Td occurred within the period range T check. If the signal received is judged as to be noise, an amplifier is controlled. However, an infrared signal can vary depending on makers, and there are more than ten different kinds of infrared signals: e.g., NEC codes, Sony codes, RCMM codes, etc. Thus, some infrared signals are not adaptable to the halt period Td of the data transferring system, and the system is not able to receive those inadaptable infrared signals. The system is not able to handle sudden occurrence of noise due to its slow gain adjustment speed, as is pointed out in Published document 5 (Japanese Unexamined Patent Publication No. 60410/2006 (Tokukai 2006-60410; Published on Mar. 2, 2006)).

However, unlike the system of Published document 1, the infrared remote control receiver 50a for example is not configured to detect an infrared signal pattern. Therefore, the infrared remote control receiver 50a is able to handle various kinds of infrared signals. Furthermore, the infrared remote control receiver 50b having the selector circuit 41 is able to handle a case of sudden occurrence of noise.

Further, Published document 2 (published Japanese translations of PCT international publication for patent applications 506375/2004 (Tokuhyou 2004-506375; published on Feb. 26, 2004)) discloses a receiver circuit which demodulates an output signal from a BPF, and which controls an amplifier and the BPF, using the demodulated signal as a trigger. However, this receiver circuit has the following problem. Namely, when noise from fluorescent light having a high illuminance enters the receiver circuit, the output signal of the BPF is saturated by the noise. This causes the demodulated signal to be constantly at the L level. Due to this, the demodulated signal does not function as the trigger, and as the result, the amplifying circuit and bandpass filter are not controlled.

On the other hand, for example, the infrared remote control receiver 50a performs control caused by an output signal from the comparing circuit 36, which signal is obtained as a result of comparison with the output signal bpf from the BPF 10b. This output signal of the comparing circuit 36 needed for performing the control is acquired as long as the BPF 10b is oscillating. Therefore, it is possible to avoid the problem of Published document 2 that the amplifier and BPF are not controlled.

Figure 22:
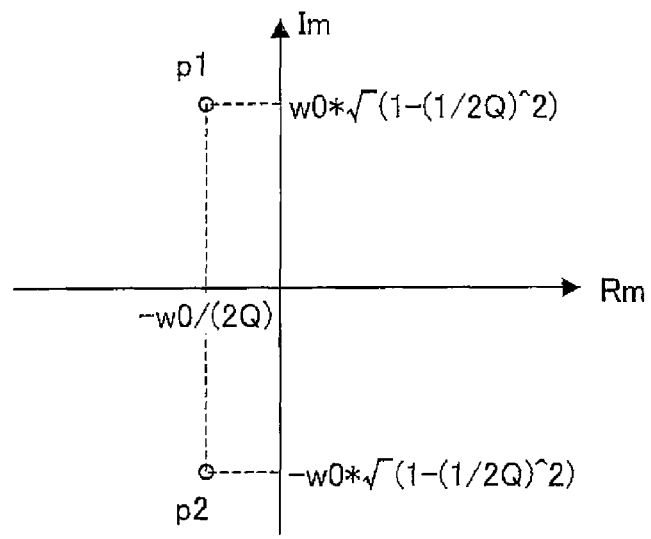
FIG. 22(a) is a diagram for explaining the stability of a BPF and distortion in the waveform of an output, and is showing the pole assignment of the BPF.
FIG. 22(b) is a diagram for explaining the stability of the BPF and distortion in the waveform of an output, and is showing the waveform of an output signal from the BPF.
Figure 22:
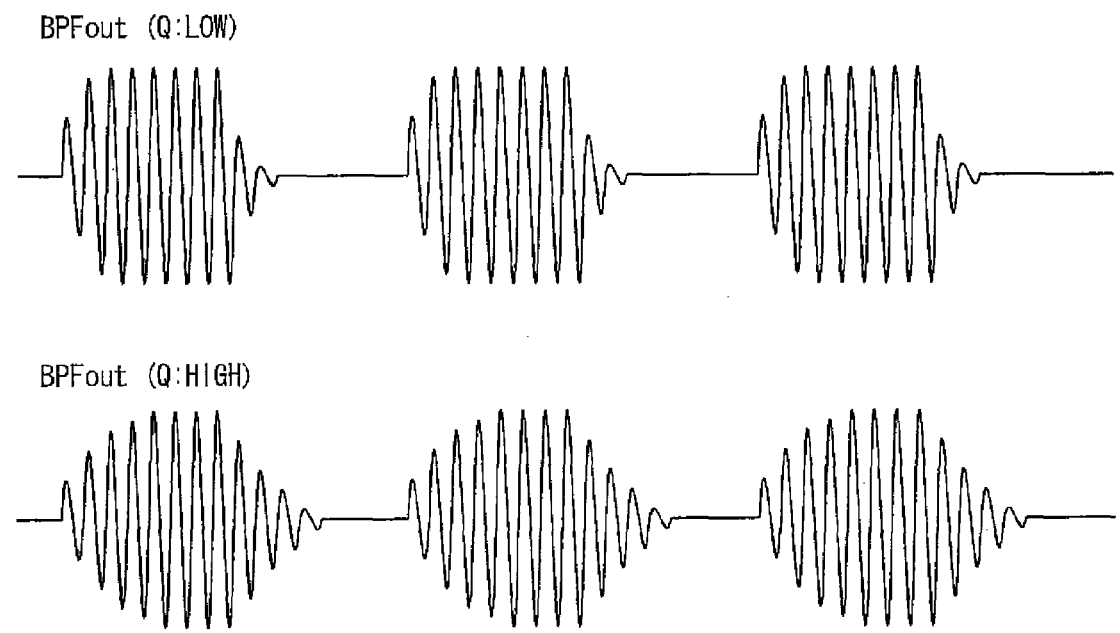
Figure 23:
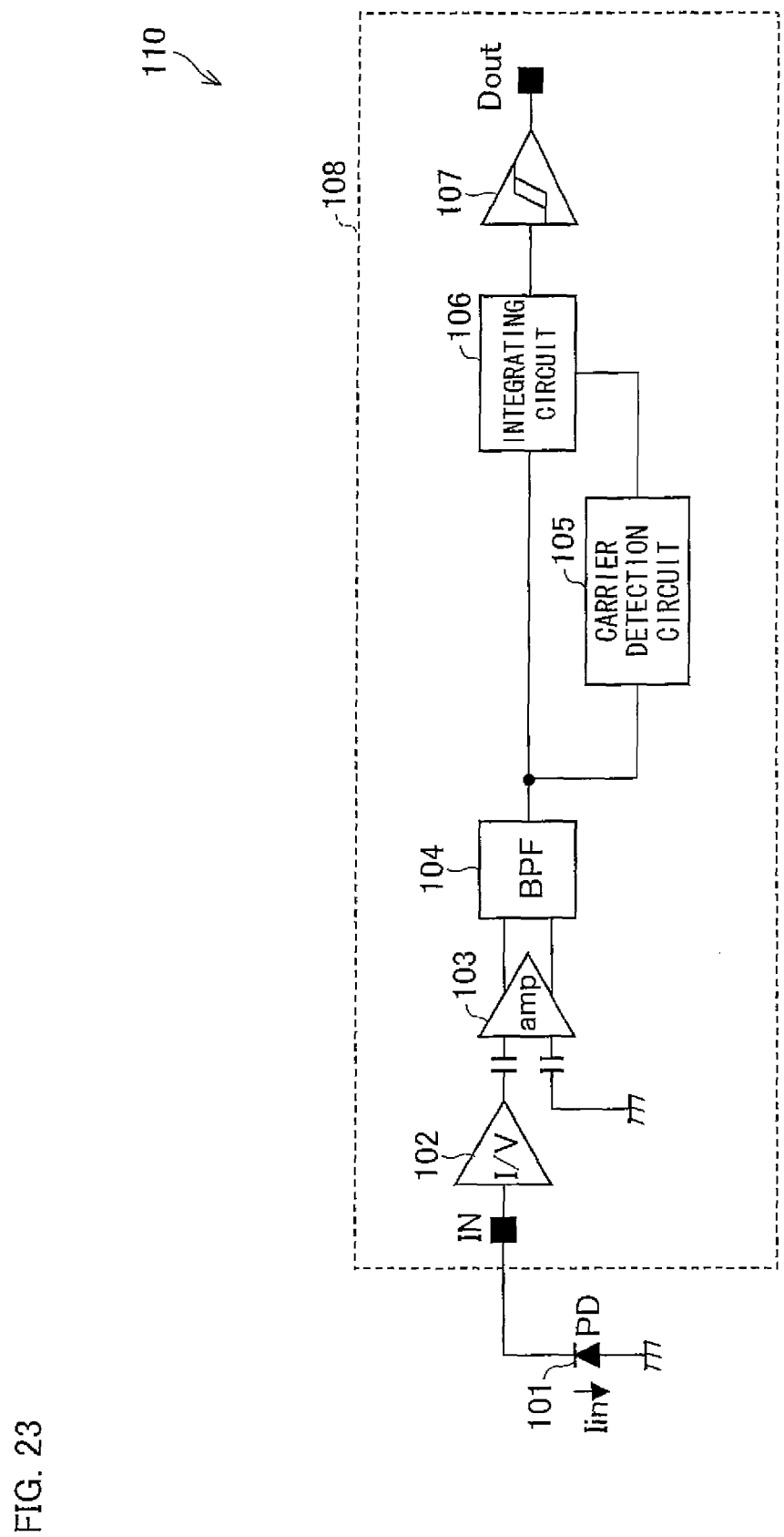
FIG. 23 is a diagram of a conventional technology, showing a configuration of an infrared remote control receiver
Figure 24:
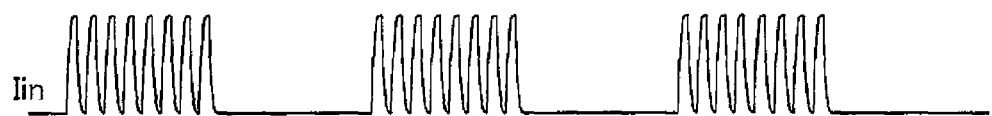
FIG. 24(a) is a diagram showing an output from a current-to-voltage-conversion circuit in the infrared remote control receiver showing in FIG. 23.
FIG. 24(b) is a diagram showing an output (solid line) of a bandpass filter circuit in the infrared remote control receiver showing in FIG. 23, and an output (dotted line) of a carrier detection circuit of the infrared remote control receiver.
FIG. 24(c) is a diagram showing an output (solid line) of an integrating circuit in the infrared remote control receiver showing in FIG. 23.
FIG. 24(d) is a diagram showing a digital output of the infrared remote control receiver shown in FIG. 23.
Figure 24:
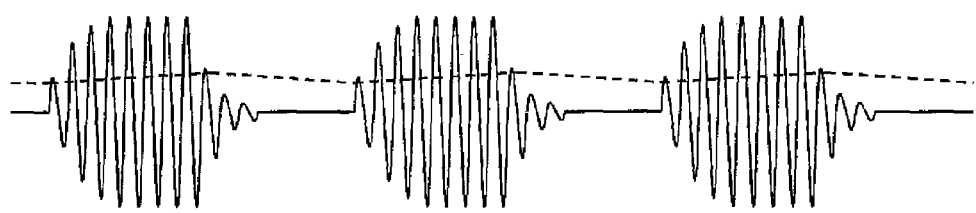
Figure 24:
Figure 24:
Figure 25:
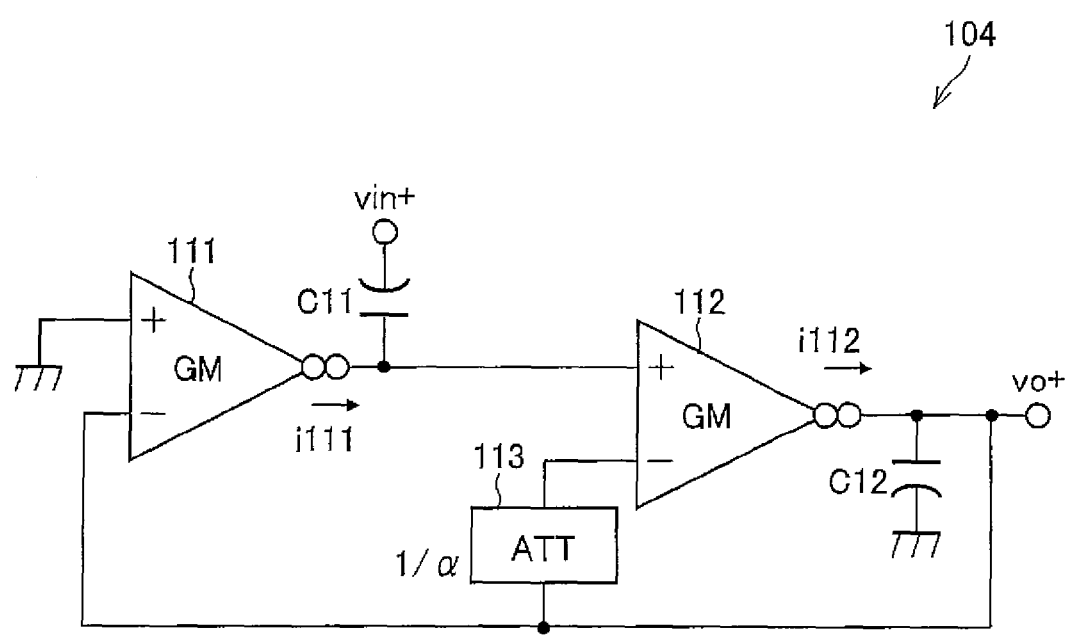
FIG. 25 is a diagram showing a configuration of a bandpass filter in the infrared remote control receiver shown in FIG. 23.
Figure 26:
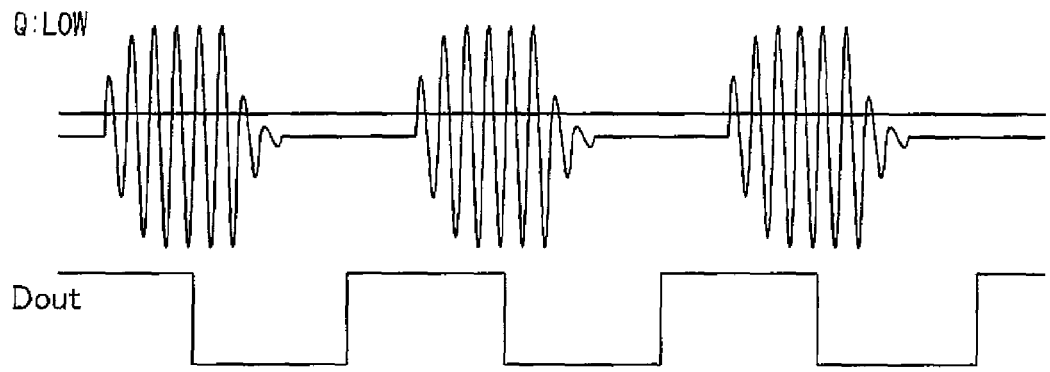
FIG. 26(a) is a diagram showing a digital output from the infrared remote control receiver showing in FIG. 23 and an output of the bandpass filter circuit, when the Q-value of the bandpass filter circuit is low.
FIG. 26(b) is a diagram showing a digital output from the infrared remote control receiver showing in FIG. 23 and an output of the bandpass filter circuit, when the Q-value of the bandpass filter circuit is high.
FIG. 26(c) is a diagram showing a digital output from the infrared remote control receiver showing in FIG. 23 and an output of the bandpass filter circuit, when the Q-value of the bandpass filter circuit is high, and when communication is performed with an infrared remote control transmitter located at a short distance.
Figure 26:
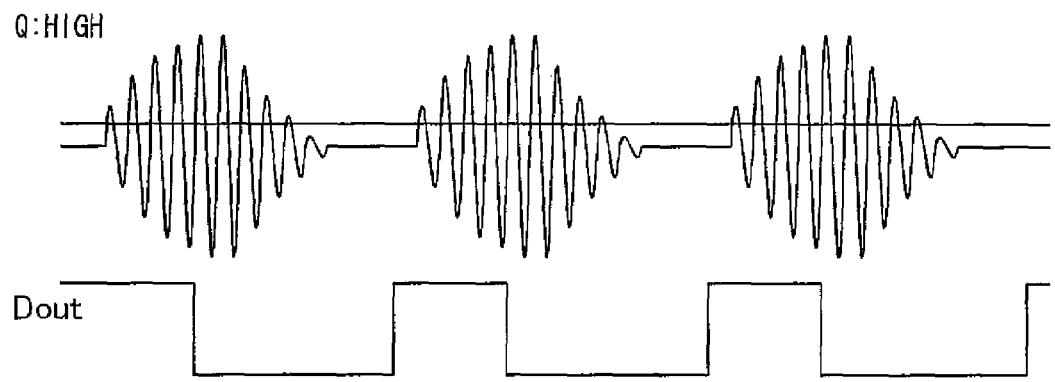
Figure 26:
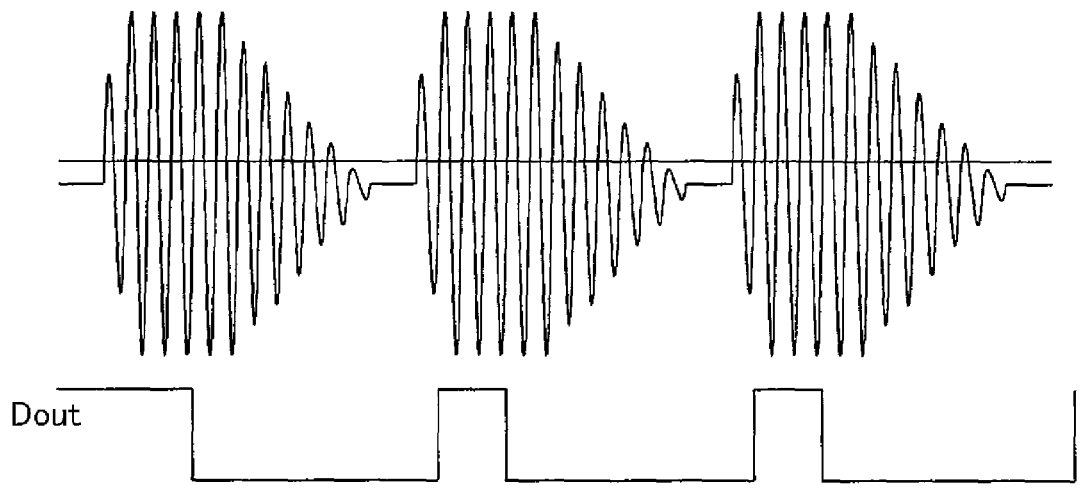
Figure 27:
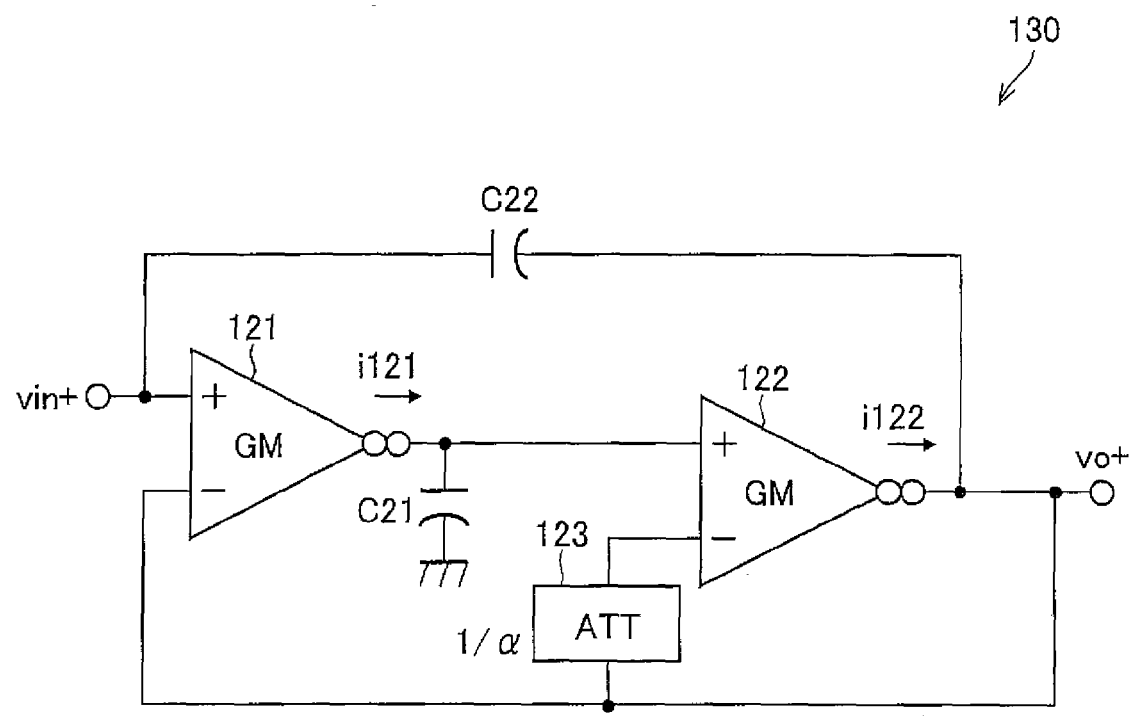
FIG. 27 is a diagram of a conventional technology, and shows a configuration of a band-elimination filter circuit.

Further, Published document 3 (Japanese Unexamined Patent Publication No. 56541/2004 (Tokukai 2004-56541; published on Feb. 19, 2004)) discloses a remote control light receiving device which detects an output signal of a BPF and which reduces noise by increasing the Q-value of the BPF. However, an increase of the Q-value causes a problem such as the follows: deterioration in stability of the BPF; and/or deterioration of the reception sensitivity due to increase in waveform distortion of the output signal bpf of the BPF. This is explained with reference to FIG. 22(a) and FIG. 22(b). FIG. 22(a) shows a pole assignment of the BPF, and FIG. 22(b) shows an output signal waveform of the BPF.

First described is the stability of the BPF. Formula (34) shows the transfer function of the BPF, and Formula (35) shows the polarities p1 and p2 of the BPF.

$$H(s)=(H\times\omega 0s/Q)/(s^2+\omega 0s/Q+\omega 0^2) \tag{34}$$

$$p1=(-\omega 0/2/Q,\omega 0(1-(\tfrac{1}{2}Q)^2)^{1/2})$$

$$p2=(-\omega 0/2/Q,-\omega 0(1-(\tfrac{1}{2}Q)^2)^{1/2}) \tag{35}$$

As shown in FIG. 22(a), the polarity assignment approaches to the right half plane, by increasing the Q-value of the BPF. As the result, in a negative feedback circuit, the BPF is made unstable according to Nyquist stability criterion which says a system is destabilized when the polarity assignment is in the right half plane.

Next described is the distortion of the waveform in the output signal of the BPF. A sine wave response of the BPF is obtained as follows. Namely, where Laplace transform of sine wave is as presented in Formula (6), the sine wave response of the BPF is obtained by performing reverse-Laplace transform of H(S)F(S) (Formula (7)).

$$F(s)=L(\sin(\omega 0t))=\omega 0/(s^2+\omega 0^2) \tag{36}$$

$$L^{-1}(H(s)F(s))=H(1-\exp(-\omega 0t/2/Q))\sin(\omega 0t) \tag{37}$$

It is found that the waveform distortion increases with an increase in the Q-value, since the $(1-\exp(-\omega 0t/2/Q))$ in Formula (7) influences the waveform distortion. The increase in the waveform distortion in the output signal of the BPF causes deterioration in the reception sensitivity. Especially, when the pulse width of the base frequency of the remote control transmission signal is small, the waveform distortion is relatively increased. Accordingly, the Q-value of the BPF is set to approximately 10 to 15 in general.

However, in the infrared remote control receiver 50*a* for example, the gain of the amplifier 34 and the gain and Q-value of the BPF 10*b* are judged as to be large, when the output signal D2 is output from the comparator 36*b*, and the BPF 10*b* is rapidly controlled so that the gain and Q-value of the BPF 10*b* are reduced. Thus, the above mentioned problems are avoided.

Further, Published document 4 (Japanese Unexamined Patent Publication No. 331076/1999 (Tokukaihei 11-331076; Published on Nov. 30, 1999)) discloses an infrared signal processing circuit which generates a reference level voltage for detecting a carrier, by using a noise level voltage or the like detected. In the infrared signal processing circuit, the reception sensitivity drops with variation in the reference voltage level at the time of inputting an infrared signal. Thus, it is necessary to smoothen the reference voltage level with a use of an integrating circuit whose time constant is large. This necessitates a capacitor with a large capacitance in the integrating circuit built of the infrared signal processing circuit. Therefore, the chip-size is increased, consequently increasing the costs.

However, in the infrared remote control receiver 50*a* for example, a large time constant can be set in the logic circuit 38. Therefore, it is possible to reduce the capacitance of the capacitor in the integrating circuit.

Further, Published document 5 discloses a gain adjustment circuit which reduces its time constant so as to handle sudden generation of fluorescent light noise. In this case, however, since the time constant of the gain adjustment circuit is small, the reception sensitivity is deteriorated.

In the infrared remote control receiver 50*b*, on the other hand, the carrier detection level is suitably modified by the selector circuit 41. This, while avoiding deterioration of the reception sensitivity, restrains malfunctions attributed to sudden occurrence of fluorescent light noise.

In addition to the above configuration, the bandpass filter circuit of the present embodiment preferably includes: an adjustment section for adjusting a transconductance of at least one of the transconductance amplifier circuits.

With the configuration having the adjustment section, it is possible to adjust constants by means of adjusting the transconductance of the transconductance amplifier circuit.

Further, the bandpass filter circuit of the present embodiment is preferably adapted so that: each of the transconductance amplifier circuits includes (i) a first transistor section in which transistors are arranged in parallel to one another, and (ii) a second transistor section via which currents of all the transistors, but a first transistor, in the first transistor section flow to a ground terminal; a current of the first transistor in the first transistor section is an output current of the transconductance amplifier circuit, and the respective channel widths and channel lengths of all the transistors in the first transistor section are different from one another; and the adjustment section switches on and off of each transistor in the second transistor section.

In the bandpass filter circuit having the above configuration, the transistors of the second transistor section are switched between on and off with a use of the adjustment section. That way, the current amount flowing in the first transistor of the first transistor section (i.e., an output current amount) is varied, and thus the transconductance of the transconductance amplifier circuit is adjusted. Hence, it is possible to adjust constants by means of adjusting the transconductance of the transconductance amplifier circuit.

In addition to the above configuration, the band-elimination filter circuit of the present embodiment preferably includes: an adjustment section for adjusting a transconductance of at least one of the transconductance amplifier circuits.

With the configuration having the adjustment section, it is possible to adjust constants by means of adjusting the transconductance of the transconductance amplifier circuit.

Further, the band-elimination filter circuit of the present embodiment is preferably adapted so that: each of the transconductance amplifier circuits includes (i) a first transistor section in which transistors are arranged in parallel to one another, and (ii) a second transistor section via which currents of all the transistors, but a first transistor, in the first transistor section flow to a ground terminal; a current of the first transistor in the first transistor section is an output current of the transconductance amplifier circuit, and the respective channel widths and channel lengths of all the transistors in the first transistor section are different from one another; and the adjustment section switches on and off of each transistor in the second transistor section.

In the band-elimination filter circuit having the above configuration, the transistors of the second transistor section are switched between on and off with a use of the adjustment section. That way, the current amount flowing in the first transistor of the first transistor section (i.e., an output current amount) is varied, and thus the transconductance of the transconductance amplifier circuit is adjusted. Hence, it is possible to adjust constants by means of adjusting the transconductance of the transconductance amplifier circuit.

Further, in addition to the above, the infrared signal processing circuit of the present embodiment may be adapted so that the logic circuit includes a plurality of counters each of which (i) counts pulses of output signals from one of the comparing circuits, and (ii) outputs, when a predetermined number of the pulses are counted, a pulse for controlling the amplifying circuit or the bandpass filter. Furthermore, in addition to the above, the carrier detection circuit of the present invention may include an oscillation circuit for oscillating clock signals, wherein the logic circuit includes: a first counter which counts clock signals from the oscillation circuit and outputs (i) first amplifying circuit control signals for use in increasing the gain of the amplifying circuit, and (ii) bandpass filter control signals for use in increasing the gain and Q-value of the bandpass filter; a second counter which counts the output signals from the first comparing circuit and outputs second amplifying circuit control signals for use in decreasing the gain of the amplifying circuit, the second counter being one of the plurality of counters; a first up-down counter which (i) counts the first amplifying circuit control signals and outputs a first control signal for causing an increase in the gain of the amplifying circuit, and (ii) counts the second amplifying circuit control signals and outputs a second control signal for causing a decrease in the gain of the amplifying circuit; a second up-down counter which (i) counts the bandpass filter control signals and outputs a third control signal for causing increase in the gain and Q-value of the bandpass filter, and (ii) counts output signals from the third comparing circuit and outputs a fourth control signal for causing decrease in the gain and Q-value of the band pass filter, the second counter being one of the plurality of counters.

In the above configuration, since the infrared signal processing circuit includes a digital circuit, it is possible to reduce the chip size. Consequently, cost reduction is also possible.

However, in the infrared signal processing circuit, the counter allows setting of a large time constant. Therefore, a rapid change in the gain is prevented, and a stable reception sensitivity is ensured even an infrared signal is input. A large time constant of the counter can be set by, for example, enlarging the time constant of the first amplifying circuit control signal to be input to the first up-down counter.

In addition to the above configuration, the infrared signal processing circuit of the present embodiment may be adapted so that the output signals from the second comparing circuit are input to a reset terminal of the first counter.

In the configuration, the output signal from the second comparing circuit is input to the reset terminal of the first counter. Therefore, the operation of the first counter is stopped, while the output signal from the second comparing circuit is output. Accordingly, the control for increasing the gain of the amplifying circuit and the control of increasing the gain and the Q-value of the bandpass filter circuit are not performed, and only the control for reducing the gain of the amplifying circuit is performed. As the result, the variation of the gain can be made small, and a stable reception sensitivity at the time of inputting an infrared signal is achieved. Further, since only the control for reducing the gain of the amplifying circuit is performed, malfunctions attributed to the disturbance light noise can be restrained.

Further, the infrared signal processing circuit of the present embodiment may be adapted so that the first up-down counter includes a first initial value setting section for setting an initial value of the gain of the amplifying circuit; and the second up-down counter includes a second initial value setting section for setting an initial value of the gain and Q-value of the bandpass filter circuit.

In the configuration, the first up-down counter has the first initial value setting function for setting the initial value of the gain of the amplifying circuit. Further, the second up-down counter has a second initial value setting function for setting respective initial values of the gain and the Q-value of the bandpass filter circuit. With this configuration, it is possible to set the initial values to suitable values for a use environment. Hence, an infrared signal processing circuit which is suitably adaptable for various use environments is realized.

The infrared signal processing circuit of the present embodiment may be adapted so that each of the counters and up-down counters has a scan path, and during a predetermined occasion, the counters and up-down counters operate in response to a single clock.

In the configuration, each of the plural counters and plural up-down counters are provided with a scan path. Therefore, the counters and up-down counters are able to perform a shift-register operation. Then, in wafer test performed at a predetermined occasion, the counters and the up-down counters are operated by using the same clock CLK. This allows easier designing of the test, and improves a failure detection rate.

Further, the infrared signal processing circuit of the present embodiment may be adapted so that the comparing circuit is a hysteresis comparator.

In the above configuration, the comparing circuit is a hysteresis comparator. Therefore, even when the output signal from the bandpass filter circuit is nearby the threshold voltages, it is possible to increase the pulse width of the output signal from the comparing circuit. Thus, the operation in the logic circuit is triggered without fail.

Further, the infrared signal processing circuit of the present embodiment may be adapted so that an oscillation frequency of the oscillation circuit is identical to a center frequency of the bandpass filter circuit. Further, the infrared signal processing circuit of the present embodiment may be adapted so that an oscillation frequency of the oscillation circuit is smaller than a center frequency of the bandpass filter circuit.

Since the plural comparing circuits perform comparison of the output signal of the bandpass filter circuit, the frequency of the output signal is the center frequency of the bandpass filter circuit. Accordingly, by setting the oscillation frequency of the oscillation circuit to the same frequency as the center frequency of the bandpass filter circuit, it is possible to reduce a time difference between the bandpass filter circuit and the comparing circuits. As a result, malfunctions of the logic circuit are restrained. Further, by setting the oscillation frequency of the oscillation circuit to a frequency smaller than the center frequency of the bandpass filter circuit, it is possible to increase the time constant of each counter which performs counting operation in response to the output signal from the oscillation circuit (clock signal), while avoiding increasing the number of bits in the counter.

Further, in addition to the above configuration, the infrared signal processing circuit of the present embodiment may further include: a fourth comparing circuit which compares (i) the output signal from the bandpass filter circuit with (ii) a forth threshold voltage whose level is a second carrier detection level, and whose level is higher than the second threshold voltage; and a selector circuit for selecting as a carrier the output signal from the second comparing circuit or an output signal from the fourth comparing circuit.

In the configuration, the carrier detection level is suitably modified. For example, when an output signal is output from the third comparing circuit: i.e., when it is judged that a problem such as an increase in the pulse width of the output signal from the second comparing circuit may occur, the selector circuit selects as the carrier the output signal from the fourth comparing circuit which signal obtained as a result of comparison with the threshold voltage whose level is higher than the second threshold voltage. Thus, it is possible to output a suitable carrier for the received remote control transmission signal, and a problem of not being able to receive signals due to an increase in the pulse width of an output signal from the second comparing circuit will not occur.

Further, as mentioned above, modification of the carrier detection level allows the carrier detection circuit to handle a case where fluorescent light noise abruptly enters at the time of inputting infrared signals. Thus, it is possible to restrain malfunction caused by sudden-generated fluorescent light noise.

Further, in addition to the above configuration, the infrared signal processing circuit of the present embodiment may include: a fourth comparing circuit which compares (i) the output signal from the bandpass filter with (ii) a forth threshold voltage whose level is a second signal detection level, and whose level is higher than the second threshold voltage; and a selector circuit for selecting as a carrier the output signal from the second comparing circuit or an output signal from the fourth comparing circuit.

With the configuration, the signal detection level is suitably modified. For example, when an output signal of the third comparing circuit is output (i.e., when it is judged that a problem of an increase in the pulse width of an output signal of the second comparing circuit may occur), an output signal of the fourth comparing circuit resulted from a comparison with a threshold voltage larger than the second threshold voltage is selected as a carrier. Therefore, it is possible to output a carrier which is suitable in relation to a remote control transmission signal received, and a problem of not being able to receive signals due to an increase in the pulse width of the output signal of the second comparing circuit will not occur. It is further possible to further reduce malfunctions attributed to inverter fluorescent light noise.

Further, by changing the signal detection level as described above, it is possible to handle a case where inverter fluorescent light noise suddenly enters while an infrared signal is input. Therefore, it is possible to reduce malfunctions attributed to a sudden inverter fluorescent light noise.

Further, the infrared signal processing circuit is provided with the bandpass filter circuit and the band-elimination filter circuit. Therefore, it is possible to realize an infrared signal processing circuit having an improved power-source noise canceling characteristic.

Further, the infrared signal processing circuit is provided with the band-elimination filter circuit. Therefore, it is possible to further reduce disturbance light noise.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A bandpass filter circuit, comprising:
a first transconductance amplifier circuit for converting a differential input voltage into a differential output current; a second transconductance amplifier circuit for converting a differential input voltage into a differential output current; a third transconductance amplifier circuit for converting a differential input voltage into a differential output current;
a first common-mode feedback circuit for outputting a first control signal to the first transconductance amplifier circuit so that a D.C. voltage level of a differential output from the first transconductance amplifier circuit is at a predetermined level;
a second common-mode feedback circuit for outputting a second control signal to the second transconductance amplifier circuit so that a D.C. voltage level of a differential output from the second transconductance amplifier circuit is at a predetermined level;
a first capacitor; a second capacitor; and a third capacitor, wherein:
a noninverting input terminal is connected, via the first capacitor, to (i) a noninverting output section of the first transconductance amplifier circuit and (ii) a noninverting input section of the second transconductance amplifier circuit;
an inverting input terminal is connected, via the second capacitor, to (i) an inverting output section of the first transconductance amplifier circuit and (ii) an inverting input section of the second transconductance amplifier circuit;
a noninverting output section of the second transconductance amplifier circuit is connected to (i) an inverting input section of the first transconductance amplifier circuit, (ii) a noninverting input section and an inverting output section of the third transconductance amplifier circuit, and (iii) one end of the third capacitor;
an inverting output section of the second transconductance amplifier circuit is connected to (i) a noninverting input section of the first transconductance amplifier circuit, (ii) an inverting input section and a noninverting output section of the third transconductance amplifier circuit, and (iii) another end of the third capacitor;

the noninverting output section of the third transconductance amplifier circuit serves as an inverting output terminal, the inverting output section of the third transconductance amplifier circuit serves as a noninverting output terminal;
the noninverting output section and the inverting output section of the first transconductance amplifier circuit serve as input terminals of the first common-mode feedback circuit; and
the noninverting output section and the inverting output section of the second transconductance amplifier circuit serve as input terminals of the second common-mode feedback circuit.

2. A bandpass filter circuit, comprising:
a first transconductance amplifier circuit for converting a differential input voltage into a differential output current; a second transconductance amplifier circuit for converting a differential input voltage into a differential output current;
a first common-mode feedback circuit for outputting a first control signal to the first transconductance amplifier circuit so that a D.C. voltage level of a differential output from the first transconductance amplifier circuit is at a predetermined level;
a second common-mode feedback circuit for outputting a second control signal to the second transconductance amplifier circuit so that a D.C. voltage level of a differential output from the second transconductance amplifier circuit is at a predetermined level;
a first capacitor; a second capacitor; and a third capacitor, wherein:
the first transconductance amplifier circuit includes a first output section and a second output section;
a noninverting input terminal is connected, via the first capacitor, to (i) a noninverting output section in the first output section of the first transconductance amplifier circuit and (ii) a noninverting input section of the second transconductance amplifier circuit;
an inverting input terminal is connected, via the second capacitor, to (i) an inverting output section in the first output section of the first transconductance amplifier circuit and (ii) an inverting input section of the second transconductance amplifier circuit;
a noninverting output section of the second transconductance amplifier circuit is connected to (i) an inverting input section of the first transconductance amplifier circuit, (ii) an inverting output section in the second output section of the first transconductance amplifier circuit, and (iii) one end of the third capacitor;
an inverting output section of the second transconductance amplifier circuit is connected to (i) a noninverting input section of the first transconductance amplifier circuit, (ii) a noninverting output section in the second output section of the first transconductance amplifier circuit, and (iii) another end of the third capacitor;
the noninverting output section of the second transconductance amplifier circuit serves as a noninverting output terminal, and the inverting output section of the second transconductance amplifier circuit serves as an inverting output terminal;
the noninverting output section and the inverting output section in the first output section of the first transconductance amplifier circuit serve as input terminals of the first common-mode feedback circuit; and the noninverting output section and the inverting output section of the second transconductance amplifier circuit serve as input terminals of the second common-mode feedback circuit.

3. The bandpass filter circuit as set forth in claim 1, further comprising:
an adjustment section for adjusting a transconductance of at least one of the transconductance amplifier circuits.

4. The bandpass filter circuit as set forth in claim 2, further comprising:
an adjustment section for adjusting a transconductance of at least one of the transconductance amplifier circuits.

5. The bandpass filter circuit as set forth in claim 3, wherein:
each of the transconductance amplifier circuits includes (i) a first transistor section in which transistors are arranged in parallel to one another, and (ii) a second transistor section via which currents of all the transistors, but a first transistor, in the first transistor section flow to a ground terminal;
a current of the first transistor in the first transistor section is an output current of the transconductance amplifier circuit, and the respective channel widths and channel lengths of all the transistors in the first transistor section are different from one another; and
the adjustment section switches on and off of each transistor in the second transistor section.

6. A band-elimination filter circuit, comprising:
a first transconductance amplifier circuit for converting a differential input voltage into a differential output current; a second transconductance amplifier circuit for converting a differential input voltage into a differential output current; a third transconductance amplifier circuit for converting a differential input voltage into a differential output current; a fourth transconductance amplifier circuit for converting a differential input voltage into a differential output current;
a first common-mode feedback circuit for outputting a first control signal to the first transconductance amplifier circuit so that a D.C. voltage level of a differential output from the first transconductance amplifier circuit is at a predetermined level;
a second common-mode feedback circuit for outputting a second control signal to the second transconductance amplifier circuit so that a D.C. voltage level of a differential output from the second transconductance amplifier circuit is at a predetermined level;
a first capacitor; a second capacitor; and a third capacitor, wherein:
a noninverting input terminal is connected to (i) a noninverting input section of the first transconductance amplifier circuit and (ii) one end of the second capacitor;
an inverting input terminal is connected to (i) an inverting input section of the first transconductance amplifier circuit and (ii) one end of the third capacitor;
a noninverting output section of the first transconductance amplifier circuit is connected to (i) a noninverting input section of the second transconductance amplifier circuit, (ii) an inverting output section of the fourth transconductance amplifier circuit, and (iii) one end of the first capacitor;
an inverting output section of the first transconductance amplifier circuit is connected to (i) an inverting input section of the second transconductance amplifier circuit, (ii) a noninverting output section of the fourth transconductance amplifier circuit, and (iii) another end of the first capacitor;

a noninverting output section of the second transconductance amplifier circuit is connected to (i) a noninverting input section and an inverting output section of the third transconductance amplifier circuit, (ii) an inverting input section of the fourth transconductance amplifier circuit, and (iii) another end of the second capacitor;
an inverting output section of the second transconductance amplifier circuit is connected to (i) an inverting input section and a noninverting output section of the third transconductance amplifier circuit, (ii) a noninverting input section of the fourth transconductance amplifier circuit, and (iii) another end of the third capacitor;
the noninverting output section of the third transconductance amplifier circuit serves as an inverting output terminal, and the inverting output section of the third transconductance amplifier circuit serves as a noninverting output terminal;
the noninverting output section and the inverting output section of the first transconductance amplifier circuit serve as input terminals of the first common-mode feedback circuit; and
the noninverting output section and the inverting output section of the second transconductance amplifier circuit serve as input terminals of the second common-mode feedback circuit.

7. A band-elimination filter circuit, comprising:
a first transconductance amplifier circuit for converting a differential input voltage into a differential output current; a second transconductance amplifier circuit for converting a differential input voltage into a differential output current; a third transconductance amplifier circuit for converting a differential input voltage into a differential output current;
a first common-mode feedback circuit for outputting a first control signal to the first transconductance amplifier circuit so that a D.C. voltage level of a differential output from the first transconductance amplifier circuit is at a predetermined level;
a second common-mode feedback circuit for outputting a second control signal to the second transconductance amplifier circuit so that a D.C. voltage level of a differential output from the second transconductance amplifier circuit is at a predetermined level;
a first capacitor; a second capacitor; and a third capacitor, wherein:
the third transconductance amplifier circuit includes a first output section and a second output section;
a noninverting input terminal is connected to (i) a noninverting input section of the first transconductance amplifier circuit and (ii) one end of the second capacitor;
an inverting input terminal is connected to (i) an inverting input section of the first transconductance amplifier circuit and (ii) one end of the third capacitor;
a noninverting output section of the first transconductance amplifier circuit is connected to (i) a noninverting input section of the second transconductance amplifier circuit, (ii) an inverting output section in the second output section of the third transconductance amplifier circuit, and (iii) one end of the first capacitor;
an inverting output section of the first transconductance amplifier circuit is connected to (i) an inverting input section of the second transconductance amplifier circuit, (ii) a noninverting output section in the second output section of the third transconductance amplifier circuit, and (iii) another end of the first capacitor;
a noninverting output section of the second transconductance amplifier circuit is connected to (i) a noninverting input section of the third transconductance amplifier circuit, (ii) an inverting output section in the first output section of the third transconductance amplifier circuit and (iii) another end of the second capacitor;

an inverting output section of the second transconductance amplifier circuit is connected to (i) an inverting input section of the third transconductance amplifier circuit, (iii) a noninverting output section in the first output section of the third transconductance amplifier circuit, and (iii) another end of the third capacitor;

the noninverting output section in the first output section of the third transconductance amplifier circuit serves as a noninverting output terminal, and the inverting output section in the first output section of the third transconductance amplifier circuit serves as an inverting output terminal;

the noninverting output section and the inverting output section of the first transconductance amplifier circuit serve as input terminals of the first common-mode feedback circuit; and the noninverting output section and the inverting output section of the second transconductance amplifier circuit serve as input terminals of the second common-mode feedback circuit.

8. The band-elimination filter circuit as set forth in claim 6, further comprising:
an adjustment section for adjusting a transconductance of at least one of the transconductance amplifier circuits.

9. The band-elimination filter circuit as set forth in claim 7, further comprising:
an adjustment section for adjusting a transconductance of at least one of the transconductance amplifier circuits.

10. The band-elimination filter circuit as set forth in claim 8, wherein:
the transconductance amplifier circuit includes (i) a first transistor section having plural transistors, in which current of a first transistor also flows in other transistors of the first transistor section, and (ii) a second transistor section via which currents of all the transistors, but a first transistor, in the first transistor section flow to a ground terminal;
a current of the first transistor in the first transistor section is an output current of the transconductance amplifier circuit, and the respective channel widths and channel lengths of all the transistors in the first transistor section are different from one another; and
the adjustment section switches on and off of each transistor in the second transistor section.

11. An infrared signal processing circuit, comprising:
a photo-acceptance element for converting an infrared signal received into an electric signal;
an amplifying circuit for amplifying the electric signal;
a bandpass filter for extracting a carrier frequency component from the electric signal amplified; and
a carrier detection circuit including (I) a first comparing circuit which compares an output signal of the bandpass filter with a first threshold voltage whose level is a noise detection level, (II) a second comparing circuit which compares the output signal of the bandpass filter with a second threshold voltage whose level is higher than the first threshold voltage and is a first carrier detection level, (III) a third comparing circuit which compares the output signal of the bandpass filter with a third threshold voltage whose level is higher than the second threshold voltage and is a peak detection level for judging the output signal of the band pass filter and a level of the output signal, (IV) a logic circuit which (i) controls a gain of the amplifying circuit based on an output signal of the first comparing circuit so that the output signal of the first comparing circuit is not output, and (ii) controls the gain and Q-value of the bandpass filter circuit based on an output signal of the third comparing circuit so that the output signal of the third comparing circuit is not output, the carrier detection circuit outputting as a carrier an output signal of the second comparing circuit,
wherein:
the bandpass filter circuit includes:
a first transconductance amplifier circuit for converting a differential input voltage into a differential output current; a second transconductance amplifier circuit for converting a differential input voltage into a differential output current; a third transconductance amplifier circuit for converting a differential input voltage into a differential output current;
a first common-mode feedback circuit for outputting a first control signal to the first transconductance amplifier circuit so that a D.C. voltage level of a differential output from the first transconductance amplifier circuit is at a predetermined level;
a second common-mode feedback circuit for outputting a second control signal to the second transconductance amplifier circuit so that a D.C. voltage level of a differential output from the second transconductance amplifier circuit is at a predetermined level;
a first capacitor; a second capacitor; a third capacitor; and
an adjustment section for adjusting a transconductance of at least one of the transconductance amplifier circuits,
a noninverting input terminal being connected, via the first capacitor, to (i) a noninverting output section of the first transconductance amplifier circuit and (ii) a noninverting input section of the second transconductance amplifier circuit,
an inverting input terminal being connected, via the second capacitor, to (i) an inverting output section of the first transconductance amplifier circuit and (ii) an inverting input section of the second transconductance amplifier circuit,
a noninverting output section of the second transconductance amplifier circuit being connected to (i) an inverting input section of the first transconductance amplifier circuit, (ii) a noninverting input section and an inverting output section of the third transconductance amplifier circuit, and (iii) one end of the third capacitor,
an inverting output section of the second transconductance amplifier circuit being connected to (i) a noninverting input section of the first transconductance amplifier circuit, (ii) an inverting input section and a noninverting output section of the third transconductance amplifier circuit, and (iii) another end of the third capacitor,
the noninverting output section of the third transconductance amplifier circuit serving as an inverting output terminal, the inverting output section of the third transconductance amplifier circuit serves as a noninverting output terminal,
the noninverting output section and the inverting output section of the first transconductance amplifier circuit serving as input terminals of the first common-mode feedback circuit, and
the noninverting output section and the inverting output section of the second transconductance amplifier circuit serving as input terminals of the second common-mode feedback circuit.

12. The infrared signal processing circuit as set forth in claim 11, wherein:

the logic circuit includes plural counters each of which (i) counts pulses of output signals from one of the comparing circuits, and (ii) outputs, when a predetermined number of the pulses are counted, a pulse for controlling the amplifying circuit or the bandpass filter circuit.

13. The infrared signal processing circuit as set forth in claim 12, wherein:
the carrier detection circuit includes an oscillation circuit for oscillating clock signals; and
the logic circuit includes:
a first counters which counts the clock signals from the oscillation circuit and outputs (i) first amplifying circuit control signals for increasing the gain of the amplifying circuit, and (ii) bandpass filter control signals for increasing the gain and Q-value of the bandpass filter circuit, the second counter being one of the plurality of counters;
a second counter which counts the output signals from the first comparing circuit and outputs second amplifying circuit control signals for decreasing the gain of the amplifying circuit;
a first up-down counter which (i) counts the first amplifying circuit control signals and outputs a first control signal for increasing the gain of the amplifying circuit, and (ii) counts the second amplifying circuit control signals and outputs a second control signal for decreasing the gain of the amplifying circuit; and
a second up-down counter which (i) counts the bandpass filter control signals and outputs a third control signal for increasing the gain and Q-value of the bandpass filter circuit, and (ii) counts output signals from the third comparing circuit and outputs a fourth control signal for decreasing the gain and Q-value of the band pass filter, the second up-down counter being one of the plurality of counters.

14. The infrared signal processing circuit as set forth in claim 13, wherein:
the output signals from the second comparing circuit are input to a reset terminal of the first counter.

15. The infrared signal processing circuit as set forth in claim 13, wherein:
the first up-down counter includes a first initial value setting section for setting an initial value of the gain of the amplifying circuit; and
the second up-down counter includes a second initial value setting section for setting an initial value of the gain and Q-value of the bandpass filter circuit.

16. The infrared signal processing circuit as set forth in claim 13, wherein:
each of the counters and up-down counters has a scan path, and
during a wafer test, the counters and up-down counters operate in response to an identical clock.

17. The infrared signal processing circuit as set forth in claim 11, wherein:
the comparing circuit is a hysteresis comparator.

18. The infrared signal processing circuit as set forth in claim 13, wherein:
an oscillation frequency of the oscillation circuit is identical to a center frequency of the bandpass filter circuit.

19. The infrared signal processing circuit as set forth in claim 13, wherein:
an oscillation frequency of the oscillation circuit is smaller than a center frequency of the bandpass filter circuit.

20. The infrared signal processing circuit as set forth in claim 11, comprising:

a fourth comparing circuit which compares (i) the output signal from the bandpass filter with (ii) a forth threshold voltage whose level is a second signal detection level, and whose level is higher than the second threshold voltage; and
a selector circuit for selecting as a carrier the output signal from the second comparing circuit or an output signal from the fourth comparing circuit.

21. The infrared signal processing circuit as set forth in claim 11, further comprising:
a band-elimination filter circuit for removing disturbance light noise from the carrier frequency component extracted,
wherein:
(A) the first comparing circuit compares an output signal of the band-elimination filter circuit with the first threshold voltage;
(B) the second comparing circuit compares the output signal of the band-elimination filter circuit with the second threshold voltage;
(C) the third comparing circuit compares the output signal of the band-elimination filter circuit with the third threshold voltage;
(D) based on an output signal of the first comparing circuit, the logic circuit controls the gain of the amplifying circuit and a Q-value of the band-elimination filter circuit so that the output signal of the first comparing circuit is not output; and
(E) the band-elimination filter circuit includes:
a first transconductance amplifier circuit for converting a differential input voltage into a differential output current; a second transconductance amplifier circuit for converting a differential input voltage into a differential output current; a third transconductance amplifier circuit for converting a differential input voltage into a differential output current; a fourth transconductance amplifier circuit for converting a differential input voltage into a differential output current;
a first common-mode feedback circuit for outputting a first control signal to the first transconductance amplifier circuit so that a D.C. voltage level of a differential output from the first transconductance amplifier circuit is at a predetermined level;
a second common-mode feedback circuit for outputting a second control signal to the second transconductance amplifier circuit so that a D.C. voltage level of a differential output from the second transconductance amplifier circuit is at a predetermined level;
a first capacitor; a second capacitor; a third capacitor; and
an adjustment section for adjusting a transconductance of at least one of the transconductance amplifier circuits,
a noninverting input terminal being connected to (i) a noninverting input section of the first transconductance amplifier circuit and (ii) one end of the second capacitor,
an inverting input terminal being connected to (i) an inverting input section of the first transconductance amplifier circuit and (ii) one end of the third capacitor,
a noninverting output section of the first transconductance amplifier circuit being connected to (i) a noninverting input section of the second transconductance amplifier circuit, (ii) an inverting output section of the fourth transconductance amplifier circuit, and (iii) one end of the first capacitor,
an inverting output section of the first transconductance amplifier circuit being connected to (i) an inverting input section of the second transconductance amplifier circuit, (ii) a noninverting output section of the fourth transconductance amplifier circuit, and (iii) another end of the first capacitor, a noninverting output section of the second transconductance amplifier circuit being connected to (i) a noninverting input section and an inverting output section of the third transconductance amplifier circuit, (ii) an inverting input section of the fourth transconductance amplifier circuit, and (iii) another end of the second capacitor, an inverting output section of the second transconductance amplifier circuit being connected to (i) an inverting input section and a noninverting output section of the third transconductance amplifier circuit, (ii) a noninverting input section of the fourth transconductance amplifier circuit, and (iii) another end of the third capacitor, the noninverting output section of the third transconductance amplifier circuit serving as an inverting output terminal, and the inverting output section of the third transconductance amplifier circuit serves as a noninverting output terminal, the noninverting output section and the inverting output section of the first transconductance amplifier circuit serving as input terminals of the first common-mode feedback circuit, and the noninverting output section and the inverting output section of the second transconductance amplifier circuit serving as input terminals of the second common-mode feedback circuit.

22. An infrared signal processing circuit as set forth in claim 21, further comprising:

a fourth comparing circuit which compares (i) the output signal from the bandpass filter with (ii) a forth threshold voltage whose level is a second signal detection level, and whose level is higher than the second threshold voltage; and a selector circuit for selecting as a carrier the output signal from the second comparing circuit or an output signal from the fourth comparing circuit.

* * * * *